(12) United States Patent
Ogiwara et al.

(10) Patent No.: US 8,134,855 B2
(45) Date of Patent: Mar. 13, 2012

(54) FERROELECTRIC MEMORY AND METHOD FOR TESTING THE SAME

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 327 days.

(21) Appl. No.: 12/404,157

(22) Filed: Mar. 13, 2009

(65) Prior Publication Data

US 2009/0231903 A1    Sep. 17, 2009

(30) Foreign Application Priority Data

Mar. 14, 2008   (JP) .................................. P2008-65693

(51) Int. Cl.
*G11C 11/22* (2006.01)

(52) U.S. Cl. .......... 365/145; 365/65; 365/191; 365/201; 365/203

(58) Field of Classification Search .................. 365/145, 365/117, 149, 201, 65, 191, 203
See application file for complete search history.

(56) References Cited

U.S. PATENT DOCUMENTS

| | | | | |
|---|---|---|---|---|
| 5,297,077 | A * | 3/1994 | Imai et al. ..................... | 365/145 |
| 5,661,730 | A | 8/1997 | Mitra et al. | |
| 5,822,237 | A | 10/1998 | Wilson et al. | |
| 5,969,980 | A * | 10/1999 | Allen et al. ................... | 365/145 |
| 5,991,189 | A | 11/1999 | Miwa | |
| 6,646,905 | B2 * | 11/2003 | Tada ............................. | 365/145 |
| 2003/0173607 | A1 * | 9/2003 | Takeshima ................... | 257/296 |

FOREIGN PATENT DOCUMENTS

JP   2002-313100 A   10/2002
JP   2007-141339 A    6/2007

OTHER PUBLICATIONS

Notice of Reasons for Rejection mailed by Japan Patent Office on Jul. 27, 2010 in the corresponding Japanese patent application No. 2008-065693.

* cited by examiner

*Primary Examiner* — Pho M Luu
*Assistant Examiner* — Thao Bui
(74) *Attorney, Agent, or Firm* — Knobbe Martens Olson & Bear, LLP

(57) ABSTRACT

A driver circuit and a precharge circuit apply, in a test mode, a fixed potential to a bit-line, while applying a second plate-line voltage to a plate-line. Then, the bit-line is switched from a first bit-line precharge potential to a floating state, and the plate-line voltage is raised from the second plate-line voltage to a plate-line voltage.

8 Claims, 50 Drawing Sheets

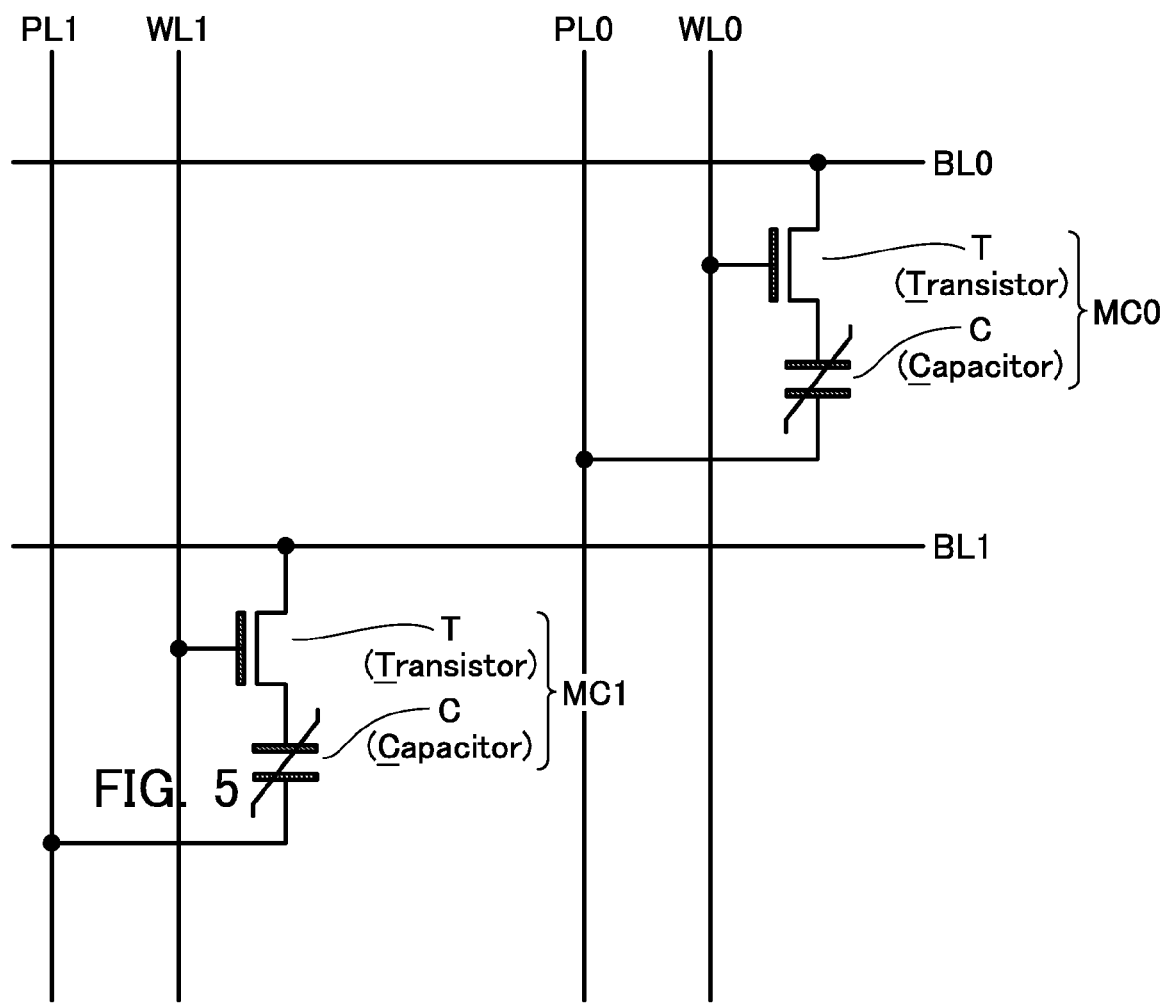

FERROELECTRIC MEMORY AND METHOD FOR TESTING THE SAME

CROSS REFERENCE TO RELATED APPLICATIONS

This application is based on and claims the benefit of priority from prior Japanese Patent Application No. 2008-65693, filed on Mar. 14, 2008, the entire contents of which are incorporated herein by reference.

BACKGROUND OF THE INVENTION

1. Field of the Invention

The present invention relates to a ferroelectric memory and a method for testing the same, such as a method for testing the hysteresis characteristics of a ferroelectric capacitor in a memory cell of the ferroelectric memory.

2. Description of the Related Art

A ferroelectric memory includes a memory cell array including memory cells arranged therein, each memory cell including a ferroelectric capacitor. The ferroelectric memory uses the hysteresis characteristics of the ferroelectric capacitor to store data in a non-volatile manner.

Known conventional techniques for testing the hysteresis characteristics of the memory cell in the ferroelectric memory are disclosed in, for example, the following documents.

U.S. Pat. No. 5,661,730
U.S. Pat. No. 5,991,189
U.S. Pat. No. 5,822,237

The procedures for test methods by the conventional techniques include, for example, the following steps (1) to (7).

(1) A function test is performed to compute the yield.
(2) Initial pattern data is written.
(3) A bake process (memory heating process) is performed.
(4) The initial pattern data is read to compute the SS yield (Same State Yield). Specifically, the written initial pattern data is directly read to determine the difference from the written original initial pattern.
(5) A reverse data pattern is written.
(6) The reverse data pattern is read to compute the OS yield (Opposite State Yield). Specifically, the difference is determined between the written reverse data pattern and the read data pattern.
(7) The next pattern data is written.

The procedures (3) to (7) are repeated several times.

In the test, the bake process (3) causes so-called imprint (a hysteresis characteristic curve shift in along the horizontal direction, for example). Steps (4) to (6) determine whether the cell signal is degraded during the imprint.

The bake process (3) is unfavorable because it may allow an imprinted memory to be shipped to customers as a product.

In addition, the bake process takes a long time and thus raises the test cost. Therefore, there is a need for a method for testing the characteristics of the memory cell such as the data holding characteristics in a short period of time without the bake process.

SUMMARY OF THE INVENTION

An aspect of this invention is a ferroelectric memory comprising:

a memory cell array comprising a plurality of memory cells arranged therein, each memory cell comprising a ferroelectric capacitor and a transistor;

a plate-line for supplying a plate-line voltage to the ferroelectric capacitor for writing or reading data;

a bit-line pair for reading a signal charge from the memory cell; a sense amplifier circuit for sensing and comparing/amplifying a potential difference between the bit-line pair;

a bit-line driver circuit and a plate-line driver circuit for driving the bit-line pair and the plate-line, respectively; and a bit-line precharge circuit and a plate-line precharge circuit for switching between a state in which a bit-line of the bit-line pair is precharged to a first bit-line precharge potential or the plate-line is precharged to a first plate-line precharge potential and another state in which the bit-line is floated and isolated from the first bit-line precharge potential or the plate-line is floated and isolated from the first plate-line precharge potential.

The bit-line driver circuit, the plate-line driver circuit, the bit-line precharge circuit, and the plate-line precharge circuit is configured to, in normal reading and writing operation, apply the first plate-line voltage to the plate-line. In a test mode, the bit-line driver circuit, the plate-line driver circuit, the bit-line precharge circuit, and the plate-line precharge circuit is configured to apply the first bit-line precharge potential to the bit-line of the bit-line pair, while applying a second plate-line voltage to the plate-line, and then switch the bit-line from the first bit-line precharge potential to the floating state and thereafter increase the plate-line voltage from the second plate-line voltage to the first plate-line voltage, thereby reading data from the memory cell.

Another aspect of this invention is a ferroelectric memory comprising:

a memory cell array comprising a plurality of memory cells arranged therein, each memory cell comprising a ferroelectric capacitor and a transistor;

a plate-line for supplying a plate-line voltage to the ferroelectric capacitor for writing or reading data;

a bit-line pair for reading a signal charge from the memory cell;

a sense amplifier circuit for sensing and comparing/amplifying a potential difference between the bit-line pair;

a bit-line driver circuit and a plate-line driver circuit for driving the bit-line pair and the plate-line, respectively; and a bit-line precharge circuit and a plate-line precharge circuit for switching between a state in which a bit-line of the bit-line pair is precharged to a first bit-line precharge potential or the plate-line is precharged to a first plate-line precharge potential and another state in which the bit-line is floated and isolated from the first bit-line precharge potential or the plate-line is floated and isolated from the first plate-line precharge potential.

The bit-line driver circuit, the plate-line driver circuit, the bit-line precharge circuit, and the plate-line precharge circuit is configured to, in normal reading and writing operation, apply a first array voltage to the bit-line through the sense amplifier circuit and the first plate-line voltage to the plate-line. In a test mode, they are configured to apply the first plate-line precharge voltage to the plate-line, while applying a second array voltage to the bit-line, and then switch the bit-line to the floating state and thereafter increase the plate-line voltage to the first plate-line voltage, thereby reading cell data from the memory cell.

An aspect of this invention is a method for testing a ferroelectric memory, the ferroelectric memory comprising a plurality of memory cells, each memory cell comprising a ferroelectric capacitor and a transistor, a first plate-line voltage being applied across the electrodes of the ferroelectric capacitor through a plate-line, thereby reading cell data from the memory cell through a bit-line and applying a first array voltage to the bit-line through a sense amplifier circuit. The method comprises:

applying the first plate-line voltage across the electrodes of the ferroelectric capacitor to write first polarization data in the memory cell;

applying a first bit-line precharge potential to the bit-line, while applying a second plate-line voltage to the plate-line;

switching the bit-line from the first bit-line precharge potential to a floating state and then increasing the plate-line voltage from the second plate-line voltage to the first plate-line voltage, thereby reading cell data from the memory cell;

applying a third plate-line voltage across the electrodes of the ferroelectric capacitor, the third plate-line voltage having reverse polarity to the first plate-line voltage, thereby writing second polarization data in the memory cell;

applying the first bit-line precharge potential to the bit-line, while applying a second plate-line voltage to the plate-line; and switching the bit-line from the first bit-line precharge potential to a floating state and then increasing the plate-line voltage from the second plate-line voltage to the first plate-line voltage, thereby reading cell data from the memory cell.

Another aspect of this invention is a method for testing a ferroelectric memory, the ferroelectric memory comprising a plurality of memory cells, each memory cell comprising a ferroelectric capacitor and a transistor, a first plate-line voltage being applied across the electrodes of the ferroelectric capacitor through a plate-line, thereby reading cell data from the memory cell through a bit-line and applying a first array voltage to the bit-line through a sense amplifier circuit. The method comprises:

applying the first plate-line voltage across the electrodes of the ferroelectric capacitor, thereby writing first polarization data in the memory cell;

applying the first plate-line precharge potential to the plate-line, while applying a second array voltage to the bit-line;

applying the second array voltage to the bit-line and then switching the plate-line from the first plate-line precharge potential to a floating state and then increasing the plate-line voltage to the first plate-line voltage, thereby reading cell data from the memory cell;

applying a third plate-line voltage across the electrodes of the ferroelectric capacitor, the third plate-line voltage having reverse polarity to the first plate-line voltage, thereby writing second polarization data in the memory cell;

applying the first plate-line precharge potential to the plate-line, while applying the second array voltage to the bit-line; and applying the second array voltage to the bit-line and then switching the plate-line from the first plate-line precharge potential to a floating state, and increasing the plate-line voltage to the first plate-line voltage, thereby reading cell data from the memory cell.

BRIEF DESCRIPTION OF THE DRAWINGS

FIGS. 10A and 10B show circuit diagrams of example configurations of a memory cell array of a ferroelectric memory capable of performing the test method in the first embodiment;

FIG. 73 shows a circuit diagram of a portion of the configuration of a ferroelectric memory capable of performing the test method in the sixth embodiment.

DETAILED DESCRIPTION OF THE EMBODIMENTS

Figure 1:
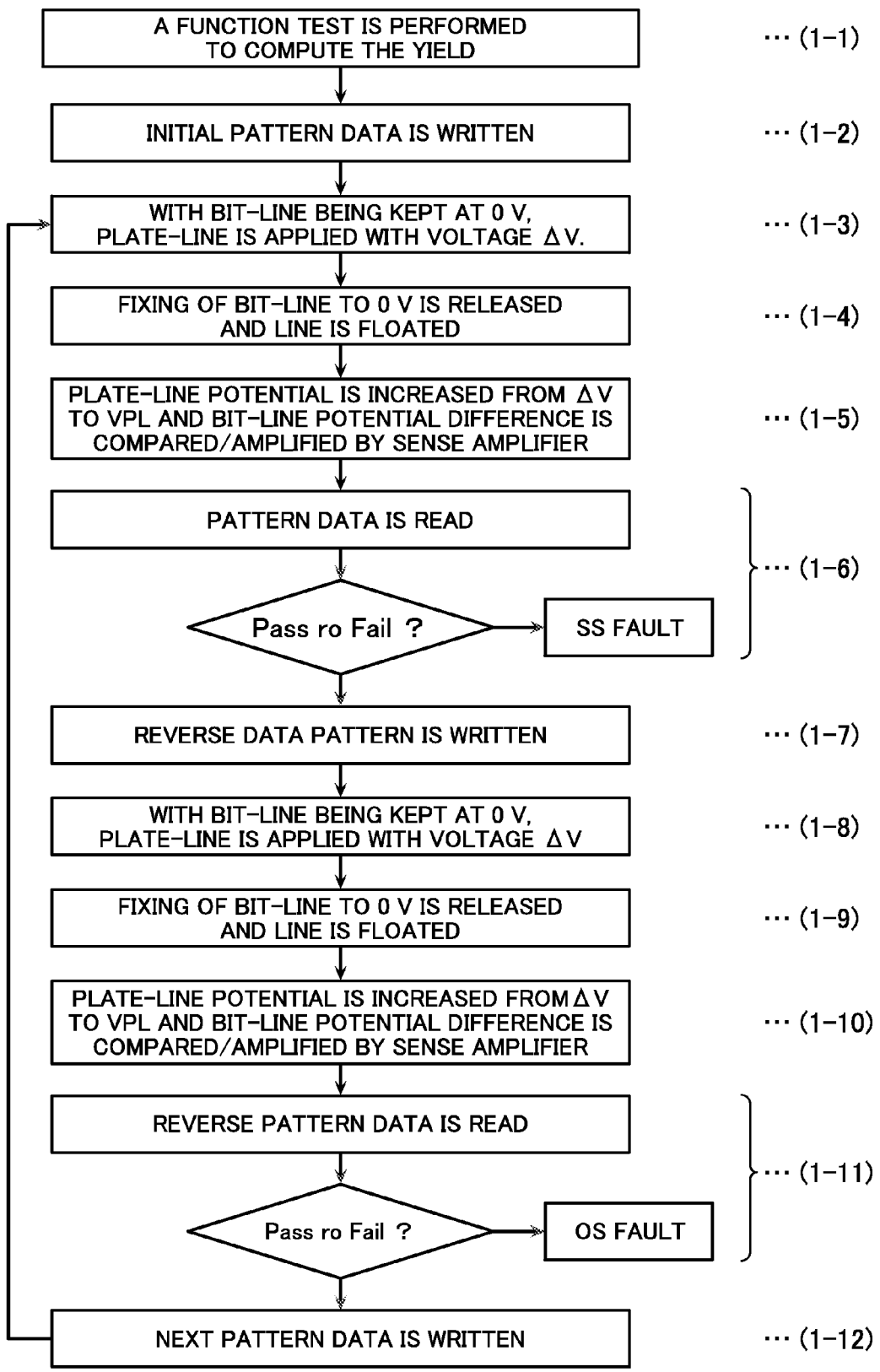
FIG. 1 shows a flowchart of the procedure for a test method according to a first embodiment of the present invention.

With reference to the appended drawings, embodiments of the present invention will be described in more detail.

First Embodiment

First, a ferroelectric memory according to a first embodiment of the present invention and a method for testing the same will be described referring to the drawings.

The test method in the first embodiment is performed according to the following procedure as shown in the flowchart in FIG. 1.

(1-1) A function test is performed to compute the yield.

(1-2) According to normal data write operation, a write voltage is applied across the electrodes of the ferroelectric capacitor to write initial pattern data.

(1-3) A certain voltage is applied across the electrodes of the ferroelectric capacitor.

Specifically, a plate-line is applied with a certain voltage $\Delta V$, while a bit-line is fixed to 0 V (ground potential VSS).

(1-4) The bit-line is released from being fixed to 0 V and is floated.

(1-5) The plate-line potential is increased from $\Delta V$ to the plate-line potential VPL used in normal operation. The potential difference between the bit-line pair is then compared/amplified by a sense amplifier.

(1-6) The initial pattern data is read to compute the SS yield (Same State Yield).

(1-7) The initial pattern data is reversed and the reverse data pattern is written.

(1-8) A certain voltage is applied across the electrodes of the ferroelectric capacitor.

Specifically, the plate-line is applied with a certain voltage $\Delta V$, while the bit-line is set to 0 V.

(1-9) The bit-line is released from being fixed to 0 V and is floated.

(1-10) The plate-line potential is increased from $\Delta V$ to VPL used in normal operation. The potential difference between the bit-line pair is then compared/amplified by the sense amplifier.

(1-11) The reverse data pattern is read to compute the OS yield (Opposite State Yield).

(1-12) The next pattern data is written.

Steps (1-3) to (1-5) may provide, in a short time, and without the bake process, the ferroelectric capacitor with polarization that is equal to that when the ferroelectric capacitor is in an imprint state. Polarization data after imprint may substantially thus be provided. This will be described in more detail referring to FIGS. 2 to 4.

Figure 2:
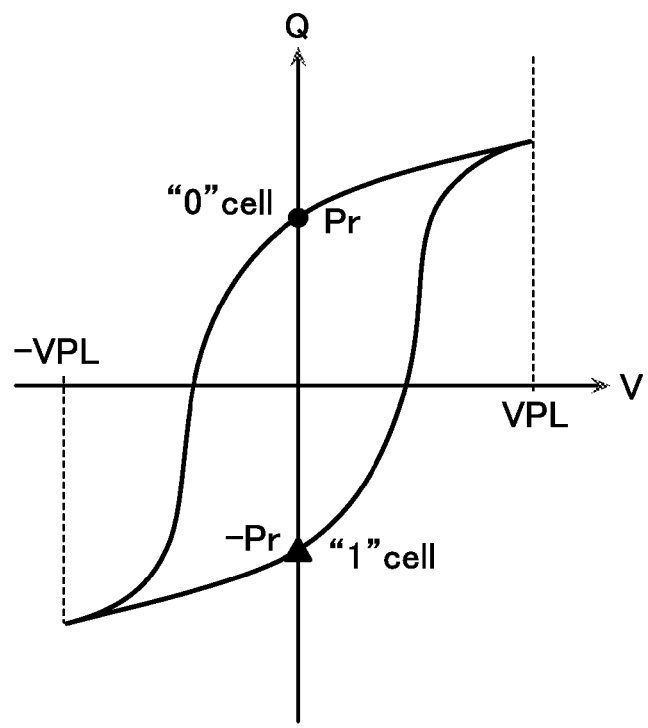
FIGS. 2-8 show hysteresis characteristic curves of a ferroelectric capacitor, which illustrate the operation of the test method in the first embodiment.

FIG. 2 shows a hysteresis characteristic curve of the ferroelectric capacitor after step (1-2), i.e., immediately after the initial pattern is written in the test procedure in FIG. 1.

The memory cell ("0", cell) with initial pattern data of "0" has polarization +Pr when the applied voltage V (the plate-line potential minus the bit-line potential) is 0 V (the closed circle in FIG. 2).

The memory cell ("1" cell) with initial pattern data of "1," has polarization −Pr when the applied voltage V (the plate-line potential minus the bit-line potential) is 0 V (the closed triangle in FIG. 2).

Figure 3:
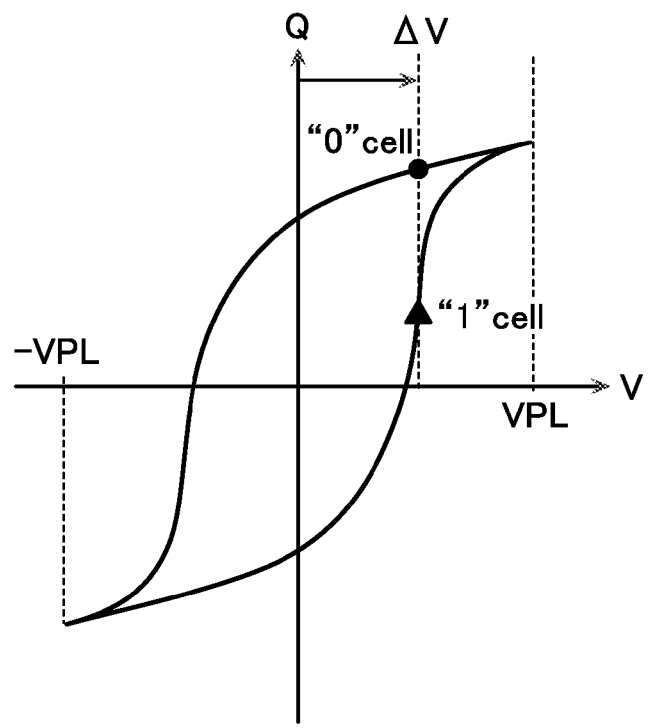

Then, with reference to FIG. 3, step (1-3) (a certain voltage is applied across the electrodes of the ferroelectric capacitor: the plate-line voltage at $\Delta V$, the bit-line voltage at 0 V) moves the polarization of the "0" cell and the "1" cell to the respective positions (the closed circle and the closed triangle) on the hysteresis characteristic curve in FIG. 3.

Specifically, as will be described in more detail, this stage reproduces generally the same polarization state as during the imprint (the hysteresis characteristic curve is moved in the negative direction of the x-axis of the graph).

Figure 4:
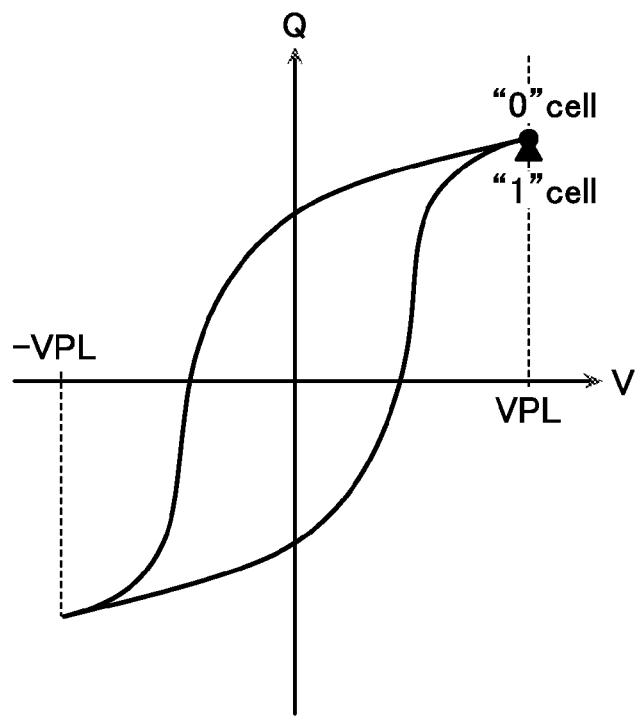

Then, after step (1-4) is performed, in step (1-5), the plate-line potential is increased from $\Delta V$ to VPL. This process moves the polarization of the "0" cell and the "1" cell to the respective positions on the hysteresis characteristic curve as shown in FIG. 4.

Figure 5:
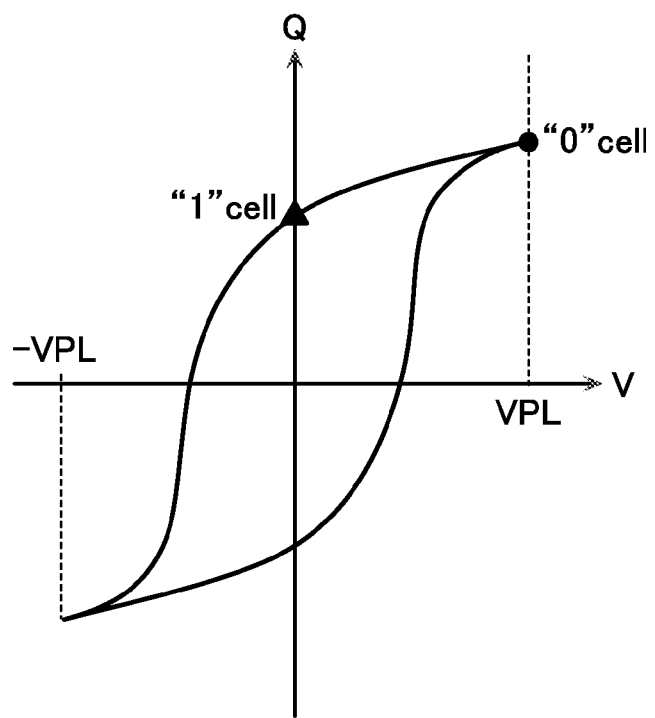

Then, in step (1-5), the potential difference between the bit-line pair is compared/amplified by the sense amplifier, thereby moving the polarization of the "0" cell and the "1" cell to the respective positions on the hysteresis characteristic curve as shown in FIG. 5.

In FIG. 3, the bit-line is floated and then the plate-line potential is raised from $\Delta V$ to VPL. This may provide generally the same movement on the hysteresis characteristic curve as during the actual imprint and thus provide a signal of generally the same potential. Specifically, without the bake process, the data-holding characteristics of the memory cell when the imprint occurs may be checked.

With reference to the hysteresis characteristic curves in FIGS. 6 to 8, the read operation of the memory cell during the actual imprint caused by heat or the like will be described below.

Figure 6:
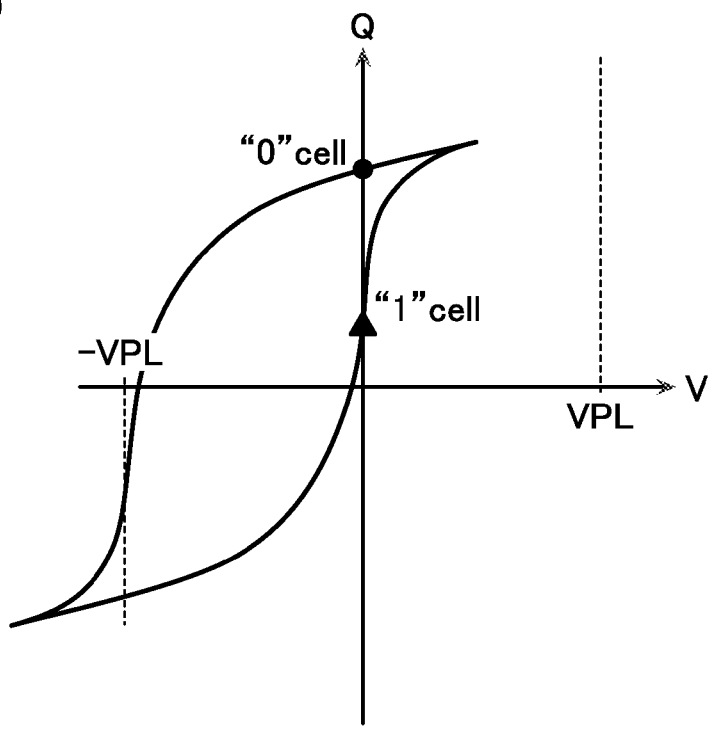

With reference to FIG. 6, the imprint shifts the entire hysteresis characteristic curve in the left or right direction from the graph center. This embodiment shows an example where the entire hysteresis characteristic curve is shifted in the left direction. FIG. 6 shows the polarization of the "1" cell and the "0" cell when the plate-line is applied with a voltage of 0 [V]. It is shown that the difference between the two polarizations is less than that before the imprint.

The bit-line is then kept at a floating potential and the plate-line potential is increased from 0 V to VPL. This moves the polarization of the "1" cell and the "0" cell to the respective positions on the hysteresis characteristic curve as shown in FIG. 7. The sense amplifier is then activated (turned into the active state) to compare/amplify the potential difference, providing the potentials as shown in FIG. 8.

Figure 7:
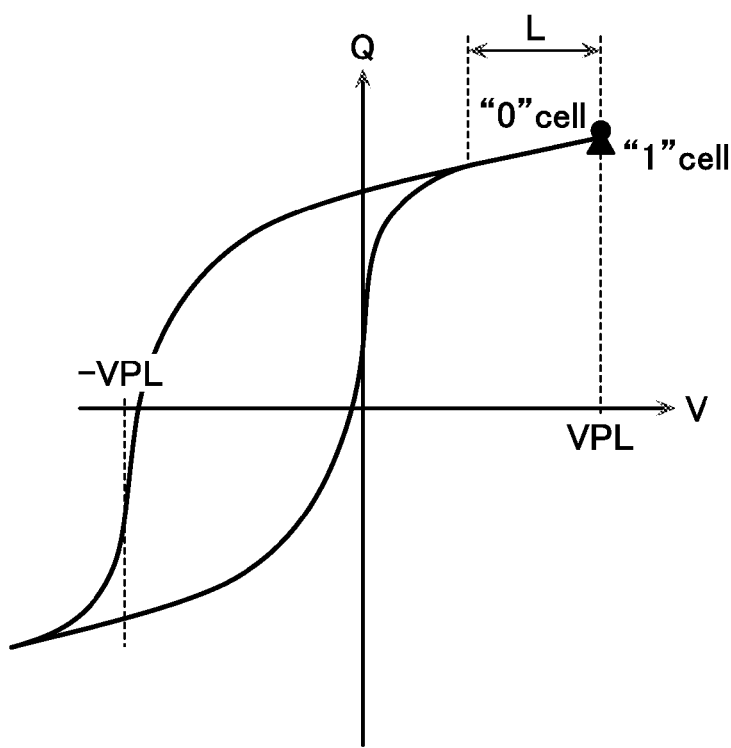
Figure 8:
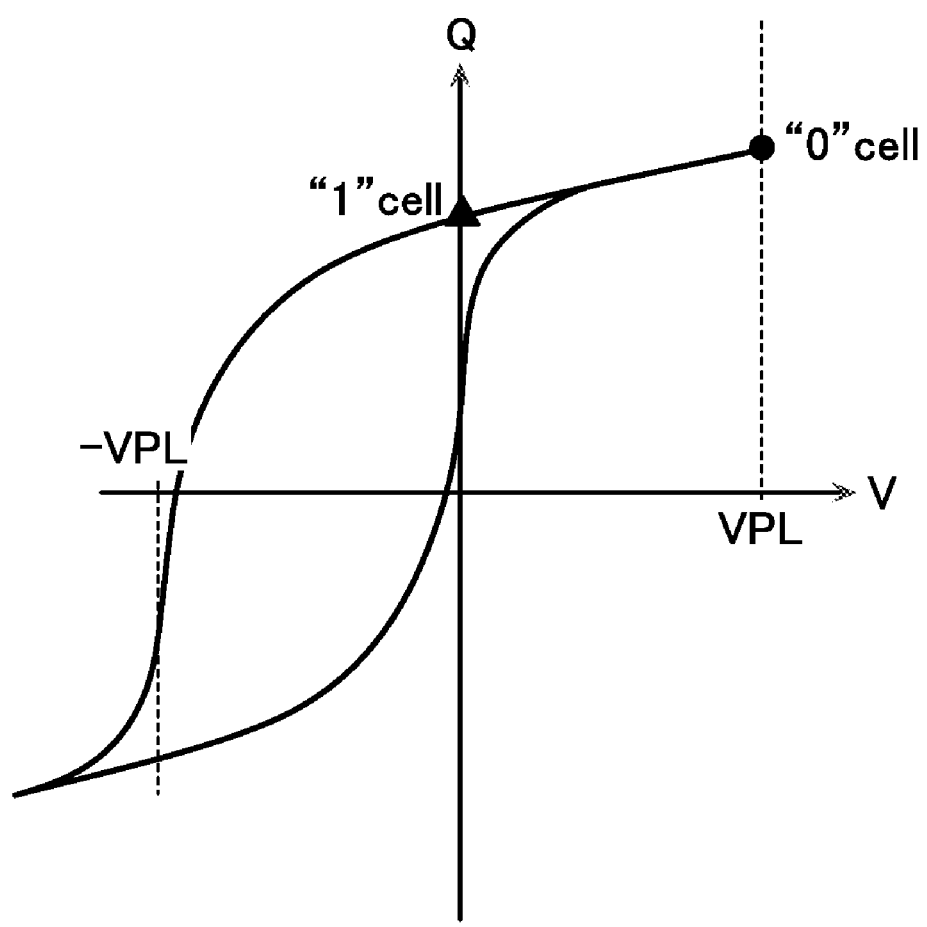

Now, comparison between the test in this embodiment (FIGS. 3 to 5) and the case the imprint actually occurred (FIGS. 6 to 8) shows that the signal readout to the bit-line is not completely the same between the movement from FIGS. 3 to 4 and the movement from FIGS. 6 to 7. This is because the ferroelectric capacitor has a paraelectric component and so, in the hysteresis characteristic curve during the actual imprint (FIGS. 6 and 7), the paraelectric component (the L portion in FIG. 7) may be read out.

Therefore, a state after the actual imprint is not perfectly reproduced in FIGS. 3-5. Specifically, the complete reproduction may be considered to require the plate-line potential to change from $\Delta V$ to $\Delta V$+VPL even in this embodiment. Now, the paths on the hysteresis characteristic curve are compared between during the test in this embodiment (FIGS. 3 to 5) and during the actual imprint (FIGS. 6 to 8).

The results show, however, that the paraelectric component shown by the symbol "L" in FIG. 7 is small so that the bit-line has almost the same signal charge. The test method in this embodiment may therefore be considered to generally reproduce the actual imprint operation.

This embodiment may thus evaluate, without generating the additional potential of ΔV+VPL only for the test mode, the effects of the imprint and depolarization in the range of the voltage VPL used in normal operation.

The effects of steps (1-8) to (1-10) to reverse pattern data (step (1-7)) are similar to those of steps (1-3) to (1-5). A detailed description of steps (1-8) to (1-10) is thus omitted here.

Figure 9:
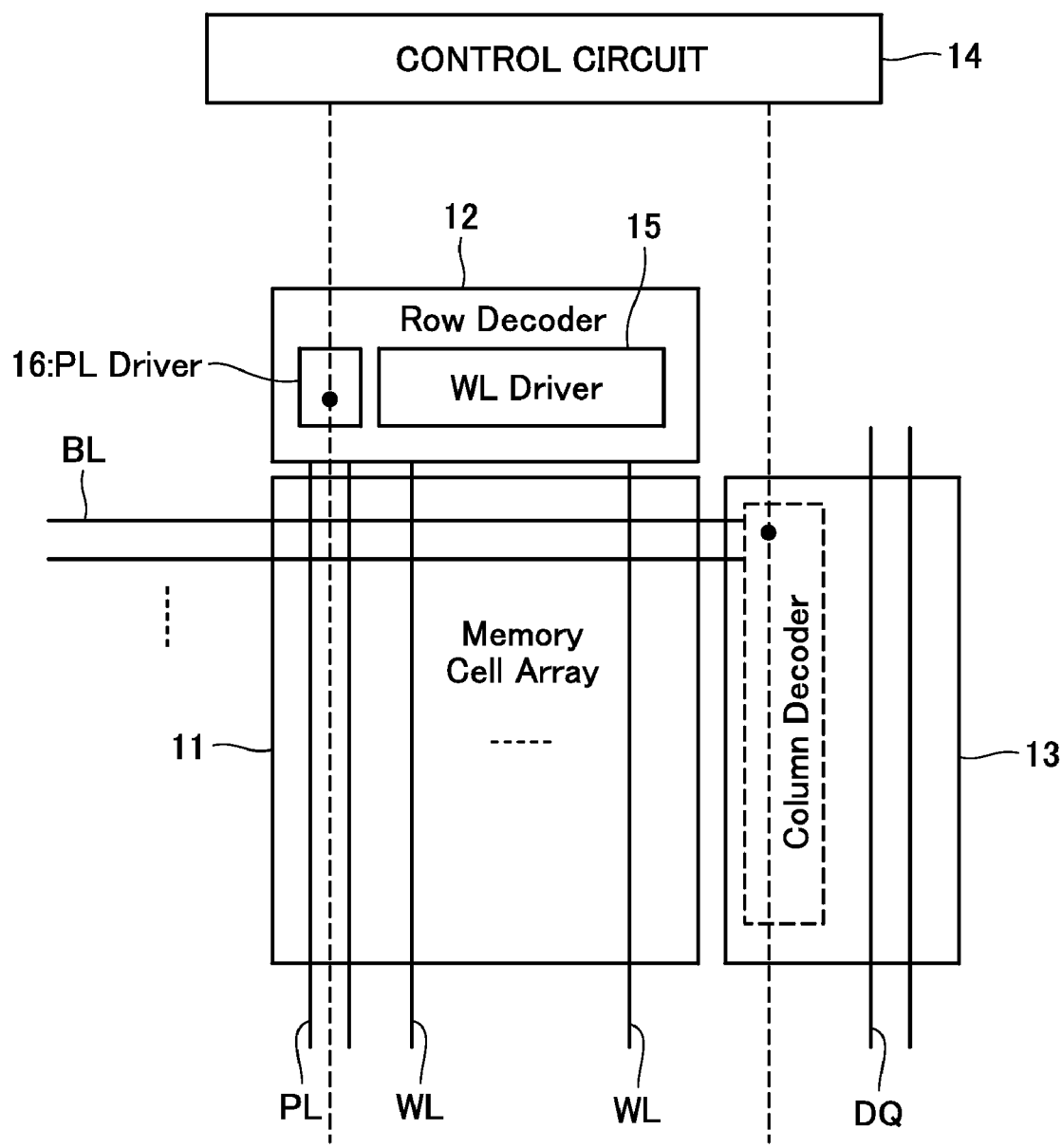
FIG. 9 shows a block diagram of the configuration of a ferroelectric memory capable of performing the test method in the first embodiment.

FIG. 9 is a schematic block diagram of a substantial portion configuration of the ferroelectric memory in this embodiment. The ferroelectric memory includes a memory cell array 11, a row decoder 12, a column decoder 13, and a control circuit 14. The row decoder 12 includes a word-line driver 15 for driving a word-line WL and a plate-line driver 16 for driving a plate-line PL.

The memory cell array 11 includes a plurality of memory cells arranged in a matrix arrangement. Each memory cell connects to the word-line WL, the bit-line BL, and the plate-line PL.

The bit-line BL is selected by the column decoder 13. Data is read from the memory cell MC to the bit-line BL and then transferred to the data-line DQ. Write data is provided to the data-line DQ and then transferred to the memory cell MC via the bit-line BL. The data-line DQ extends in the same direction as the word-line WL and the plate-line PL.

The control circuit 14 controls the driver circuits for the plate-line PL and the bit-line BL.

Figure 10A:
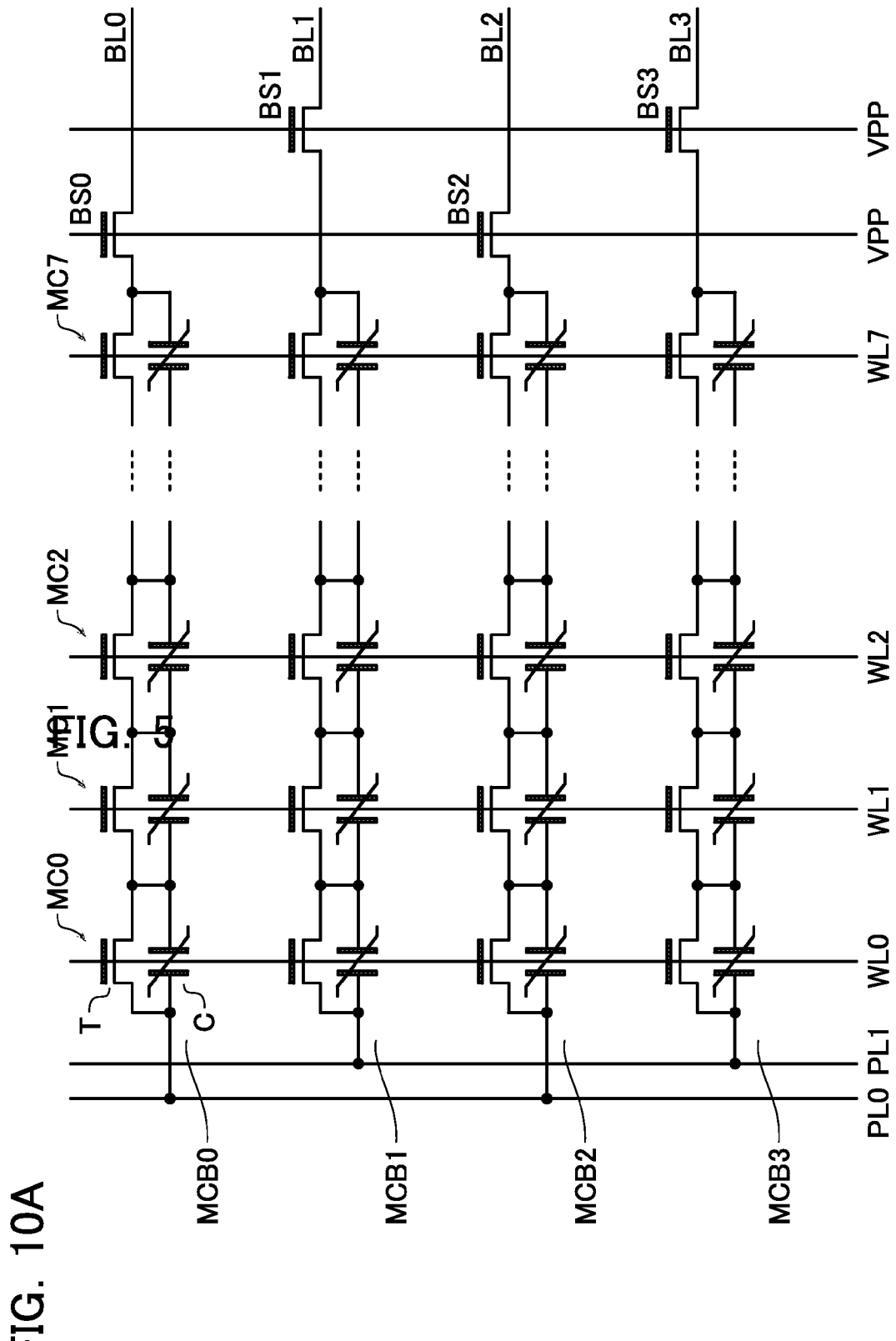

FIG. 10A shows an example configuration of the memory cell array 11. The memory cell array 11 in FIG. 10A is configured as a so-called TC parallel unit series-connected ferroelectric memory. Specifically, the memory cell array 11 includes a plurality of memory cells MCi (i=0 to 7). Each memory cell MCi includes a cell transistor T and a capacitor C. The capacitor C is connected across the source and the drain of the cell transistor T (i.e., one cell transistor T is connected in parallel with one ferroelectric capacitor C). The transistor-capacitor pair thus makes up one memory cell MCi.

A plurality of memory cells MCi (for example, eight memory cells) connected in series make up one memory cell block MCBj (j=0 to 3 in FIG. 10A). Each memory cell block MCBj has a first end connected to a bit-line BLj via a block selection transistor BSj and a second end connected to a plate-line PL0 or PL1. The gate of each cell transistor T connects to a word-line WLi.

The TC parallel unit series-connected ferroelectric memory is described in more detail in various documents such as JP 2005-4811, which is previously filed by the applicants. Its detailed description is thus omitted here.

Note that FIG. 10A shows only an example configuration of the memory cell array 11. The configuration may alternatively be the structure in FIG. 10B, for example, where the cell capacitor of the DRAM MOS capacitor is replaced by a ferroelectric capacitor.

Figure 11:
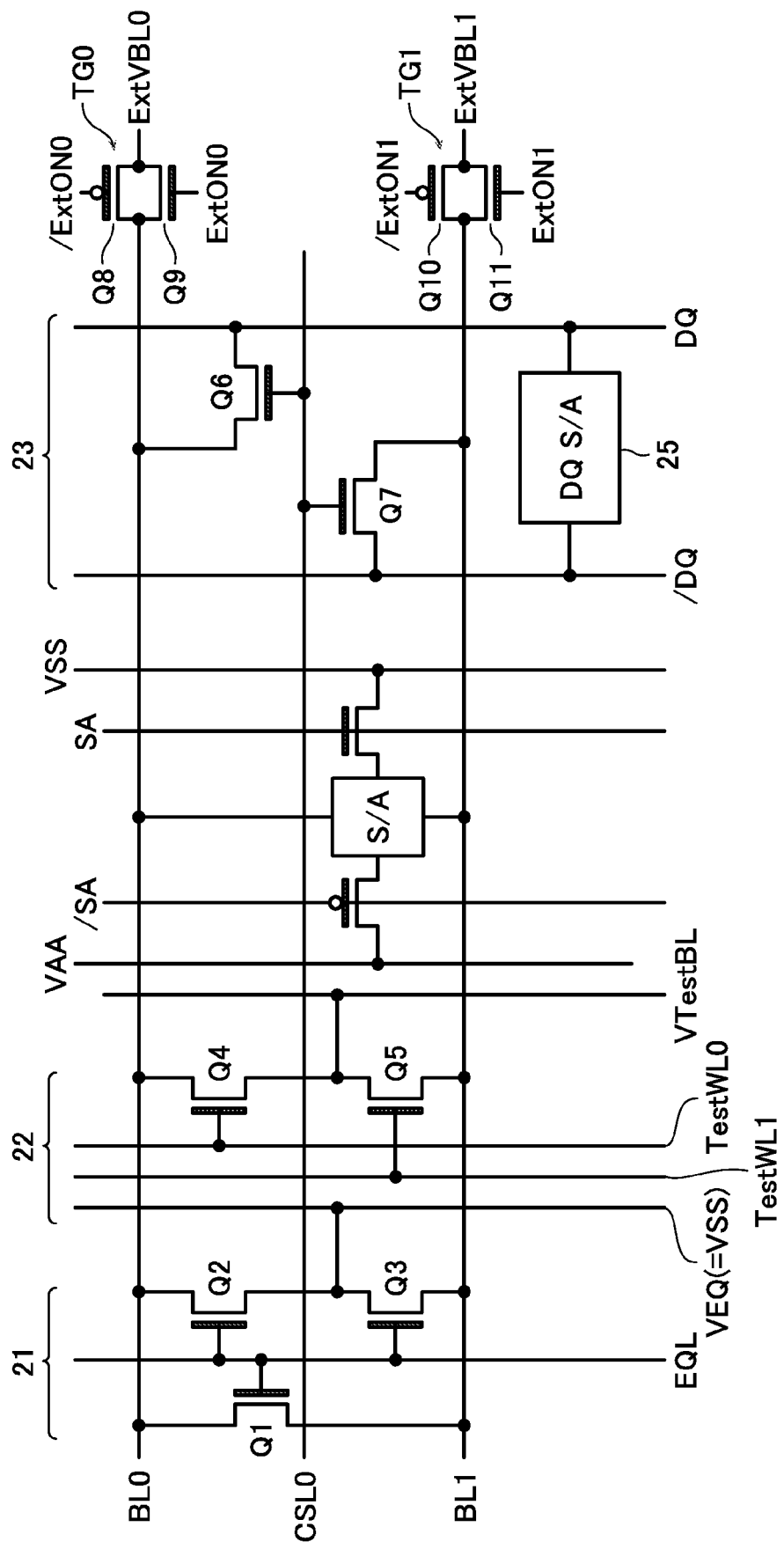
FIG. 11 shows an exemplary configuration of one bit-line pair BL0 and BL1, a sense amplifier S/A connected to the bit-line pair, and other peripheral circuits of a ferroelectric memory capable of performing the test method in the first embodiment.

In FIG. 10B, the cell transistor T and the ferroelectric capacitor C are connected in series between the plate-line PL and the bit-line BL. The transistor T and the capacitor C thus connected make up one memory cell MC. FIG. 11 shows exemplary configurations of one bit-line pair BL0 and BL1, a sense amplifier S/A connected to the bit-line pair, and other peripheral circuits.

Between the one bit-line pair BL0 and BL1 is connected an equalizer circuit 21. The equalizer circuit 21 includes MOS transistors Q1, Q2, and Q3. Each of the transistors Q1 to Q3 is rendered conductive when an equalization signal EQL is input to its gate. The transistor Q1 is connected between the bit-line pair BL0 and BL1. The transistors Q2 and Q3 are connected in series between the bit-line pair BL0 and BL1. Their connection node is supplied with an equalize voltage VEQ (a ground voltage VSS).

Between the bit-line pair BL0 and BL1 and a column selection line CSL0 is connected a bit-line potential supply circuit 22. The bit-line potential supply circuit 22 includes n type MOS transistors Q4 and Q5. The transistors Q4 and Q5 are connected in series between the bit-line pair BL0 and BL1. Their connection node is supplied with a test bit-line potential VTestBL in the test mode. The gates of the transistors Q4 and Q5 connect to test word-lines TestWL0 and TestWL1, respectively. The test word-lines are activated in the test mode.

Between the bit-line pair BL0 and BL1 is also provided the sense amplifier S/A. The sense amplifier S/A is activated by switching active signals SA and /SA to "H" and "L," respectively. The amplifier S/A compares/amplifies the potential difference between the bit-line pair BL0 and BL1.

The data-line pair DQ and /DQ extends in a direction intersecting the bit-line pair BL0 and BL1. A column switch 23 is provided to switch the connections between the data-line pair and the bit-line pair. The column switch 23 includes MOS transistors Q6 and Q7. The transistor QG is connected between the bit-line BL0 and the data-line DQ. The gate of the transistor Q6 connects to the column selection line CSL0. Similarly the MOS transistor Q7 is connected between the bit-line BL1 and the data-line /DQ. The gate of the MOS transistor Q7 connects to the column selection line CSL0.

Between the data-lines DQ and /DQ is provided a data-line sense amplifier 25. The sense amplifier 25 is adapted to compare/amplify the potential difference between the data-line pair DQ and /DQ.

Signal lines ExtVBL0 and ExtVBL1 are provided to externally supply potentials corresponding to the write data to the bit-line pair BL0 and BL1, respectively. Between the bit-line BL0 and the signal line ExtVBL0 is provided a transfer gate TG0. Between the bit-line BL1 and the signal line ExtVBL1 is provided a transfer gate TG1.

The transfer gate TG0 includes a P channel type MOS transistor Q8 and an N channel type MOS transistor Q9 that are connected in parallel. The gate of the P channel type MOS transistor QS is supplied with a signal /ExtON0. The gate of the N channel type MOS transistor Q9 is supplied with a signal ExtON0.

Similarly, the transfer gate TG1 includes a P channel type MOS transistor Q10 and an N channel type MOS transistor Q11 that are connected in parallel. The gate of the P channel type MOS transistor Q11 gate is supplied with a signal /ExtON1. The gate of the N channel type MOS transistor Q11 is supplied with a signal ExtON1.

Figure 12:
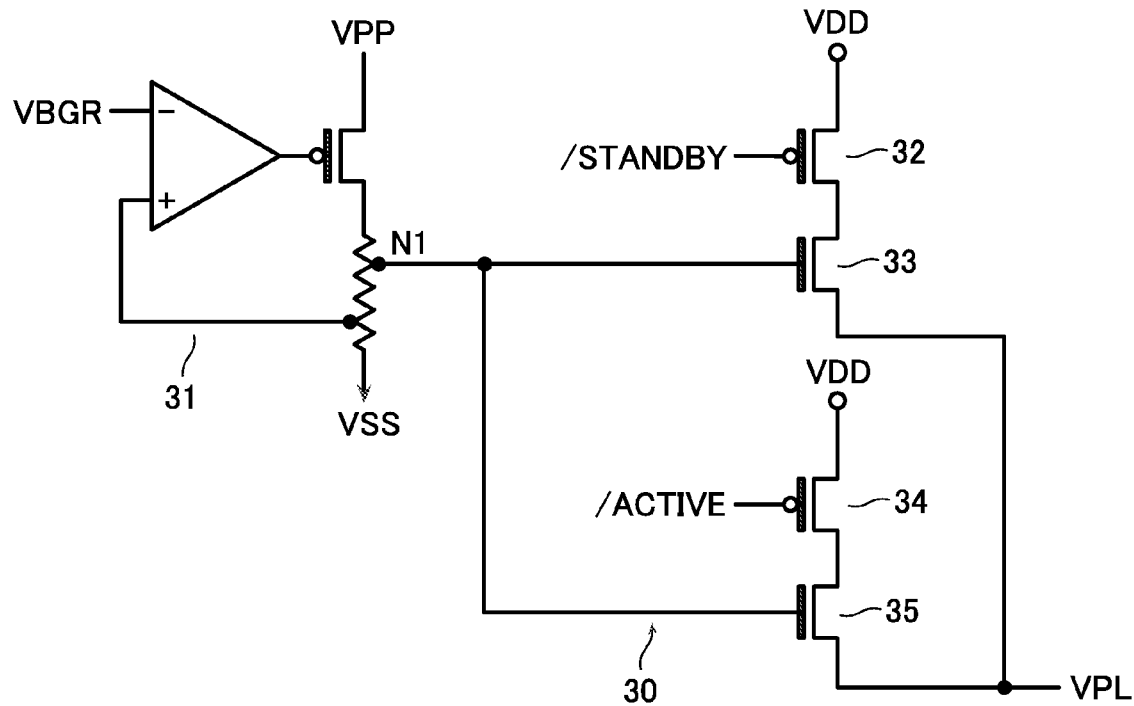
FIG. 12 shows a circuit diagram of an example configuration of the voltage generation circuit 30 in the control circuit 14 in FIG. 9.

The control circuit 14 includes a voltage generation circuit 30 for generating a plate-line potential VPL supplied during normal operation. FIG. 12 shows an example configuration of the voltage generation circuit 30.

The voltage generation circuit 30 includes a constant voltage output circuit 31, a p type MOS transistor 32, an n type MOS transistor 33, a p type MOS transistor 34, and an n type MOS transistor 35.

The constant voltage output circuit 31 outputs a constant voltage from a node N1 according to a temperature-independent constant reference voltage VBGR. The voltage VBGR is generated by a well-known band-gap type reference voltage generation circuit (not shown).

The transistors 32 and 33 are connected in series between an external power supply voltage terminal (VDD) and an output terminal (VPL). The gate of the transistor 33 connects to the node N1. The gate of the p type MOS transistor 32 receives a signal /STANBY. The p type MOS transistor 34 and the n type MOS transistor 35 are connected in series between the external power supply voltage terminal (VDD) and the output terminal (VPL). The gate of the p type MOS transistor 34 receives a signal /ACTIVE. The gate of the n type MOS transistor 35 connects to the node N1.

Here, the gate length of the n type MOS transistor 33 is defined as $L_{33}$, and the gate width as $W_{33}$. The gate length of the n type MOS transistor 35 is defined as $L_{35}$, and the gate width as $W_{35}$. The load current when the ferroelectric memory is active is defined as $I_{act}$, and the load current when the memory is standby as $I_{stanby}$.

The nMOS transistors 33 and 35 are formed such that, $$L_{33}=L_{35},$$

$$W_{35}/W_{33}=I_{act}/I_{stanby}.$$

In both the standby state and the active state, i.e., regardless of whether or not data is written or read from the memory cell, the standby control signal /STANDBY is "L." The p type MOS transistor 32 is then rendered conductive and the transistor 32 and the n type MOS transistor 33 pass a current smaller than that in the active state, thereby generating the plate-line potential VPL.

When the ferroelectric memory is in the active state, i.e., data is written or read from the memory cell, the active signal /ACTIVE is "L." The p type MOS transistor 34 is then rendered conductive and the transistor 34 and the n type MOS transistor 35 pass a current larger than that in the standby state, thereby generating the plate-line potential VPL. The standby control signal /STANDBY remains "L" and thus the p type MOS transistor 32 remains conductive, thereby keeping the current flow.

Figure 13:
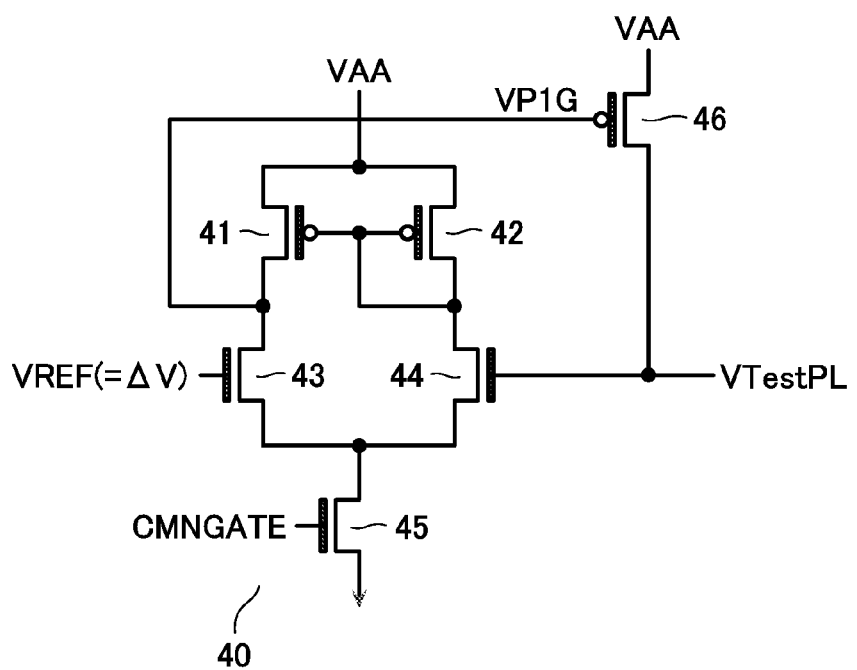
FIG. 13 shows a circuit diagram of an example configuration of the voltage generation circuit 40 in the control circuit 14 in FIG. 9.

The control circuit 14 also includes a voltage generation circuit 40 that generates a voltage VTestPL corresponding to ΔV in the test mode. FIG. 13 shows an example configuration of the voltage generation circuit 40. The voltage generation circuit 40 includes p type MOS transistors 41, 42, and 46 and n type MOS transistors 43, 44, and 45. They together make up one differential amplification circuit.

The p type MOS transistors 41 and 42 have their sources connected to form a common source and have their gates connected to form a common gate (the source is supplied with an array power supply voltage VAA). The common gate connects to the drain of the p type MOS transistor 42.

The drains of the n type MOS transistor 43 and 44 connect to the drains of the p type MOS transistors 41 and 42, respectively. The sources of the n type MOS transistors 43 and 44 connect to the drain of the n type MOS transistor 45. The source of the n type MOS transistor 45 is grounded. The gate of the n type MOS transistor 45 is provided with a control potential CMNGATE to control a current flow through the voltage generation circuit 40.

The gate of the n type MOS transistor 43 is provided with a voltage as a reference voltage VREF. The voltage is equal to the voltage ΔV obtained by resistance-dividing the voltage VBGR. VBGR is generated by a band gap reference circuit (not shown) or the like.

The gate of the p type MOS transistor 46 connects to the connection node between the p type MOS transistor 41 and the n type MOS transistor 43. The source of the p type MOS transistor 46 is applied with the array power supply voltage VAA. The drain of the p type MOS transistor 46 connects to the gate of the n type MOS transistor 44. The drain of the transistor 46 also serves as an output terminal of the output voltage VTestPL.

In this configuration, if the output voltage VTestPL falls below VREF, the n type MOS transistor 44 approaches the OFF state, thereby increasing the gate voltages of the p type MOS transistors 41 and 42. The p type MOS transistor 41 then also approaches the OFF state, thereby decreasing the drain voltage VP1G of the p type MOS transistor 41. The p type MOS transistor 46 thus increases its drain current, thus increasing VTestPL.

Conversely, if the output voltage VTestPL exceeds ΔV, the p type MOS transistors 41 and 42 decrease their gate voltages, thereby increasing the voltage VP1G. The p type MOS transistor 46 thus decreases its drain current, thereby decreasing VTestPL. Thus, the circuit may maintain the output voltage VTestPL at the constant voltage ΔV.

Figure 14:
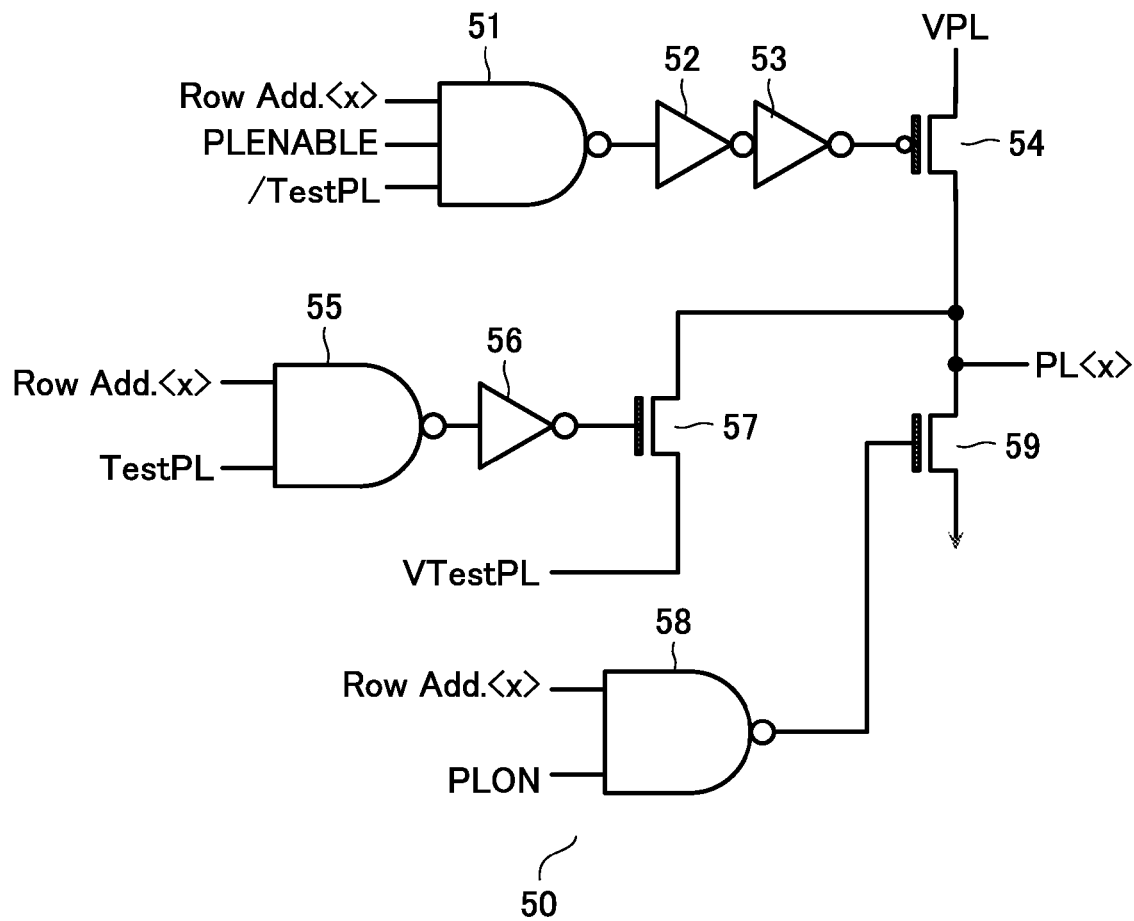
FIG. 14 shows a circuit diagram of an example configuration of the voltage output circuit 50 in the control circuit 14 in FIG. 9.

The control circuit 14 also includes a voltage output circuit 50 for switching, when starting the test mode, the potential of the plate-line PL from the voltage VPL used in normal read/write operation to VTestPL used in the test mode. FIG. 14 shows an example configuration of the voltage output circuit 50. The number of voltage output circuits 50 corresponds to the number of plate-lines PL<x>.

The voltage output circuit 50 includes NAND gates 51, 55, and 58, inverters 52, 53, and 56, a p type MOS transistor 54, and n type MOS transistors 57 and 59.

The input terminals of the NAND gate 51 receive a row address Row Add.<x>, a control signal PLENABLE, and a control signal /TestPL, respectively. The output terminal of the NAND gate 51 has two inverters 52 and 53 connected in series thereto. The output terminal of the inverter 53 in the second stage connects to the gate of the p type MOS transistor 54. The source of the p type MOS transistor 54 is applied with the plate-line potential VPL. The drain of the transistor 54 connects to the plate-line PL<x>.

The input terminals of the NAND gate 55 receive the row address Row Add.<x> and the control signal TestPL, respectively. The output terminal of the NAND gate 55 connects to the input terminal of the inverter 56. The output terminal of the inverter 56 connects to the gate of the n type MOS transistor 57. The source of the n type MOS transistor 57 connects to the plate-line PL<x>. The drain of the transistor 57 is provided with VTestPL (=ΔV) from the output terminal of the voltage generation circuit 40.

Between the plate-line PL<x> and the ground terminal is connected the n type MOS transistor 59. The gate of the transistor 59 connects to the output terminal of the NAND gate 58. The NAND gate 58 receives the row address Row Add.<x> and the control signal PLON.

In the voltage output circuit 50 in FIG. 14, in normal operation, the control signal PLENABLE, the control signal PLON, and the control signal /TestPL (which is the inversion signal of the control signal TestPL) are all set to "H" and the row address Row Add.<x> is selected. The NAND gate circuit 51 thus outputs "L," thereby rendering the transistor 54 conductive and thus outputting the plate-line potential VPL to the plate-line PL<x>. Specifically, in normal operation, the voltage output circuit 50 outputs normal plate-line potential VPL to the plate-line PL<x> in response to the row address Row Add.<x>.

In the test mode, the control signal TestPL is set to "H" and the row address Row Add.<x> is selected. The NAND gate circuit 55 thus outputs "L," thereby rendering the n type MOS transistor 57 conductive and thus outputting the voltage VTestPL (=ΔV) to the plate-line PL<x>. The p type MOS transistor 54 turns off because the control signal /TestPL is "L." The plate-line potential VPL is thus not supplied. Specifically, in the test mode, the voltage output circuit 50 has a function of outputting the test voltage VTestPL (=ΔV) to the plate-line PL<x> in response to the row address Row Add.<x>.

The NAND gate circuit 58 and the n type MOS transistor 59 have a function of, in both normal operation and the test mode, once resetting the potential of the plate-line PL<x> to 0 V if the control signal PLON is set to "L."

Figure 15:
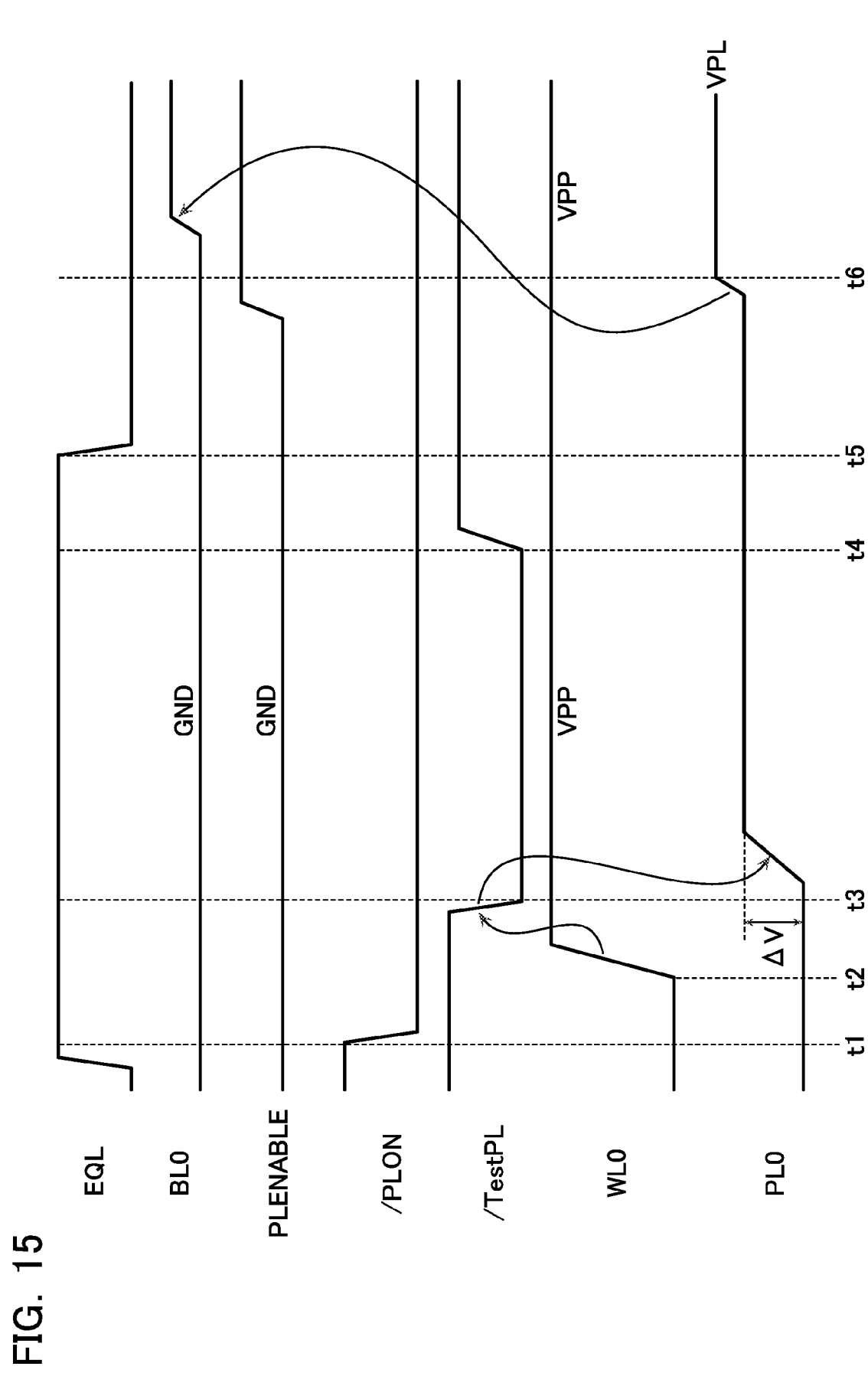
FIG. 15 shows a timing diagram of the operation in the test mode of the ferroelectric memory in FIG. 9.

With reference to the timing diagram in FIG. 15, a description is given of the specific operations before the sense operation in the test mode in FIG. 1 in the ferroelectric memory. An example is considered here where in the memory cell array in FIG. 10B, the memory cell MC0 is selected and the test mode in FIG. 1 is performed.

After normal data write operation performs step (1-2) "writing the initial pattern data," the bit-line BL0 is fixed to the ground potential (VSS (0 V)) by setting the equalization signal EQL to "H" in the precharge circuit 21 at time t1. The control signal PLENABLE is kept at "L" (GND). The plate-line PL0 is thus not driven in normal operation. After the equalization signal EQL is set to "H," the control signal /PLON is decreased to "L."

Then, at time t2, the row address Row Add.<0> corresponding to the word-line WL0 is selected. The word-line WL0 is thus stepped up to a boosted voltage VPP, thereby rendering the transistor T in the memory cell MC0 conductive. The memory cell MC0 is thus selected. Then, at time t3, the control signal /TestPL changes to "L." The NAND gate 55 of the voltage output circuit 50 thus outputs a signal "L," thereby rendering the n type MOS transistor 57 conductive. The plate-line PL0 is thus charged to the voltage ΔV. Step (1-3) is thus performed.

Then, at time t4, the control signal /TestPL returns from "L" to "H." Then, at time t5, the equalization signal EQL changes to "L." The bit-line BL0 is thus released from being equalized to the ground potential and is floated. Step (1-4) is thus performed. Then, at time t6, the control signal PLEABLE changes to "H." The NAND gate 51 thus outputs a signal "L," thereby rendering the p type MOS transistor 54 conductive. The voltage of the plate-line PL0 is thus increased from ΔV to VPL.

Specifically, like normal data read operation, a sub-step of step (1-5) before the sense amplification is performed. The voltage of the bit-line BL is thus increased to a voltage corresponding to data held in the memory cell MC0 (the voltage is generally the same as the voltage during the actual imprint) The voltage is sensed and amplified by the sense amplifier circuit S/A to read the initial pattern data. Steps (1-8) to (1-12) may be performed similarly to the above steps.

Second Embodiment

Next, a ferroelectric memory according to a second embodiment of the present invention and a method for testing the same will be described referring to the drawings.

Figure 16:
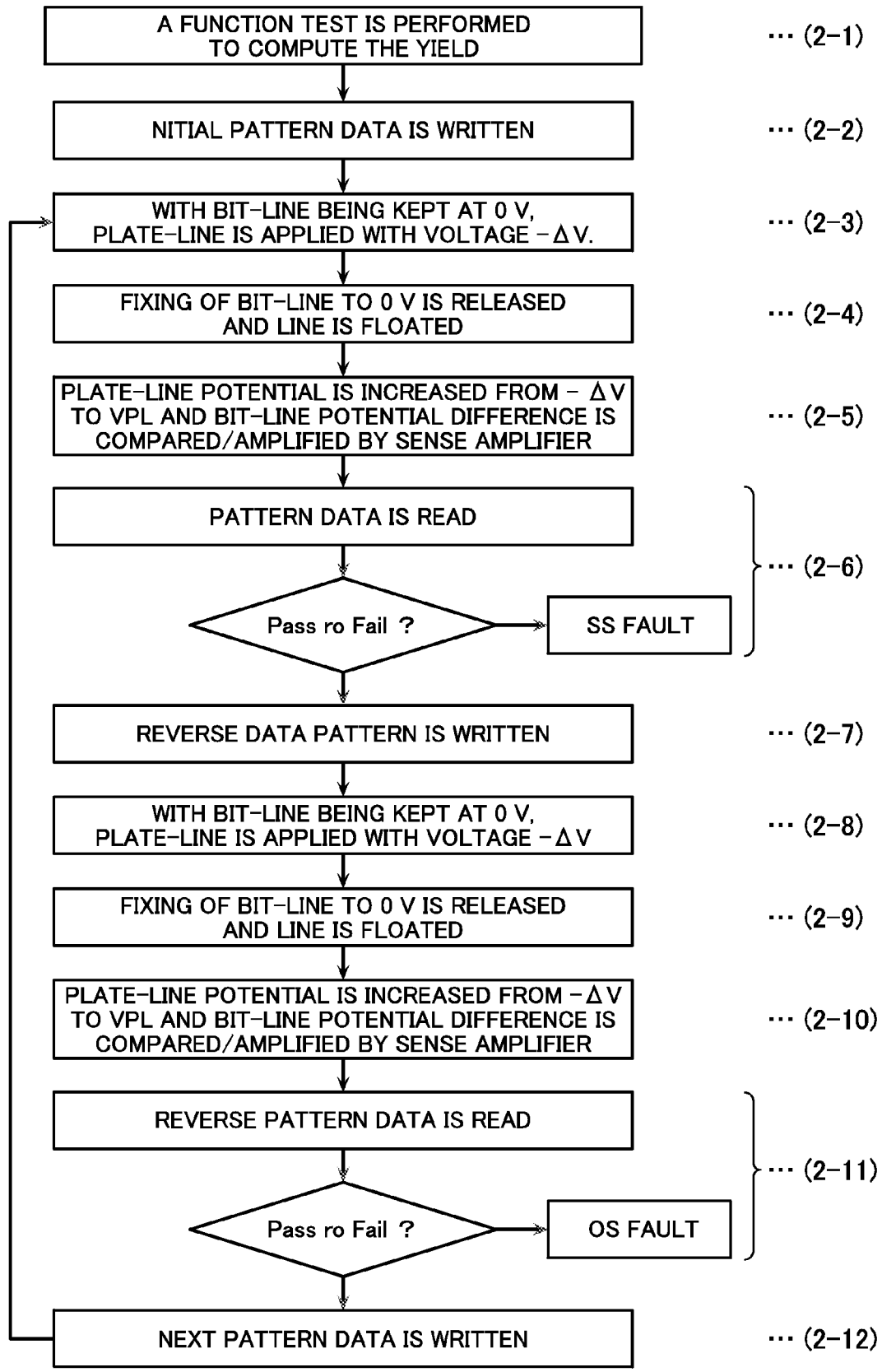
FIG. 16 shows a flowchart of the procedure for the test method according to a second embodiment of the present invention.

The test method in this embodiment is performed according to the following procedure as shown in the flowchart in FIG. 16.

(2-1) A function test is performed to compute the yield.

(2-2) According to normal data write operation, a write voltage is applied across the electrodes of the ferroelectric capacitor to write initial pattern data.

(2-3) A negative voltage of a certain absolute value is applied across the electrodes of the ferroelectric capacitor.

Specifically, the plate-line is applied with a negative voltage −ΔV of a certain absolute value, while the bit-line is fixed to 0 V (ground potential).

(2-4) The bit-line is released from being fixed to 0 V and is floated.

(2-5) The plate-line potential is increased from −ΔV to the plate-line potential VPL used in normal operation. The potential difference between the bit-line pair is then compared/amplified by the sense amplifier.

(2-6) The initial pattern data is read to compute the SS yield (Same State Yield).

(2-7) The initial pattern data is reversed and the reverse data pattern is written.

(2-8) A negative voltage of a certain absolute value is applied across the electrodes of the ferroelectric capacitor.

Specifically, the plate-line is applied with a certain negative voltage −ΔV, while the bit-line is set to 0 V.

(2-9) The bit-line is released from being fixed to 0 V and is floated, (2-10) The plate-line potential is increased from −ΔV to VPL used in normal operation. The potential difference between the bit-line pair is then compared/amplified by the sense amplifier.

(2-11) The reverse data pattern is read to compute the OS yield (Opposite State Yield).

(2-12) The next pattern data is written.

Unlike the first embodiment, in steps (2-3) and (2-8), the plate-line is applied with the negative voltage −ΔV, not the positive voltage ΔV. Under similar conditions, the imprint may occur as phenomenon in which the hysteresis characteristic curve moves in the positive direction of the x-axis of the graph. Alternatively, the characteristic curve may move in the negative direction. In this embodiment, with the latter being assumed, the above procedure is performed.

Like the first embodiment, steps (2-3) to (2-5) may provide, in a short time, and without the bake process, the ferroelectric capacitor with polarization that is equal to that when the ferroelectric capacitor is in an imprint state. Polarization data after imprint may substantially thus be provided. This will be described in more detail referring to FIGS. 17 to 20.

Figure 17:
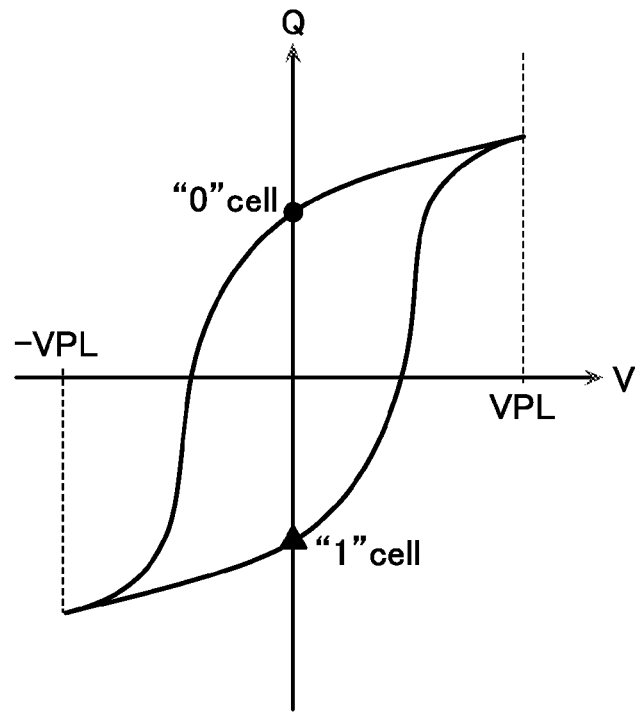
FIGS. 17-23 show hysteresis characteristic curves of a ferroelectric capacitor, which illustrate the operation of the test method in the second embodiment.

FIG. 17 shows a hysteresis characteristic curve of the ferroelectric capacitor after step (2-2), i.e., immediately after the initial pattern is written in the test procedure in this embodiment in FIG. 16. This curve is similar to that in the first embodiment (FIG. 2).

Figure 18:
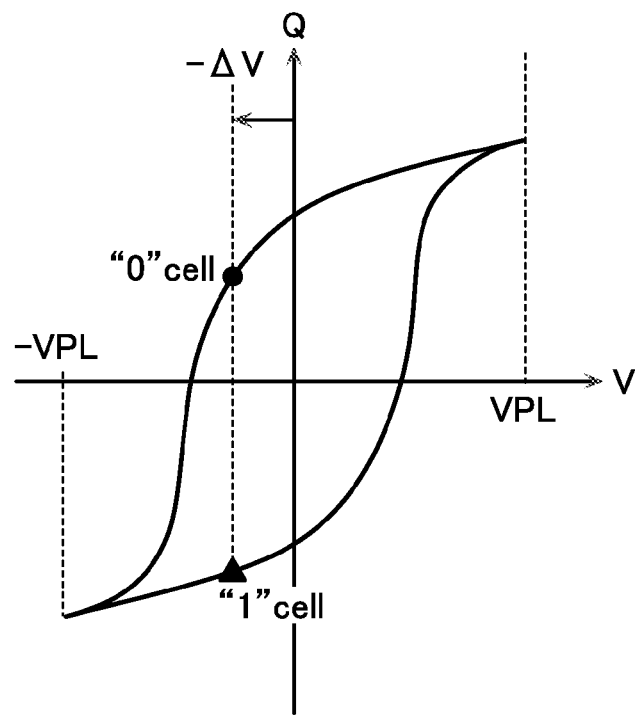

Then, step (2-3) (a negative voltage of a certain absolute value is applied across the electrodes of the ferroelectric capacitor: the plate-line voltage at −ΔV, the bit-line voltage at 0 V) moves the polarization of the "0" cell and the "1" cell to the closed circle and the closed triangle, respectively, on the hysteresis characteristic curve as shown in FIG. 18. The movement direction is opposite (negative direction) to the direction in the first embodiment. A polarization state is thus reproduced that is generally the same as during the actual imprint where the hysteresis characteristic curve itself moves in the positive direction.

Then, step (2-4) and step (2-5) are performed, thereby providing a bit-line voltage change similar to that during the actual imprint.

Figure 19:
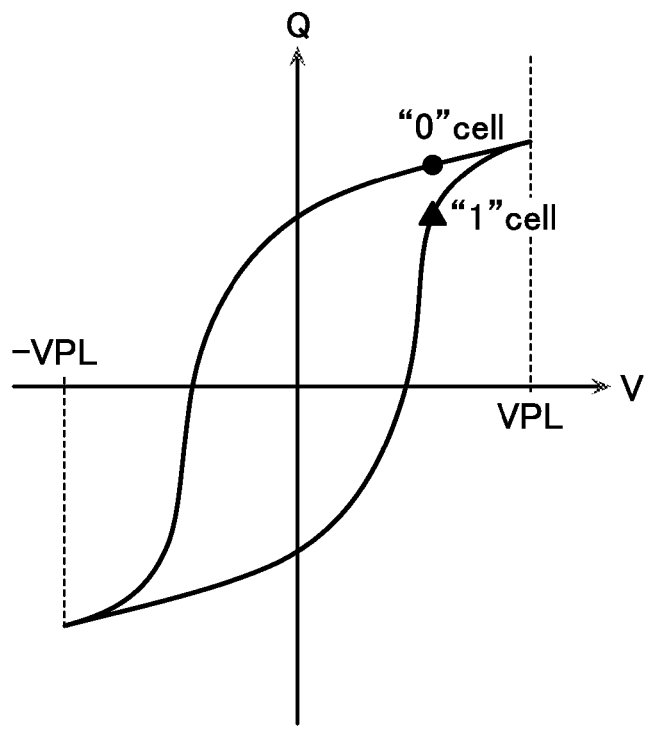
Figure 20:
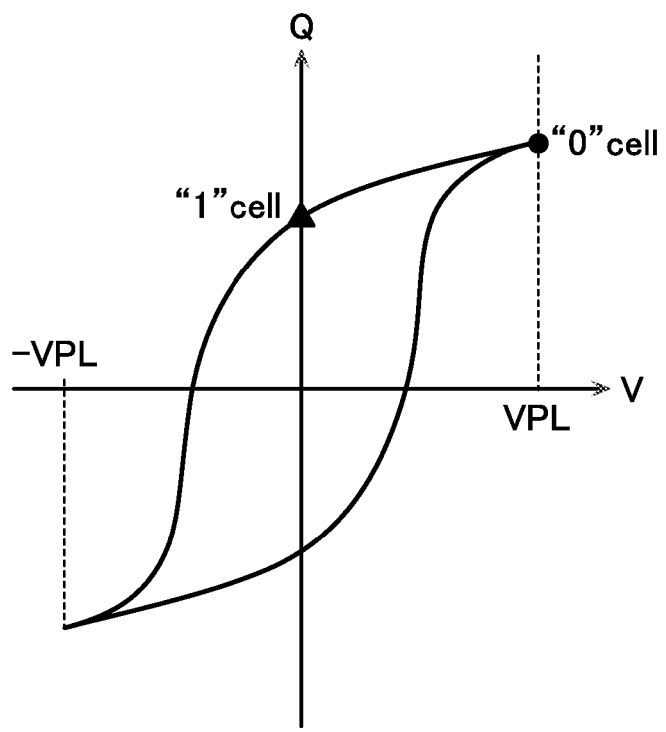

A sub-step of step (2-5) in which the plate-line potential is driven to the voltage VPL moves the polarization of the "0" cell and the "1" cell to the closed circle and the closed triangle, respectively, on the hysteresis characteristic curve as shown in FIG. 19. Then, the potential difference between the bit-line pair is compared/amplified by the sense amplifier (the first portion of step (2-5)). The polarization of the "0" cell and the "1" cell are thus moved to the respective positions on the hysteresis characteristic curve as shown in FIG. 20. In FIG. 18, the bit-line is then floated and the plate-line potential is raised from −ΔV to VPL, thereby providing generally the same bit-line signal as during the actual imprint. Specifically, without the bake process, the data holding characteristics of the memory cell during the actual imprint may be checked.

Figure 21:
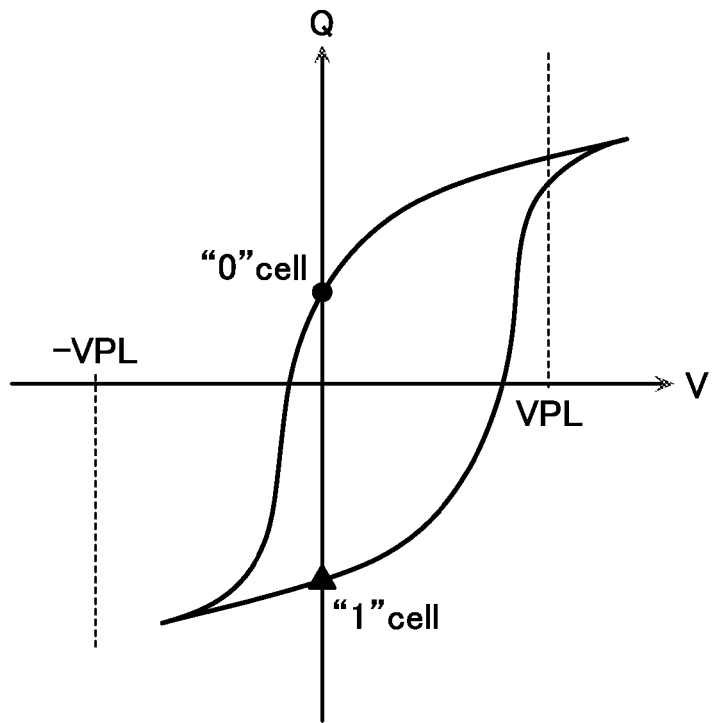
Figure 22:
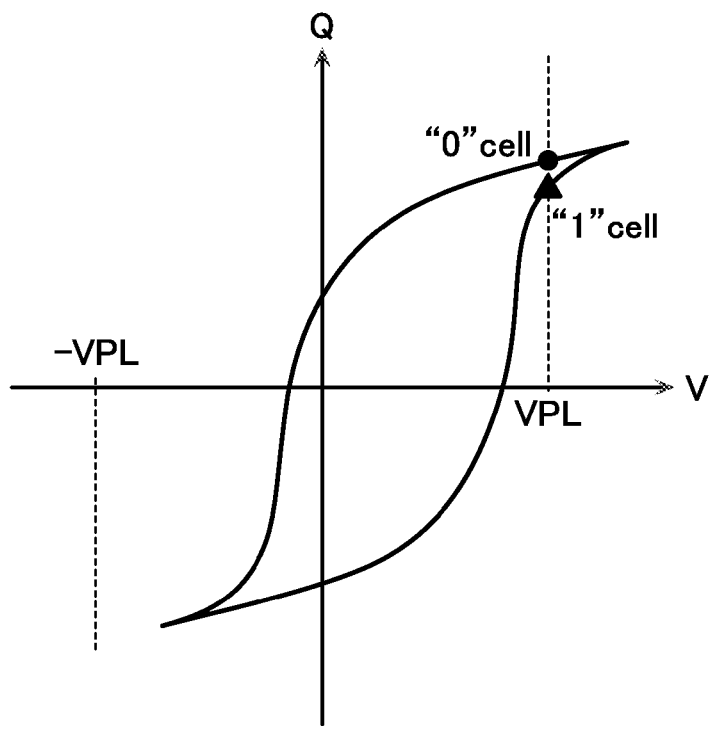
Figure 23:
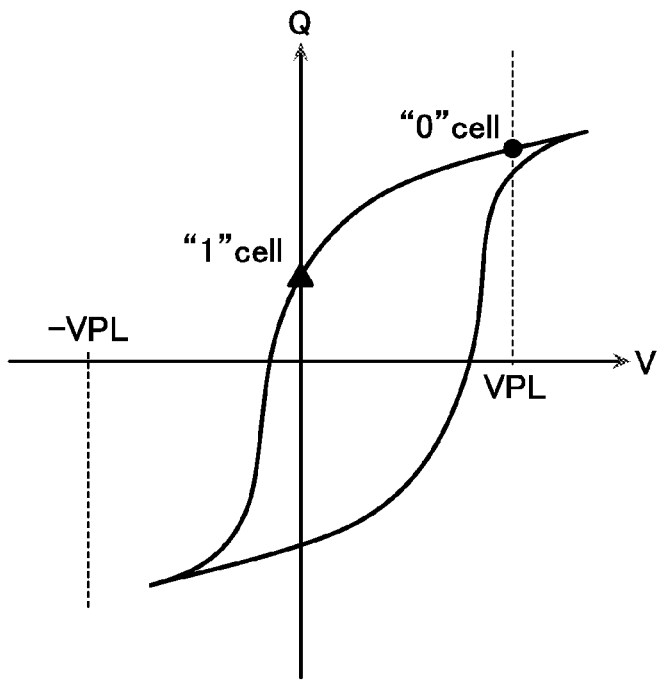

With reference to the hysteresis characteristic curves in FIGS. 21 to 23, the read operation of the memory cell during the actual imprint due to heat or the like will be described below. FIG. 21 shows the actual imprint where the hysteresis characteristic curve moves in the positive direction of the x-axis. Then, with the bit-line potential being floated, the plate-line potential is increased from 0 to VPL, moving the polarization of the "1" cell and the "0" cell as shown in FIG. 22. Specifically, because the hysteresis characteristic curve is moved in the positive direction of the x-axis, the polarizations of both cells do not arrive at the saturated state but stay at the positions shown in FIG. 22 even if the plate-line is applied with the voltage VPL of the same potential as when no imprint occurs. Then, the bit-line is floated and the sense amplifier is activated, thus providing the state shown in FIG. 23.

Now, comparison between test in this embodiment (FIGS. 17 to 20) and the case after the actual imprint (FIGS. 21 to 23) shows that the movement from the state in FIG. 18 to the state in FIG. 19 and the movement from the state in FIG. 21 to the state in FIG. 22 are considered to have generally the same trajectory on the hysteresis characteristic curve.

This embodiment may thus be considered to sufficiently reproduce the imprint condition. The effects of steps (2-8) to (2-10) to reverse pattern data (step (2-7)) are similar to those in (2-3) to (2-5). A detailed description of steps (2-8) to (2-10) is thus omitted here.

Figure 24:
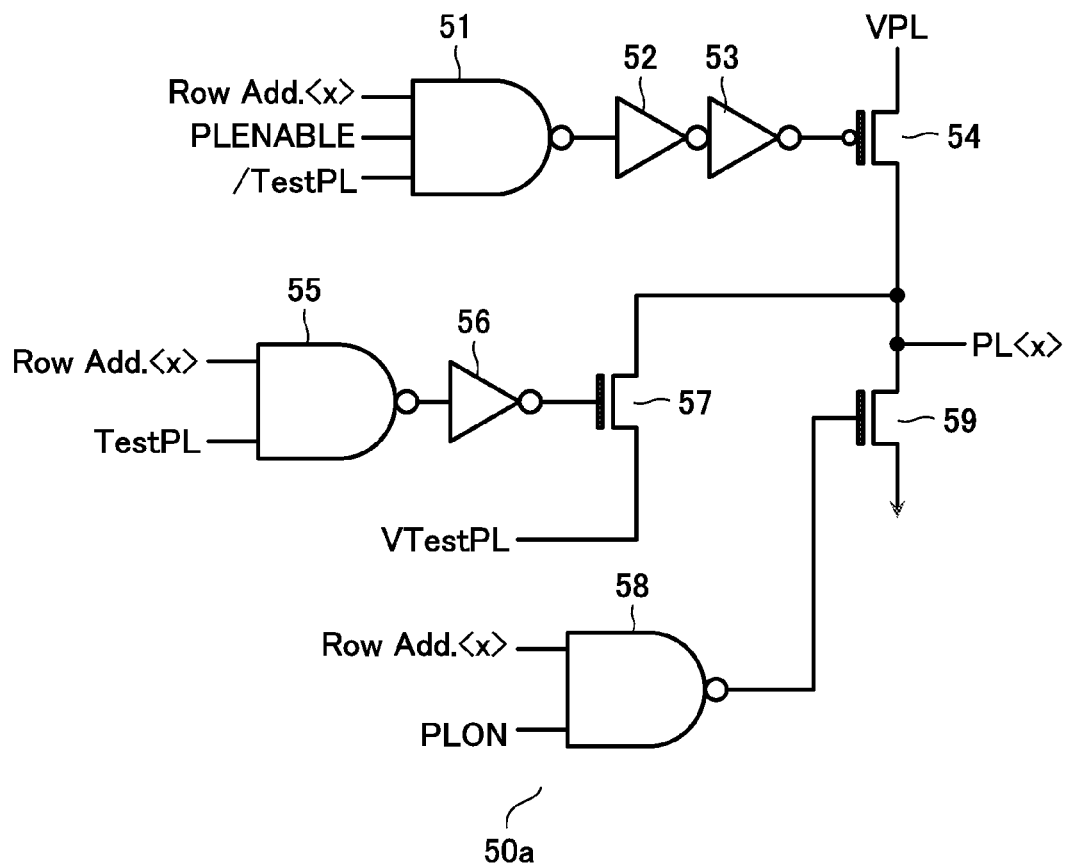
FIG. 24 shows a circuit diagram of a portion (the voltage output circuit 50a) of the configuration of a ferroelectric memory capable of performing the test method in the second embodiment.

The ferroelectric memory for performing the test method in the second embodiment may have a similar configuration to that in the first embodiment. Note, however, that the voltage output circuit 50 is replaced with a voltage output circuit 50a in FIG. 24. The voltage output circuit 50a is similar to the voltage output circuit 50 in FIG. 14, except that the voltage VTestPL applied to the drain of the n type MOS transistor 57 is $-\Delta V$ (like elements as those in FIG. 14 are designated with like reference numerals).

Figure 25:
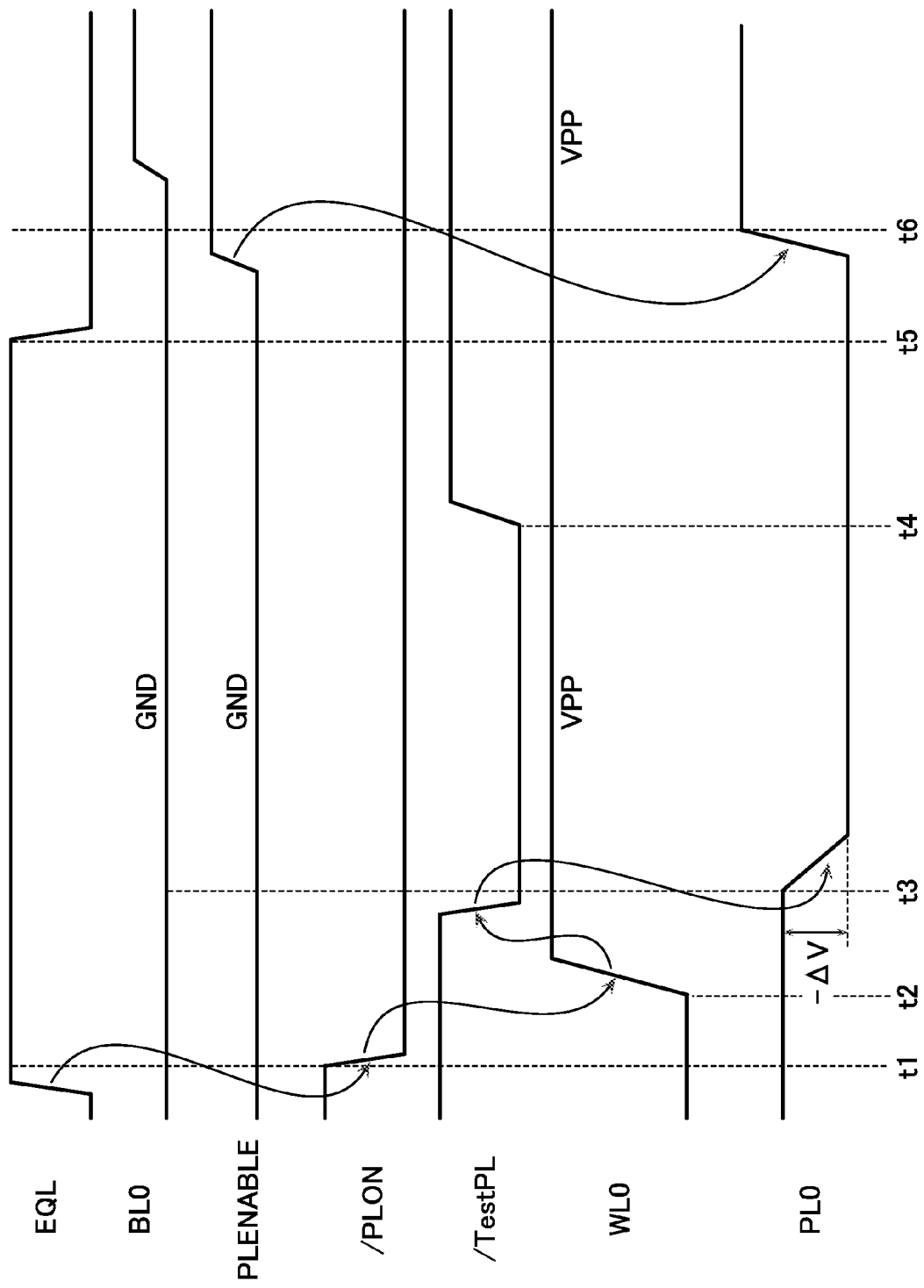
FIG. 25 shows a timing diagram of the operation in the test mode of the ferroelectric memory in the second embodiment.

The operation is similar to that in the first embodiment, except that the potential of the plate-line PL is $-\Delta V$, as shown in FIG. 25. Steps (2-8) to (2-12) may be performed similarly to the above steps.

Third Embodiment

A ferroelectric memory according to a third embodiment of the present invention and a method for testing the same will be described referring to the drawings.

Figure 26:
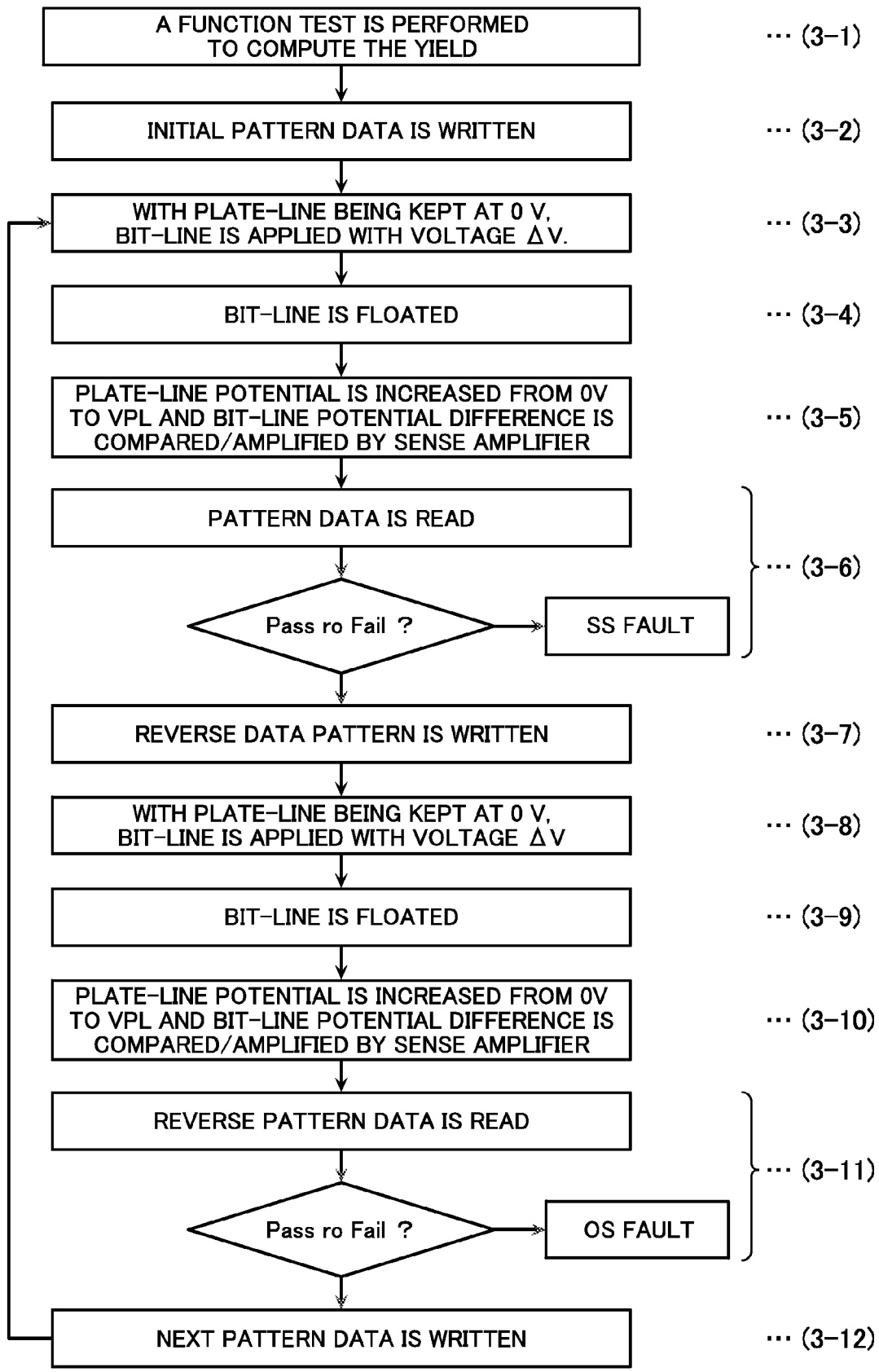
FIG. 26 shows a flowchart of the procedure for a test method according to a third embodiment of the present invention.

The test method in this embodiment is performed according to the following procedure as shown in the flowchart in FIG. 26.

(3-1) A function test is performed to compute the yield.

(3-2) According to normal data write operation, a write voltage is applied across the electrodes of the ferroelectric capacitor to write initial pattern data.

(3-3) A certain voltage is applied across the electrodes of the ferroelectric capacitor. Specifically, the bit-line is applied with a certain voltage $\Delta V$, while the plate-line is fixed to 0 V (ground potential).

(3-4) The bit-line is floated.

(3-5) The plate-line potential is increased to the plate-line potential VPL used in normal operation. The potential difference between the bit-line pair is then compared/amplified by the sense amplifier.

(3-6) The initial pattern data is read to compute the SS yield (Same State Yield).

(3-7) The initial pattern data is reversed and the reverse data pattern is written.

(3-8) A certain voltage is applied across the electrodes of the ferroelectric capacitor. Specifically, the bit-line is applied with a certain voltage $\Delta V$, while the plate-line is fixed to 0 V (ground potential).

(3-9) The bit-line is floated.

(3-10) The plate-line potential is increased to VPL used in normal operation. The potential difference between the bit-line pair is then compared/amplified by the sense amplifier.

(3-11) The reverse data pattern is read to compute the OS yield (Opposite State Yield).

(3-12) The next pattern data is written.

The third embodiment is characterized by steps (3-3) and (3-8) in which the bit-line, not the plate-line, is applied with a certain voltage $\Delta V$, while the plate-line is fixed to 0 V. This is different from the second embodiment in which the plate-line is applied with the negative voltage $-\Delta V$, while the bit-line is fixed to 0 V. The first and second embodiments have similar effects. In the second embodiment, however, the ferroelectric memory needs no negative voltage in normal operation and thus the negative voltage is generated only for the test mode, which increases a burden on the circuits.

In the third embodiment, the imprint effect may be tested without generating the negative voltage or increasing the burden on the circuits.

Like the above embodiments, steps (3-3) to (3-5) may provide, in a short time, and without the bake process, the ferroelectric capacitor with polarization that is equal to that when the ferroelectric capacitor is in an imprint state. Polarization data after imprint may substantially thus be provided. This will be described in more detail referring to FIGS. 27 to 30.

Figure 27:
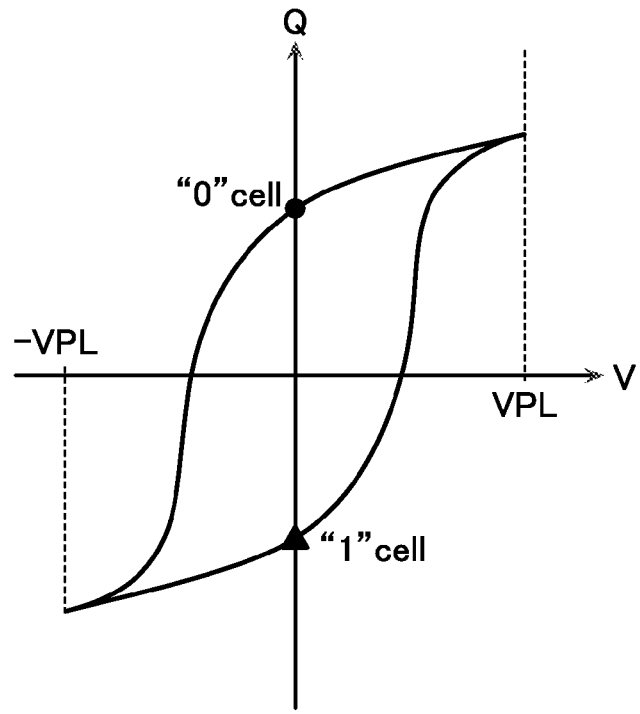
FIGS. 27 to 33 show hysteresis characteristic curves of a ferroelectric capacitor, which illustrate the operation of the test method in the third embodiment.

FIG. 27 shows a hysteresis characteristic curve of the ferroelectric capacitor after step (3-2), i.e., immediately after the initial pattern is written in the test procedure in this embodiment in FIG. 26. This curve is similar to that in the first embodiment (FIG. 2).

Figure 28:
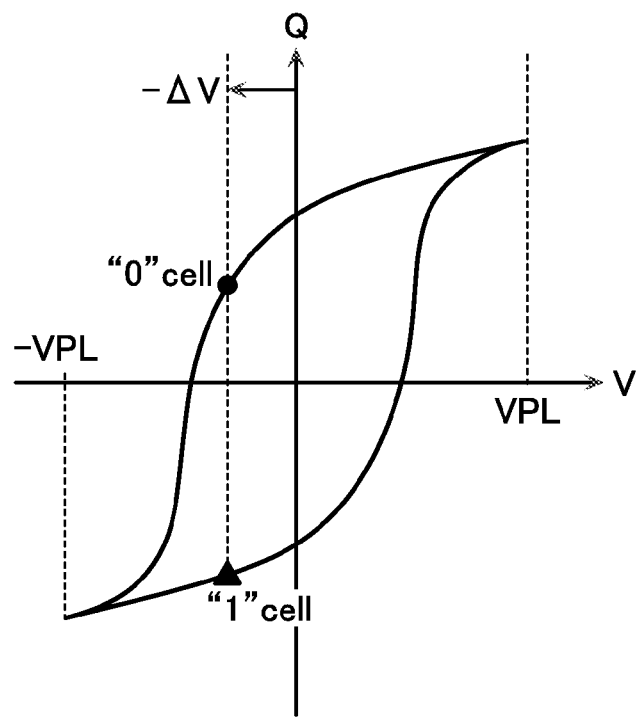

Then, with reference to FIG. 28, step (3-3) (a certain voltage is applied across the electrodes of the ferroelectric capacitor: the plate-line voltage at 0 V, the bit-line voltage at $\Delta V$) moves the polarization of the "0" cell and the "1" cell to the respective positions (the closed circle and the black triangle) on the hysteresis characteristic curve in FIG. 28.

The movement is in a direction (positive direction) opposite to that in the first embodiment (FIG. 3) and in the same direction as the second embodiment (FIG. 18). In other words, a polarization state is generated that is generally the same as during the actual imprint where the hysteresis characteristic curve moves in the positive direction.

Then, step (3-4) and a sub-step of step (3-5) in which the plate-line potential is increased from 0 [V] to VPL are performed, thereby providing a bit-line voltage change similar to that during the actual imprint.

Figure 29:
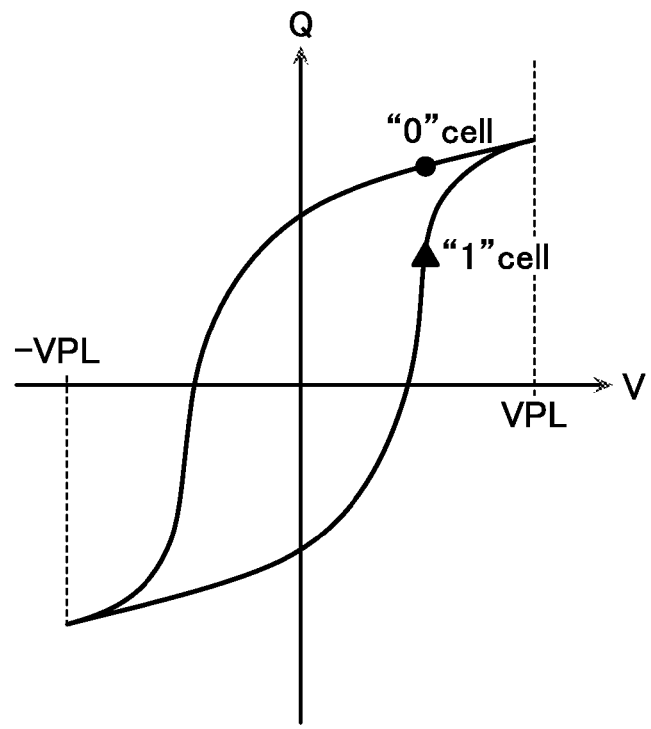
Figure 30:
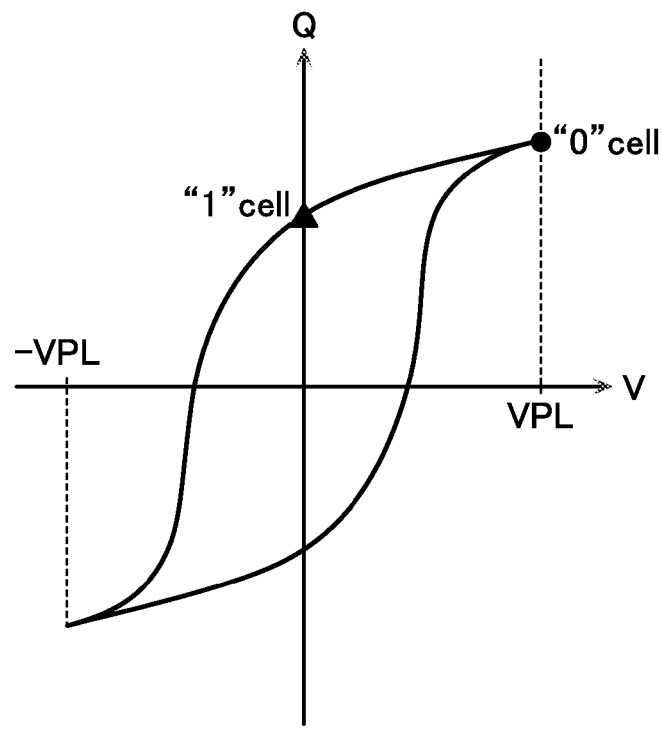

Step (3-5) moves the polarization of the "0" cell and the "1" cell to the respective positions on the hysteresis characteristic curve as shown in FIG. 29. Then, a sub-step of step (3-5) in which the potential difference between the bit-line pair is compared/amplified by the sense amplifier moves the polarization of the "0" cell and the "1" cell to the respective positions on the hysteresis characteristic curve as shown in FIG. 30.

In FIG. 28, the bit-line is then floated and the plate-line potential is raised to VPL. This may provide generally the same bit-line signal as during the actual imprint. Specifically, without the bake process, the data holding characteristics of the memory cell may be checked.

Figure 31:
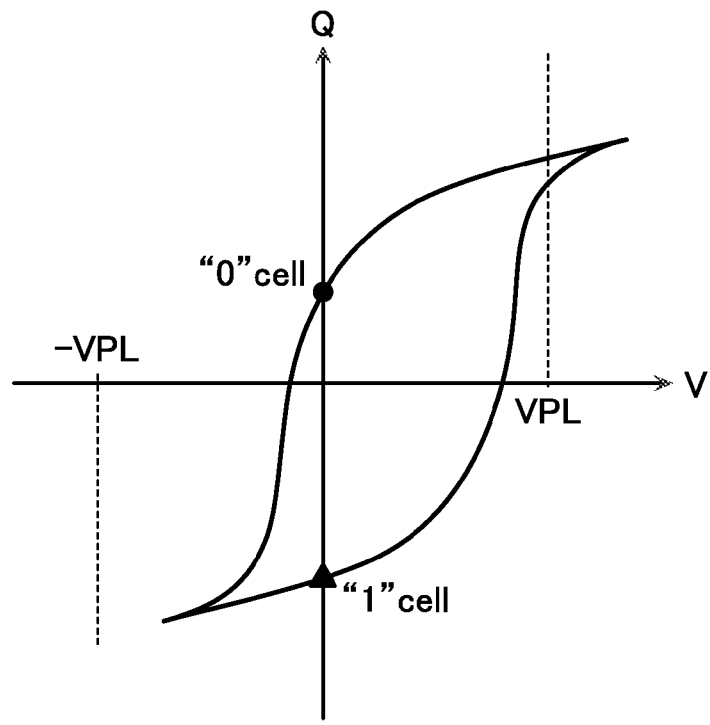

With reference to the hysteresis characteristic curves in FIGS. 31 to 33, the read operation of the memory cell during the actual imprint due to heat or the like will be described below. FIG. 31 shows the actual imprint where the hysteresis characteristic curve moves in the positive direction of the x-axis. Then, with the bit-line potential being floated, the plate-line potential is increased from 0 to VPL, moving the polarization of the "1" cell and the "0" cell as shown in FIG. 32.

Figure 32:
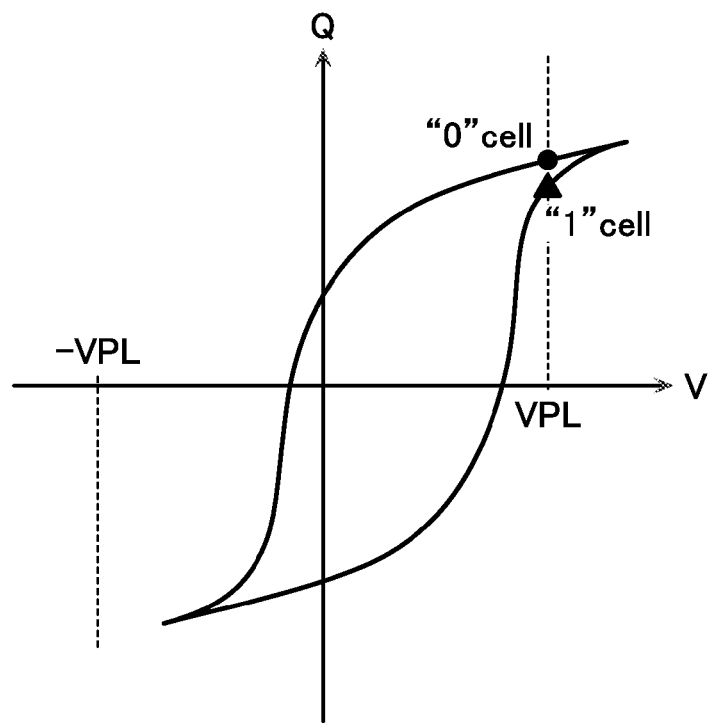
Figure 33:
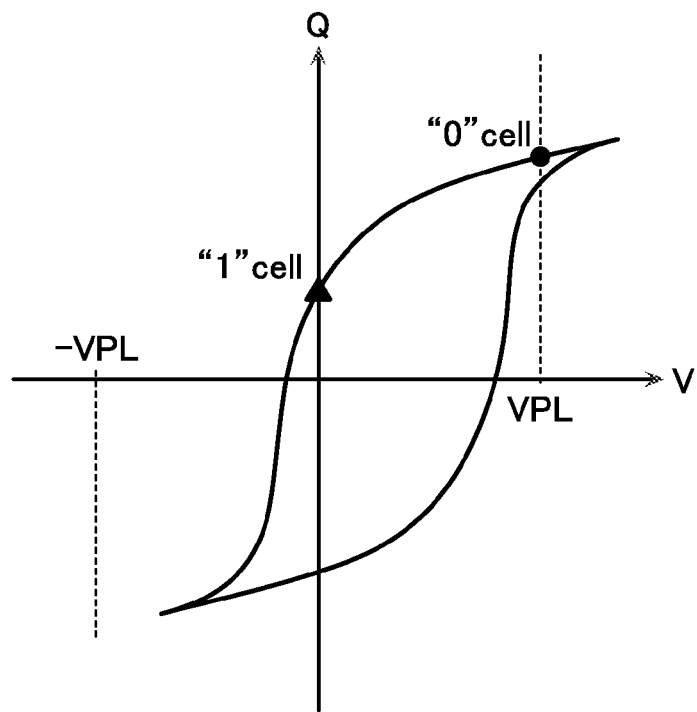

Specifically, because the hysteresis characteristic curve is moved in the positive direction of the x-axis, the polarizations of both cells do not arrive at the saturated state but stay at the positions shown in FIG. 32 even if the plate-line is applied with the voltage VPL of the same potential as when no imprint occurs. Then, the bit-line is floated and the sense amplifier is activated, thus providing the state shown in FIG. 33.

Now, comparison between the test in this embodiment (FIGS. 27 to 30) and the case of the actual imprint (FIGS. 31 to 33) shows that the trajectories on the hysteresis characteristic curve are considered to be generally the same between the movement from the state in FIG. 28 to the state in FIG. 29 and the movement from the state in FIG. 31 to the state in FIG. 32. This embodiment may thus be considered to sufficiently reproduce the imprint condition.

The effects of steps (3-8) to (3-10) to reverse pattern data (step (3-7)) are similar to those in (3-3) to (3-5). A detailed description of steps (3-8) to (3-10) is thus omitted here.

Figure 34:
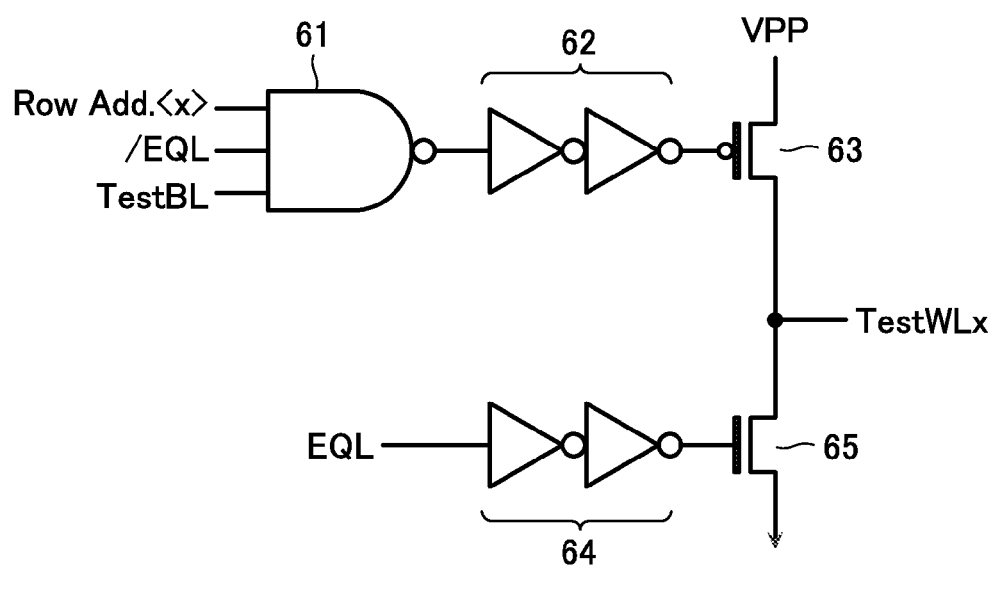
FIGS. 34 and 35 show circuit diagrams of portions of the configuration of a ferroelectric memory capable of performing the test method in the third embodiment.
Figure 35:
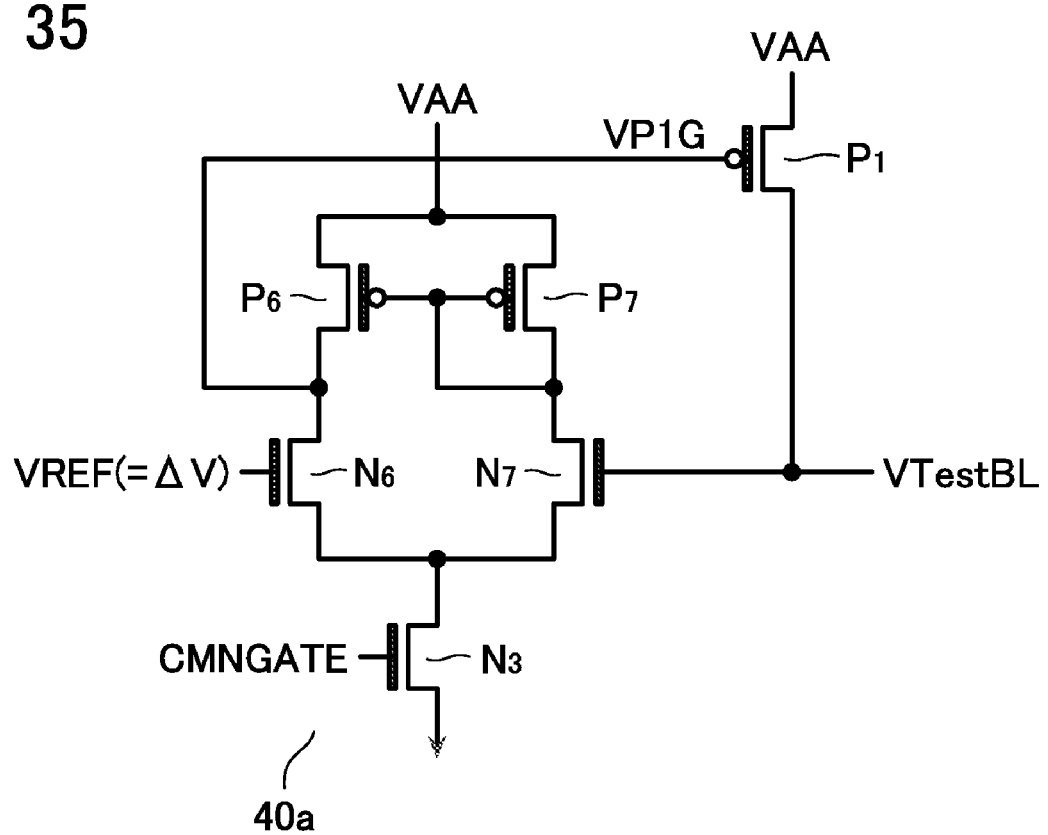

The ferroelectric memory for performing the test method in the third embodiment may have an entire configuration similar to that in the first embodiment (in FIG. 9 or the like) However, unlike the memory in the first embodiment, the memory in the third embodiment additionally includes a circuit for providing a voltage ΔV to the bit-line and a circuit for selecting the test word-lines TestWL0 and TestWL1. FIGS. 34 and 35 show example configurations of a circuit for selectively providing the voltage ΔV to the bit-line.

FIG. 34 is a circuit diagram of an example configuration of the circuit for selecting the test word-line TestWL0 or TestWL1. The voltage output circuit 60 includes a NAND gate 61, inverter row circuits 62 and 64, and n type MOS transistors 63 and 65. The NAND gate 61 receives an equalization signal /EQL, a control signal TestBL, and a row address selection signal Row. Add.<x>. The inverter row circuit 64 receives an equalization signal EQL. The input terminal of the inverter row circuit 62 connects to the output terminal of the NAND gate 61. The output terminal of the inverter row circuit 62 connects to the gate of the n type MOS transistor 63.

The source of the p type MOS transistor 63 is applied with the boosted voltage VPP. The drain of the transistor 63 connects to the test word-line TestWLx (x=0 or 1). Between the test word-line TestWL and the ground terminal is connected the n type MOS transistor 65. The gate of the n type MOS transistor 65 connects to the output terminal of the inverter row circuit 64.

FIG. 35 shows a configuration of a voltage generation circuit 40a for generating the voltage ΔV. The circuit 40a has a structure similar to that of the voltage generation circuit 40 in the first embodiment (FIG. 13). A detailed description of the circuit 40a is thus omitted here.

Figure 36:
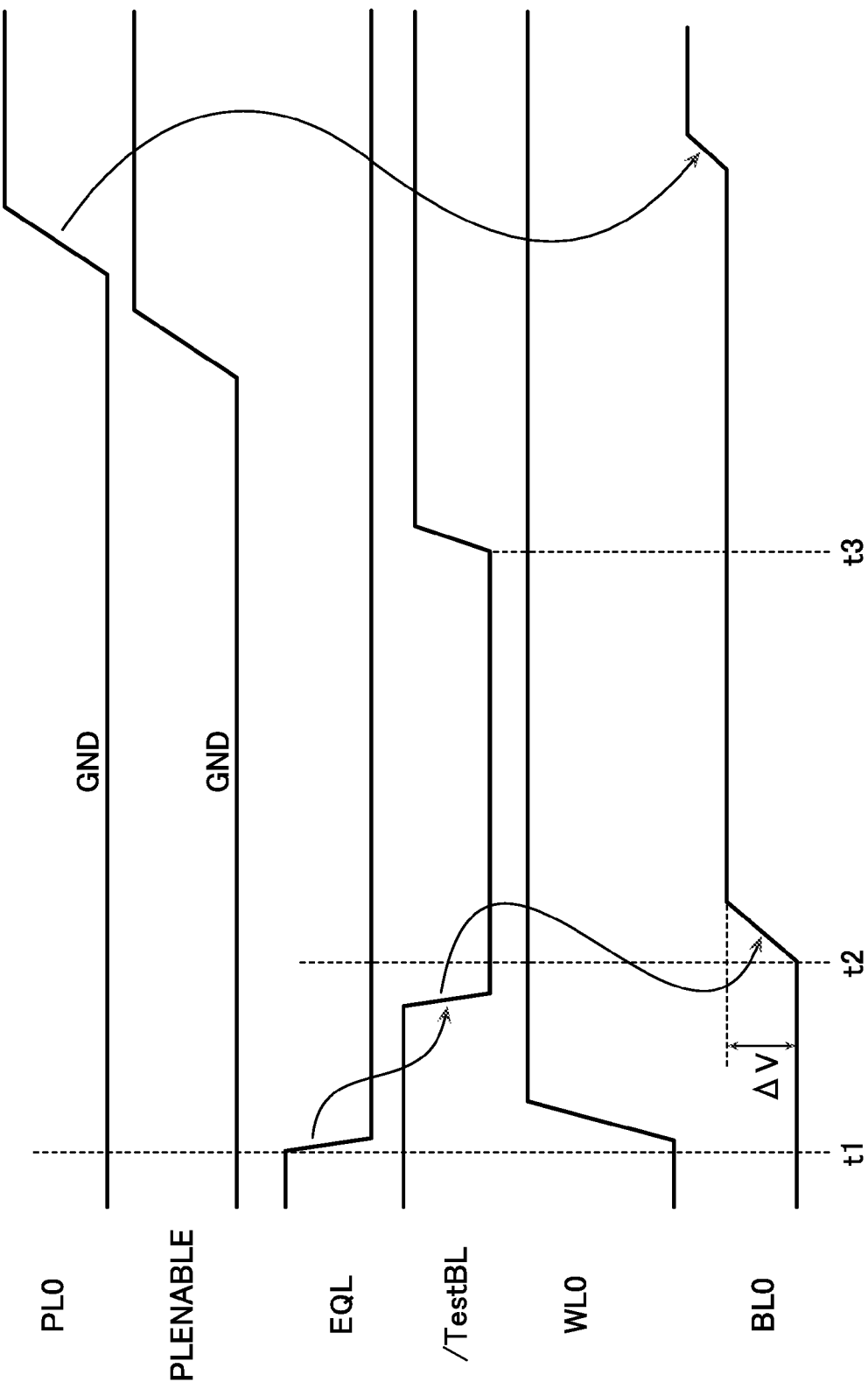
FIG. 36 shows a timing diagram of the operation in the test mode of the ferroelectric memory in the third embodiment.

With reference to the timing diagram in FIG. 36, a description is given of the specific operations in the test mode shown in FIG. 26 in the ferroelectric memory in the third embodiment. An example is considered here where in the memory cell array in FIG. 10B, the memory cell MC0 is selected and the test mode in FIG. 26 is performed.

After normal data write operation performs step (3-2) "writing the initial pattern data," the control signal PLENABLE is set to "L" (VSS) The plate-line PL0 is thus fixed to the ground potential (VSS (0 V)).

At time t1, the equalizing operation of the bit-line BL ends and the equalization signal EQL changes to "L" and the voltage of the word-line WL0 increases, thus selecting a cell in the row direction. Then, after the /TestBL decreases to "L," at time t2, the test word-line TestWL0, for example, is selected, thereby rendering the N channel type transistor Q4 (FIG. 11) conductive. The bit-line BL0 is thus supplied with the voltage ΔV.

Then, at time t3, the control signal /TestBL returns to "H," thereby stopping the application of the voltage ΔV. The bit-line BL0 is thus floated but remains at ΔV.

Then, the control signal PLENABLE changes from "L" to "H." The plate-line PL0 is charged to a voltage of VPL, accordingly, Thus, step (3-5) is performed. The voltage of the bit-line BL thus increases to a voltage according to data held in the memory cell MC0. The increased voltage is sensed and amplified by the sense amplifier circuit S/A to read the initial pattern data ((step (3-6)). Steps (3-8) to (3-12) may be performed similarly to the above steps.

Fourth Embodiment

A ferroelectric memory according to a fourth embodiment of the present invention and a method for testing the same will be described referring to the drawings. The first to third embodiments describe the test only for the imprint. This embodiment relates to, however, a testing method and a memory configuration therefor that reproduce a state similar to that in which the imprint as well as the depolarization occur.

Figure 37:
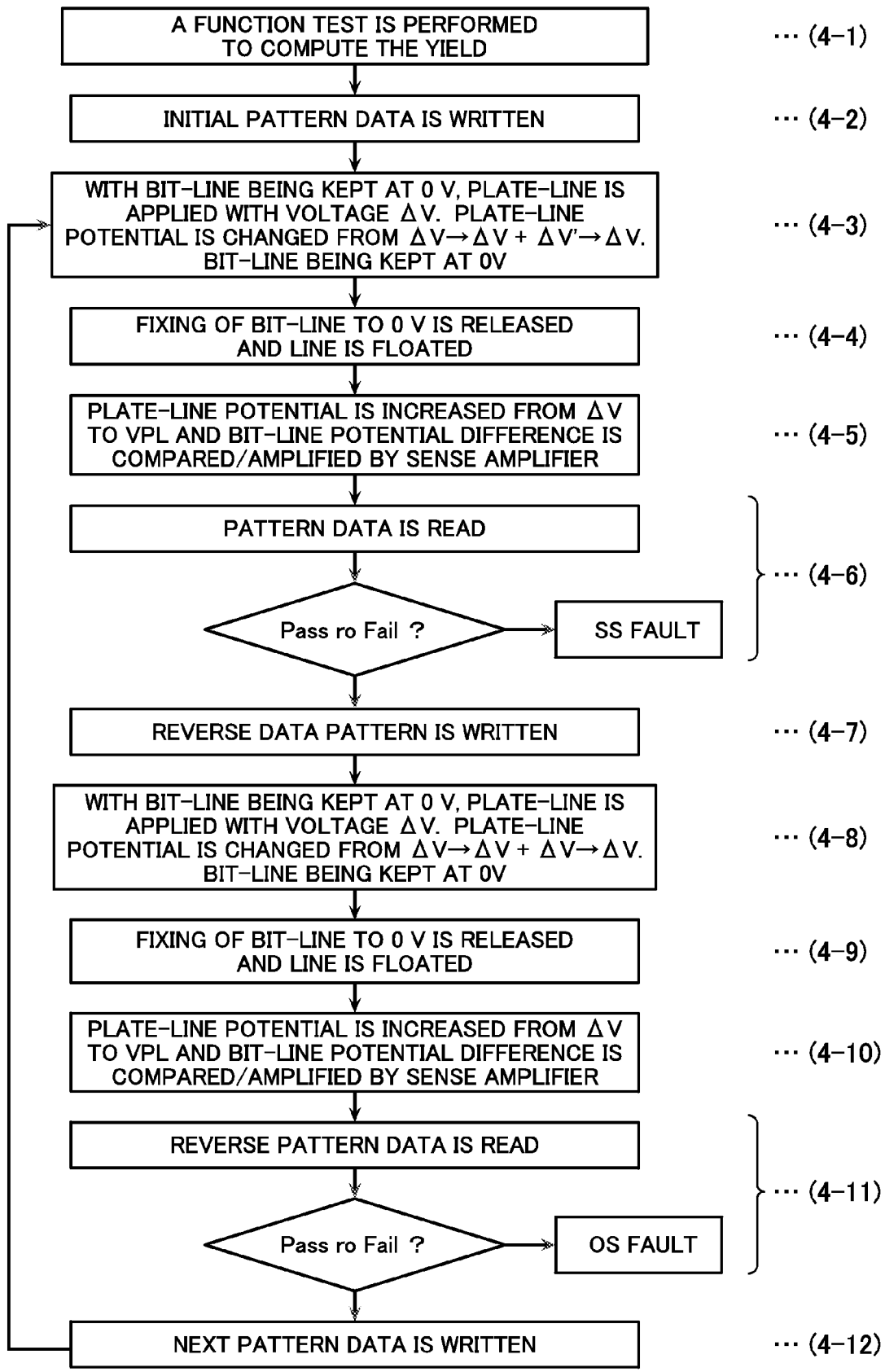
FIG. 37 shows a flowchart of the procedure for the test method according to a fourth embodiment of the present invention.

The test method in the fourth embodiment is performed according to the following procedure as shown in the flowchart in FIG. 37.

(4-1) A function test is performed to compute the yield.

(4-2) According to normal data write operation, a write voltage is applied across the electrodes of the ferroelectric capacitor to write the initial pattern data.

(4-3) A certain voltage is applied across the electrodes of the ferroelectric capacitor. Specifically, the plate-line is applied with a certain voltage ΔV, and increased to ΔV+ΔV' (ΔV'<ΔV) for a short period of time, and returned to ΔV. During this operation, the bit-line is fixed to 0 V (ground potential)

(4-4) The bit-line is released from being fixed to 0 V and is floated.

(4-5) The plate-line potential is increased from ΔV to the plate-line potential VPL used in normal operation. The potential difference between the bit-line pair is then compared/amplified by the sense amplifier.

(4-6) The initial pattern data is read to compute the SS yield (Same State Yield).

(4-7) The initial pattern data is reversed and the reverse data pattern is written.

(4-8) A certain voltage is applied across the electrodes of the ferroelectric capacitor. Specifically, the plate-line is applied with a certain voltage ΔV, increased to ΔV+ΔV' (ΔV'<ΔV) for a short period of time, and returned to ΔV. During this operation, the bit-line is kept at 0 V.

(4-9) The bit-line is released from being fixed to 0 V and is floated.

(4-10) The plate-line potential is increased from ΔV to VPL used in normal operation. The potential difference between the bit-line pair is then compared/amplified by the sense amplifier.

(4-11) The reverse data pattern is read to compute the OS yield (Opposite State Yield).

(4-12) The next pattern data is written.

Steps (4-3) to (4-5) may reproduce, in a short time, and without the bake process, the state in which the ferroelectric capacitor has the imprint and the depolarization occurs.

The ferroelectric capacitor may thus be provided with polarization equal to polarization after the imprint and depolarization. The polarization data after imprint and depolarization may substantially thus be tested without the actual imprint or depolarization.

This will be described in more detail referring to FIGS. 38 to 46. Note that generally the depolarization significantly occurs at a steep slope of the hysteresis characteristic curve. It is therefore assumed here that the depolarization occurs with respect to the "1" cell.

Figure 38:
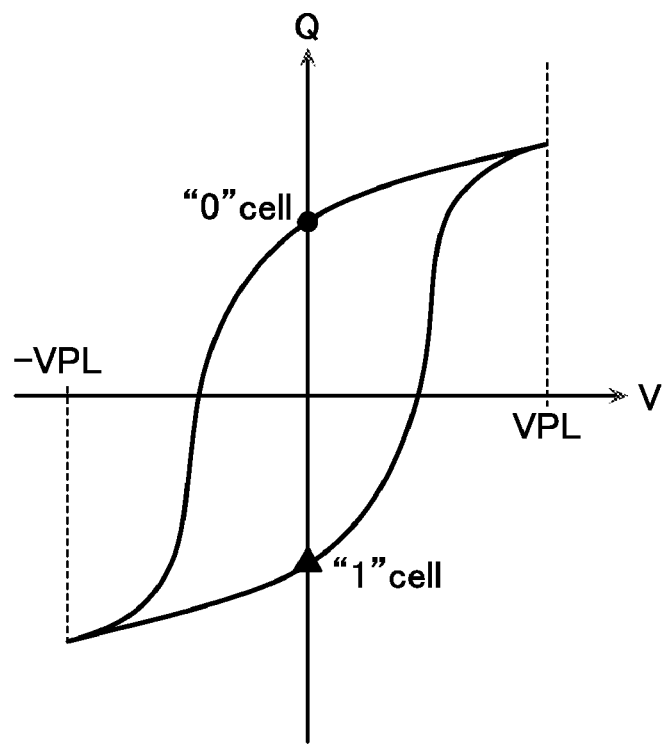
FIGS. 38 to 46 show hysteresis characteristic curves of a ferroelectric capacitor, which illustrate the operation of the test method in the fourth embodiment.

FIG. 38 shows a hysteresis characteristic curve of the ferroelectric capacitor after step (4-2), i.e., immediately after the initial pattern is written in the test procedure in this embodiment in FIG. 37. This curve is similar to that in the first embodiment (FIG. 2).

Figure 39:
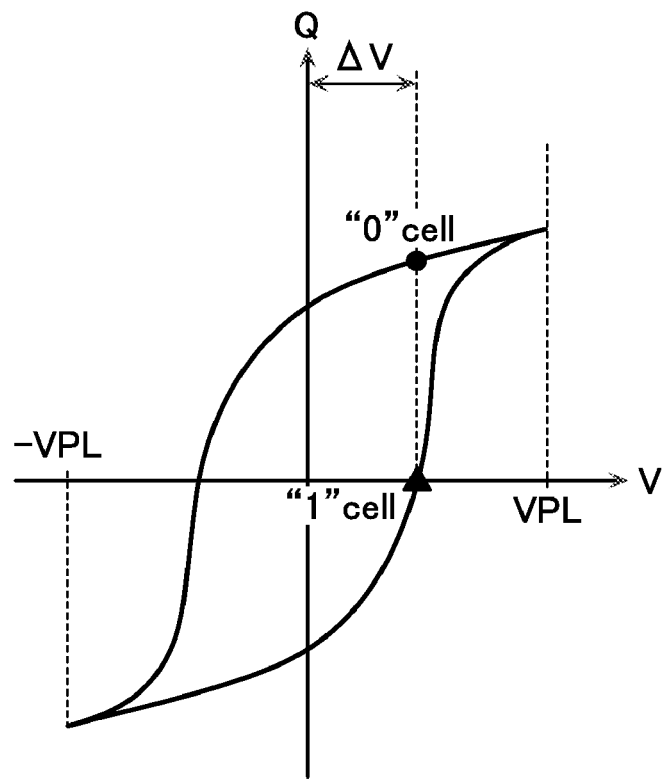

Then, with reference to FIG. 39, step (4-3)(a certain voltage is applied across the electrodes of the ferroelectric capacitor: the plate-line voltage at ΔV, the bit-line voltage at 0 V) moves the polarization of the "0" cell and the "1" cell to the respective positions on the hysteresis characteristic curve as shown in FIG. 39. A polarization state is thus generated that is generally the same as during the actual imprint.

Then, to provide the depolarization effect, the plate-line voltage is increased from ΔV to ΔV+ΔV' for a short period of time, and then returned to ΔV. This moves the polarization of the "1" cell and the "0" cell to the respective positions in FIG. 40. During this operation, the bit-line potential is kept at 0 V.

In step (4-4), The bit-line is released from being fixed to 0 V and is floated. Then in step (4-5), the plate-line potential is increased from ΔV to VPL, thereby moving the polarization to the respective positions on the hysteresis characteristic curve in FIG. 41. Finally, the comparison/amplification by the sense amplifier moves the polarization to the respective positions on the hysteresis characteristic curve in FIG. 42.

With reference to the hysteresis characteristic curves in FIGS. 43 to 46, a description is given of the read operation when the actual imprint shifts the hysteresis characteristic curve and the depolarization reduces the signal. As described above, generally the depolarization significantly occurs at a steep slope of the hysteresis characteristic curve. It is therefore assumed here again that the depolarization occurs with respect to the "1" cell.

Figure 43:
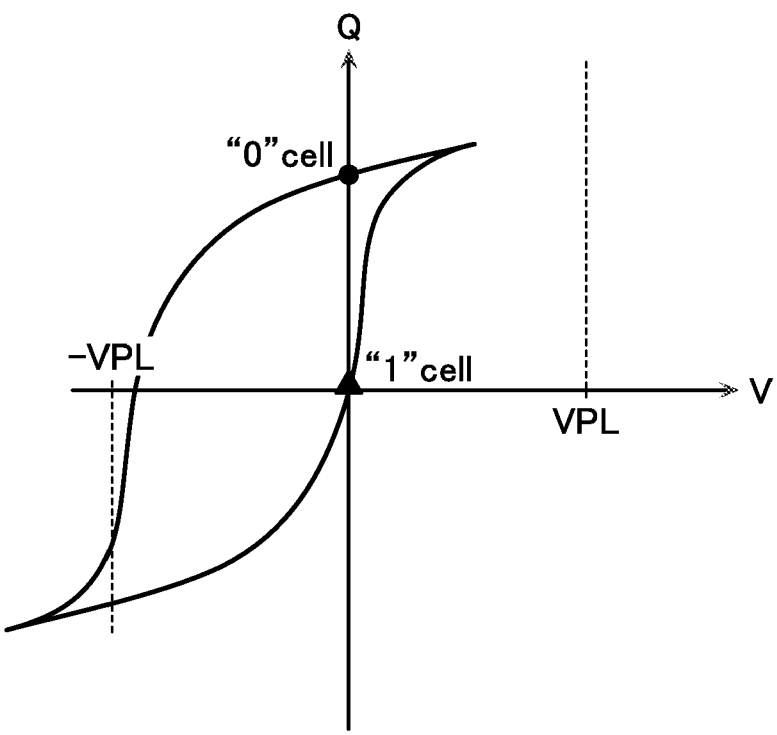
Figure 44:
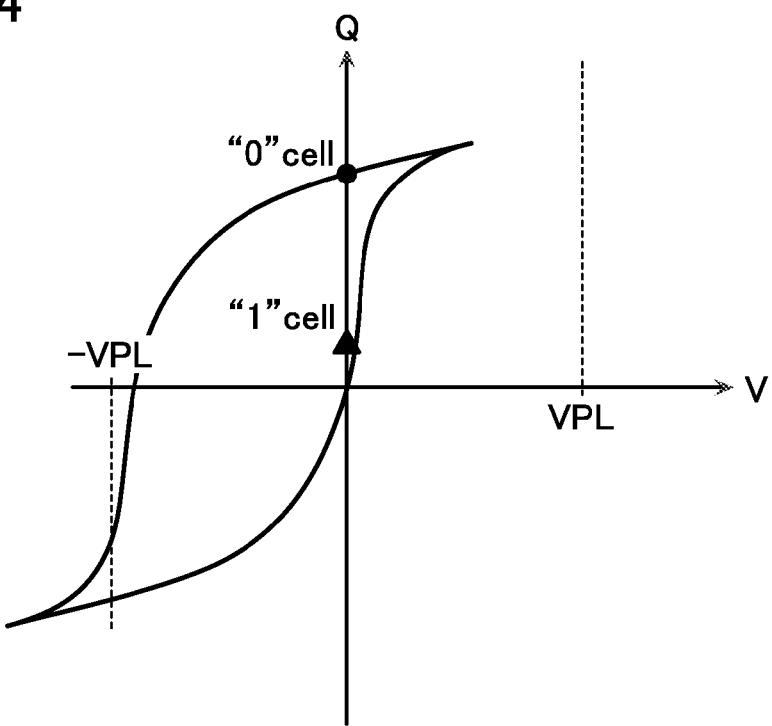
Figure 45:
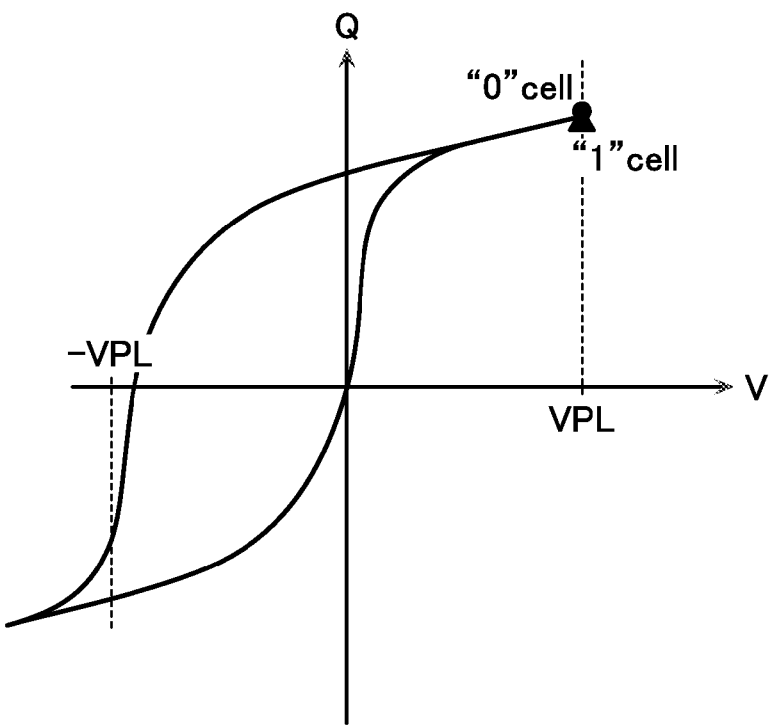
Figure 46:
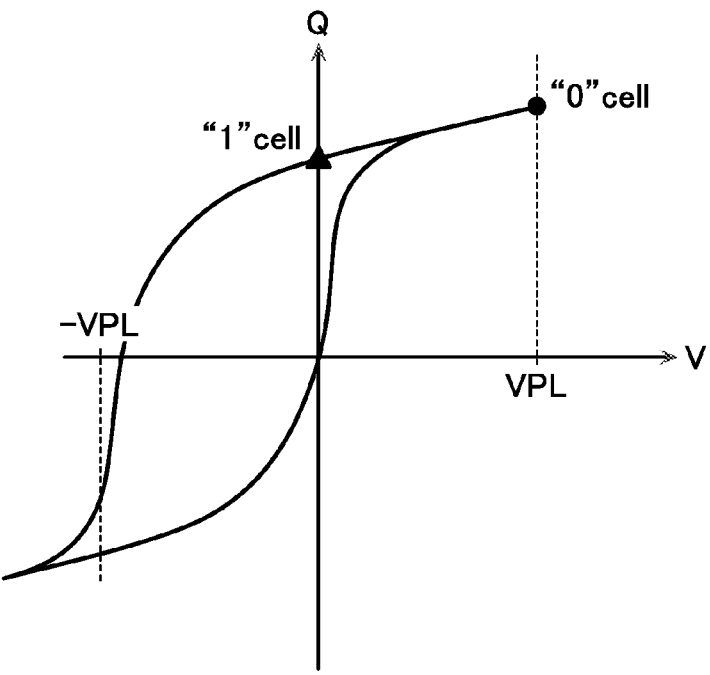

FIG. 43 shows the hysteresis characteristic curve immediately after the initial data pattern is written as in step (4-2) of the test method in FIG. 37. The imprint has occurred as the movement of the hysteresis characteristic curve in the negative direction of the x-axis. The residual polarization has thus decreased without a potential difference applied across the cell electrodes. After waiting for a while after the data write, the depolarization further decreases the polarization as shown in FIG. 44. Then, with the bit-line being floated, the plate-line potential is increased to VPL, thereby reading out the signal charge to the bit-line (FIG. 45). Finally, the sensing and amplification by the sense amplifier fix "H" and "L" of the bit-line pair (FIG. 46).

Figure 40:
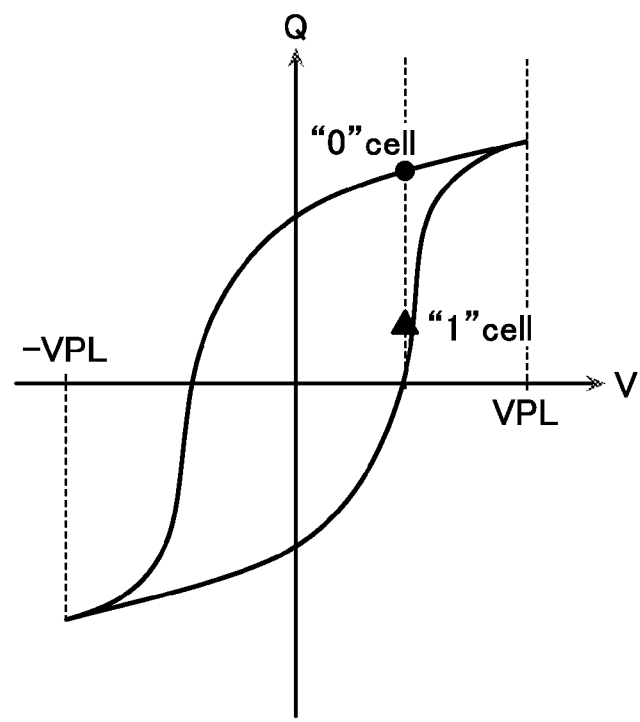
Figure 41:
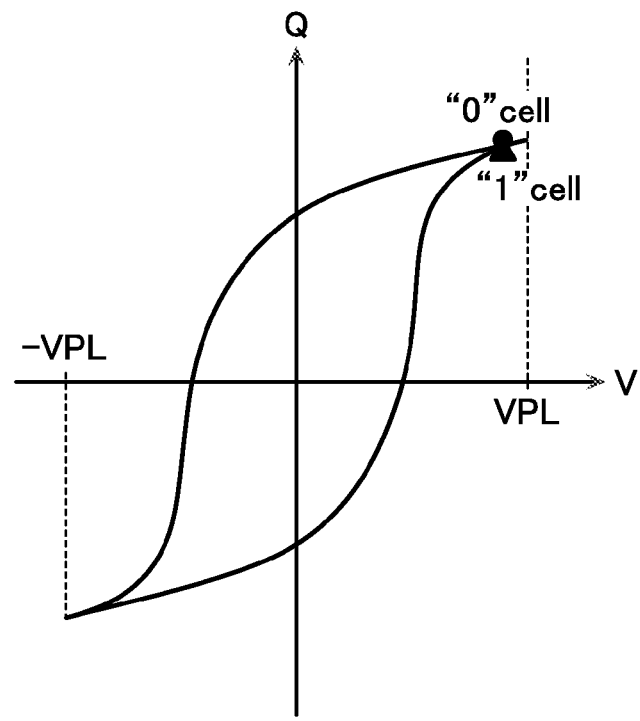
Figure 42:
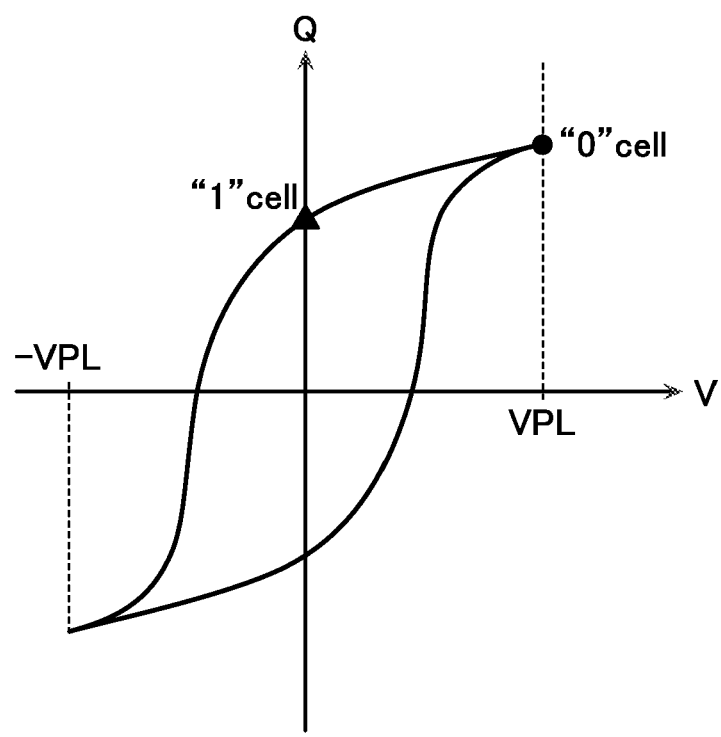

Now, comparison between the test in this embodiment (FIGS. 38 to 42) and the case of the actual imprint and depolarization (FIGS. 43 to 46) shows that the voltage applied across the electrodes of the ferroelectric capacitor is not completely the same between the movement from FIGS. 40 to 41 and the movement from FIGS. 44 to 45. Therefore, a state after the actual imprint is not perfectly reproduced.

Because, however, the positions in FIG. 41 are close to the saturation region, the signal charge read out to the bit-line is almost the same between during the voltage change from ΔV to VPL in step (4-5) and during the voltage change from 0 to VPL. The above test method may thus be considered to generally reproduce the actual imprint operation.

This embodiment may thus evaluate the effects of the imprint and depolarization without imposing a burden on the circuits to generate the additional potential of ΔV+VPL only for the test mode. Note that the effects of steps (4-8) to (4-10) to reverse pattern data (step (4-7)) are similar to those in steps (4-3) to (4-5). A detailed description of steps (4-8) to (4-10) is thus omitted here.

Figure 47:
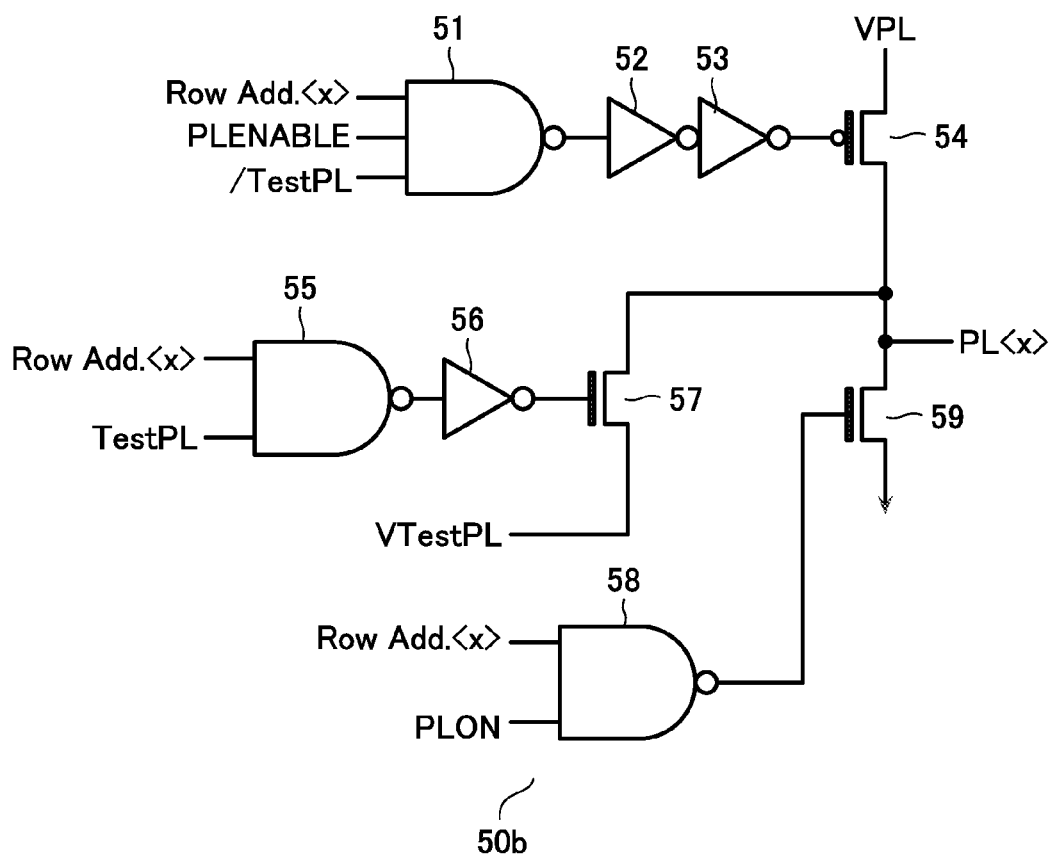
FIGS. 47, 48, and 49 show circuit diagrams of portions of the configuration of a ferroelectric memory capable of performing the test method in the fourth embodiment.

The ferroelectric memory for performing the test method in the fourth embodiment may have a similar configuration to that in the first embodiment. Note, however, that the voltage output circuit 50 may be replaced with a voltage output circuit 50b in FIG. 47. Except that a different voltage VTestPL is applied to the drain of the n type MOS transistor 57, the voltage output circuit 50b is similar to the voltage output circuit 50 (like elements are designated with like reference numerals).

Figure 48:
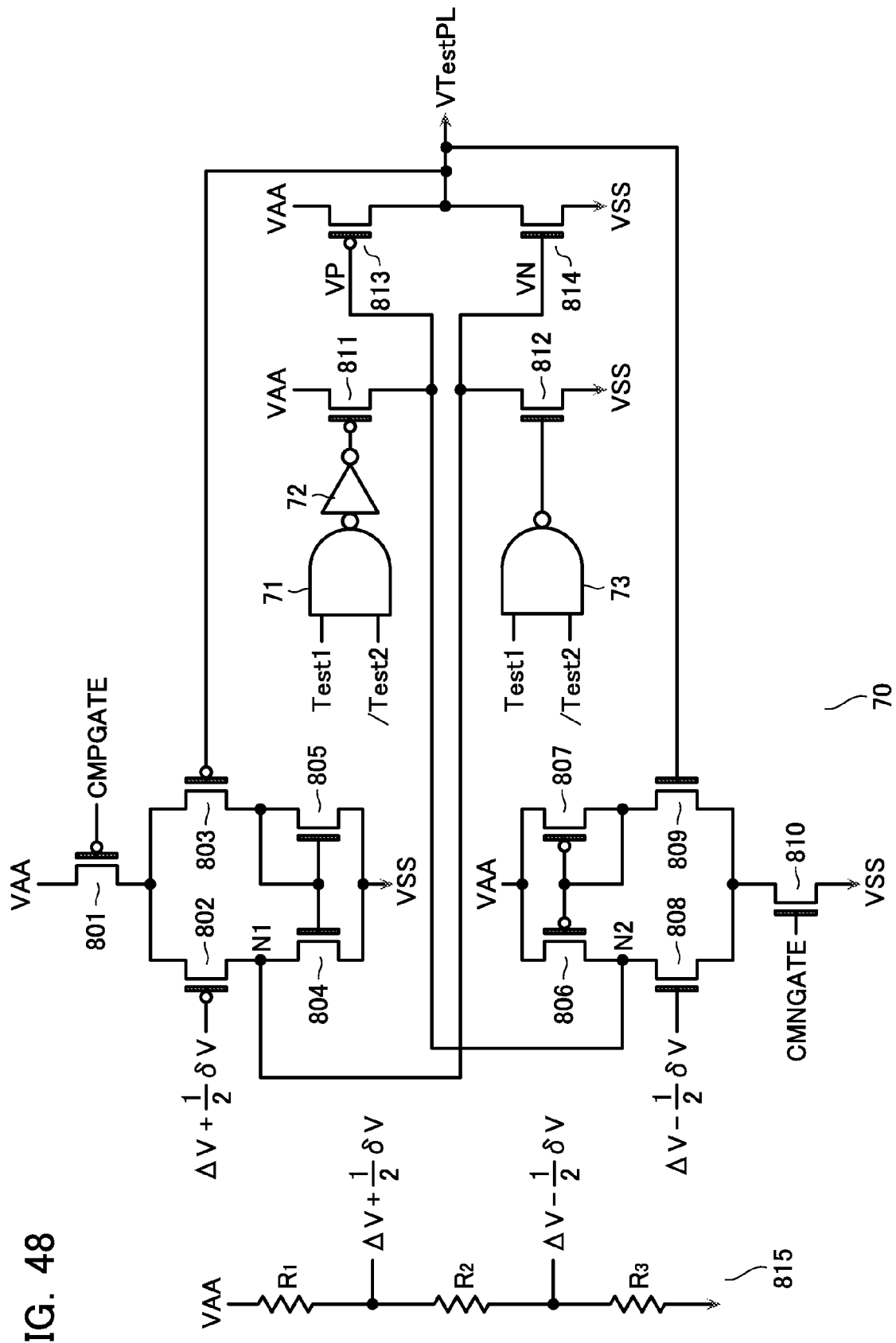

With reference to FIG. 48, the circuitry of a voltage generation circuit 70 for generating the voltage VTestPL for the voltage output circuit 50b will be described.

In FIG. 48, the voltage generation circuit 70 includes p type MOS transistors 801, 802, and 803, and n type MOS transistors 804 and 805. The transistors 801 to 805 make up one differential amplification circuit.

The source of the p type MOS transistor 801 is applied with an array power supply voltage VAA. The gate of the transistor 801 is applied with a control potential CMPGATE to control the current flow through the differential amplification circuit. The p type MOS transistors 802 and 803 have their sources connected to form a common source connected to the drain of the p type MOS transistor 801. The gate of the p type MOS transistor 802 is supplied with a constant voltage ΔV+δV/2. The gate of the p type MOS transistor 803 serves as an output terminal of the output voltage VTestPL.

The drains of the n type MOS transistors 804 and 805 connect to the drains of the p type MOS transistors 802 and 803, respectively. The n type MOS transistors 804 and 805 have their gates connected to form a common gate. The drain and gate of the n type MOS transistor 805 are short-circuited. The sources of the n type MOS transistors 804 and 805 are connected to the ground potential VSS. The potential VN at the connection node N1 between the transistors 802 and 804 is supplied to the gate of an n type transistor 814 as described below.

The voltage generation circuit 70 includes p type MOS transistors 806 and 807 and n type MOS transistors 808, 809, and 810. These transistors together make up another differential amplification circuit. The p type MOS transistors 806 and 807 have their sources connected to form a common source and have their gates connected to form a common gate (the source is supplied with the array power supply voltage VAA). The common gate is short-circuited to the drain of the p type MOS transistor 807.

The drains of the n type MOS transistor 808 and 809 connect to the drains of the p type MOS transistors 806 and 807, respectively. The sources of the transistors 808 and 809 connect to the drain of the n type MOS transistor 810. The source of the n type MOS transistor 810 is applied with the ground potential VSS. The gate of the n type MOS transistor 810 is applied with a control potential CMNGATE to control the current flow through the differential amplification circuit.

The gate of the n type MOS transistor 808 is applied with a constant voltage $\Delta V-\delta V/2$. The gate of the n type MOS transistor 809 serves as an output terminal of the output voltage VTestPL. The potential VP at the connection node N2 between the transistors 806 and 808 is supplied to the gate of a p type transistor 813 as described below.

The node N2 connects to the drain of a p type MOS transistor 811. The source of the transistor 811 is connected to the array power supply voltage VAA. The gate of the transistor 811 connects to the output terminal of an AND logic circuit, the circuit including a NAND gate 71 and an inverter 72. The input terminals of the NAND gate 71 receive a test control signal Test1 and a test control signal /Test2, respectively.

The node N1 connects to the drain of an n type MOS transistor 812. The source of the transistor 812 is connected to the ground potential VSS. The gate of the transistor 812 connects to the output terminal of a NAND gate 73. The input terminals of the NAND gate 73 receive the test control signal Test1 and the test control signal /Test2, respectively.

The p type MOS transistor 813 and the n type MOS transistor 814 are connected in series between the array power supply voltage VAA and the ground potential VSS. The connection node between the transistors 813 and 814 outputs the output voltage VTestPL.

Note that the voltage $\Delta V+\delta V/2$ and $\Delta V+-\delta V/2$ may be generated from the array power supply voltage VAA divided by a divider resistor 815 as shown in the left side in FIG. 48, for example.

In this configuration, by setting the test control signal Test1 to "H" and the /Test2 to "H," the voltage generation circuit 70 will operate as follows. When the output voltage VTestPL exceeds $\Delta V+\delta V/2$, the differential amplification circuit including the transistors 801 to 805 turns ON the transistor 814, thereby reducing the output voltage VTestPL.

When the output voltage VTestPL falls below $\Delta V-\delta V/2$, the differential amplification circuit including the transistors 806 to 810 turns ON the transistor 813, thereby increasing the output voltage VTestPL. The circuit 70 may keep, therefore, the output voltage VTestPL between $\Delta V-\delta V/2$ and $\Delta V+\delta V/2$. A sufficiently small $\delta V$ may thus substantially stabilize the output voltage VTestPL near $\Delta V$.

Figure 49:
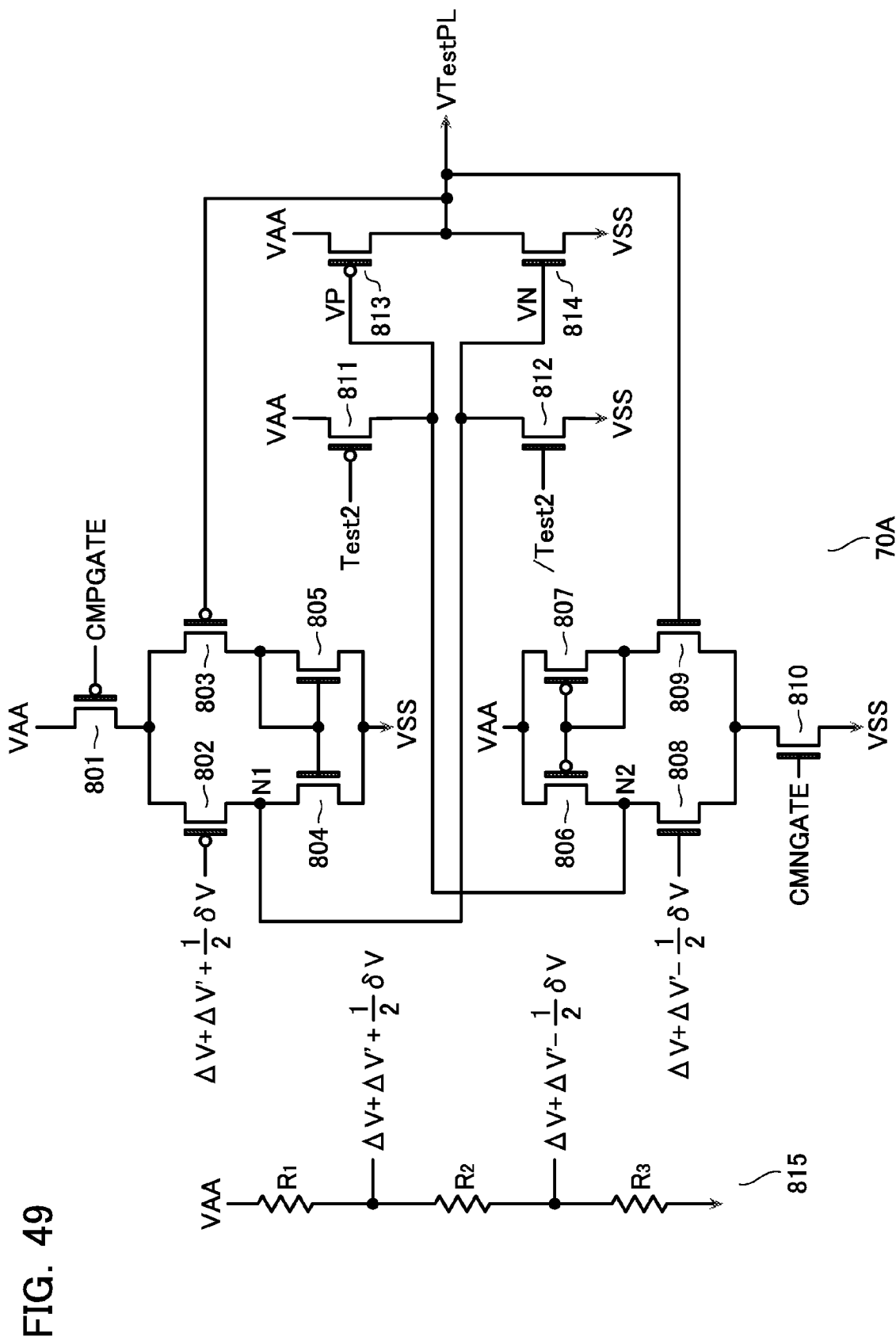

With reference to FIG. 49, a voltage generation circuit that generates a voltage $\Delta V+\Delta V'$ as the output voltage VTestPL will be described. In FIG. 49, a voltage generation circuit 70A includes p type MOS transistors 801, 802, and 803, and n type MOS transistors 804 and 805. The transistors 801 to 805 make up one differential amplification circuit.

The source of the p type MOS transistor 801 is applied with an array power supply voltage VAA. The gate of the transistor 801 is applied with a control potential CMPGATE to control the current flow through the differential amplification circuit. The p type MOS transistors 802 and 803 have their sources connected to form a common source connected to the drain of the p type MOS transistor 801.

The gate of the p type MOS transistor 802 is supplied with a constant voltage $\Delta V+\Delta V'+\delta V/2$. The gate of the p type MOS transistor 803 serves as an output terminal of the output voltage VTestPL.

The drains of the n type MOS transistors 804 and 805 connect to the drains of the p type MOS transistors 802 and 803, respectively. The n type MOS transistors 804 and 805 have their gates connected to form a common gate. The drain and gate of the n type MOS transistor 805 are short-circuited.

The sources of the n type MOS transistors 804 and 805 are connected to the ground potential VSS. The potential VN of the connection node N1 between the transistors 802 and 804 is supplied to the gate of the n type transistor 814 as described below.

The voltage generation circuit 70A includes p type MOS transistors 806 and 807, and n type MOS transistors 808, 809, and 810. These transistors together make up another differential amplification circuit. The p type MOS transistors 806 and 807 have their sources connected to form a common source and have their gates connected to form a common gate (the source is supplied with the array power supply voltage VAA). The common gate is short-circuited to the drain of the p type MOS transistor 807.

The drains of the n type MOS transistors 808 and 809 connect to the drains of the p type MOS transistors 806 and 807, respectively. The sources of the transistors 808 and 809 connect to the drain of the n type MOS transistor 810. The source of the n type MOS transistor 810 is applied with the ground potential VSS. The gate of the n type MOS transistor 810 is applied with the control potential CMNGATE to control the current flow through the differential amplification circuit.

The gate of the n type MOS transistor 808 is applied with a constant voltage $\Delta V+\Delta V'-\delta V/2$. The gate of the n type MOS transistor 809 serves as an output terminal of the output voltage VTestPL. The potential VP at the connection node N2 between the transistors 806 and 808 is supplied to the gate of the p type transistor 813 as described below.

The node N2 connects to the drain of the p type MOS transistor 811. The source of the transistor 811 is connected to the array power supply voltage VAA. The gate of the transistor 811 receives a test control signal Test2.

The node N1 connects to the drain of the n type MOS transistor 812. The source of the transistor 812 is connected to the ground potential VSS. The gate of the transistor 812 receives the test control signal /Test2.

The p type MOS transistor 813 and the n type MOS transistor 814 are connected in series between the array power supply voltage VAA and the ground potential VSS. The connection node between the transistors 813 and 814 outputs the output voltage VTestPL.

Note that the voltage $\Delta V+\Delta V'+\delta V/2$ and $\Delta V+\Delta V'-\delta V/2$ may be generated from the array power supply voltage VAA divided by a divider resistor 815 as shown in the left side in FIG. 49, for example.

In this configuration, by setting the test control signal Test2 to "H," the voltage generation circuit 70A will operate as follows. When the output voltage VTestPL exceeds $\Delta V+\Delta V'+\delta V/2$, the differential amplification circuit including the transistors 801 to 805 turns ON the transistor 814, thereby reducing the output voltage VTestPL.

When the output voltage VTestPL falls below $\Delta V+\Delta V'-\delta V/2$, the differential amplification circuit including the transistors 806 to 810 turns ON the transistor 813, thereby increasing the output voltage VTestPL. The circuit 70A may keep, therefore, the output voltage VTestPL between $\Delta V+\Delta V'-\delta V/2$ and $\Delta V+\Delta V'+\delta V/2$. A sufficiently small $\delta V$ may thus substantially stabilize the output voltage VTestPL near $\Delta V+\Delta V'$.

Figure 50:
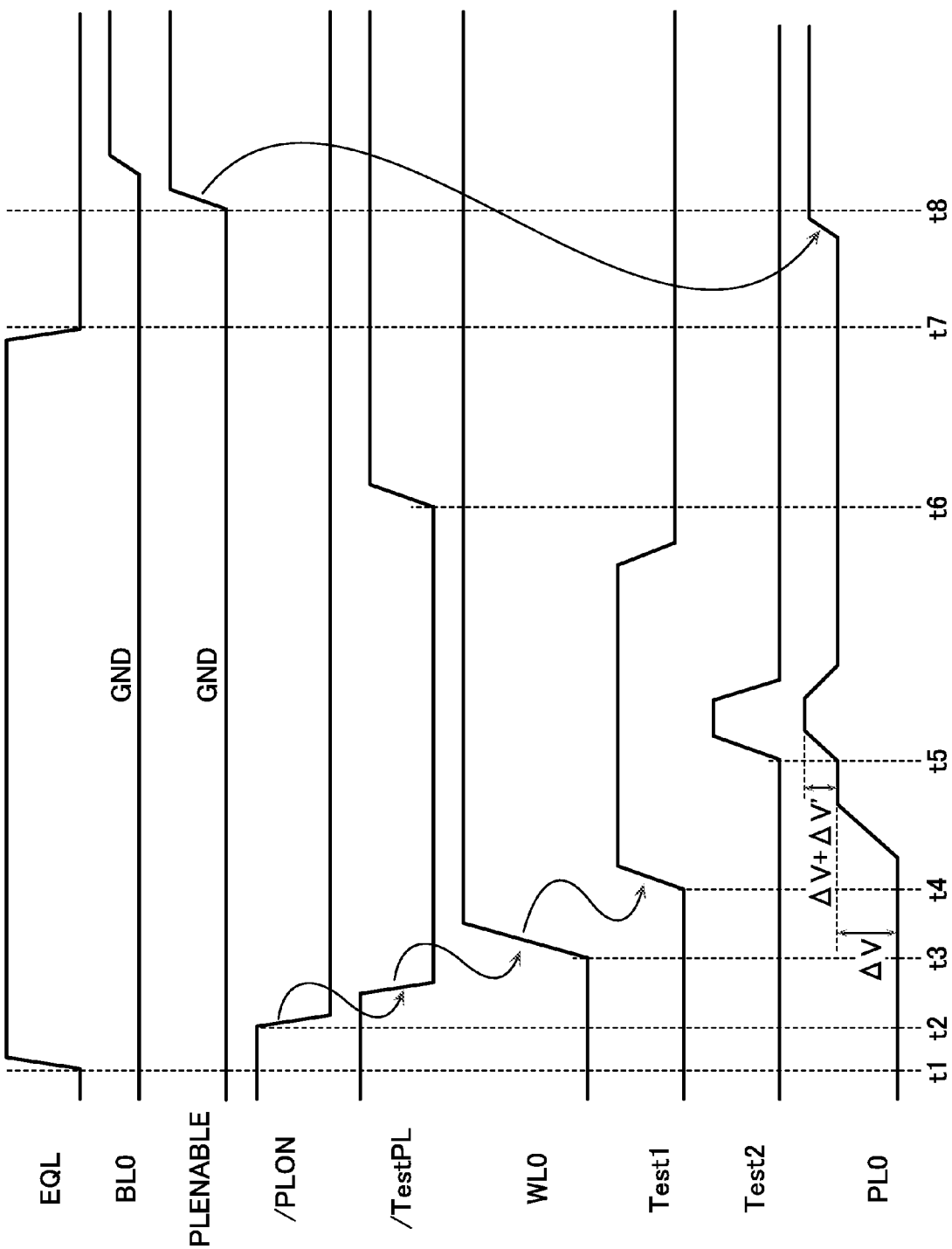
FIG. 50 shows a timing diagram of the operation in the test mode of the ferroelectric memory in the fourth embodiment.

With reference to the timing diagram in FIG. 50, a description is given of the specific operations in the test mode shown in FIG. 37 in the ferroelectric memory. An example is considered here where in the memory cell array in FIG. 10B, the memory cell MC0 is selected and the test mode in FIG. 37 is performed.

After normal data write operation performs step (4-2) "writing the initial pattern data," the bit-line BL0 is fixed to the ground potential (VSS (0 V)) by setting the equalization signal EQL to "H" in the precharge circuit 21 at time t1.

The control signal PLENABLE is kept at "L" (GND). The plate-line PL0 is thus not driven in normal operation. Then, the control signal /PLON is decreased to "L" at time t2. The control signal /TestPL is then decreased to "L."

Then, at time t3, the row address Row Add.<0> corresponding to the word-line WL0 is selected. The word-line WL0 is thus stepped up to the boosted voltage VPP, thereby rendering the transistor T in the memory cell MC0 conductive. The memory cell MC0 is thus selected. Then, at time t4, only the test control signal Test1 is raised, thereby charging the plate-line PL0 to the voltage $\Delta V$.

Then, at time t5, the test control signal TEST2 rises for a short period of time, during which the plate-line PL0 increases from $\Delta V$ to $\Delta V+\Delta V'$ and then returns to $\Delta V$. The step (4-3) is thus performed.

Then, at time t6, the control signal /TestPL returns from "L" to "H." Then, at time t7, the equalization signal EQL is set to "L." The bit-line BL0 is thus floated. The step (4-4) is thus performed.

Then, at time t8, the control signal PRENABLE changes to "H." The voltage of the plate-line PL0 thus increases from $\Delta V$ to VPL. Specifically, like normal data read operation, the step (4-5) is performed.

The voltage of the bit-line BL is thus increased to a voltage corresponding to data held in the memory cell MC0 (the voltage is generally the same as the voltage during the actual imprint). The voltage is sensed and amplified by the sense amplifier circuit S/A to read the initial pattern data. The steps (4-8) to (4-12) may be performed similarly to the above steps.

Fifth Embodiment

A ferroelectric memory according to a fifth embodiment of the present invention and a method for testing the same will be described referring to the drawings.

Like the fourth embodiment, this embodiment relates to a testing method and a memory configuration therefor that reproduce a state similar to that in which the imprint as well as the depolarization occur. Note, however, that unlike the fourth embodiment, the positive voltage $\Delta V$ to $\Delta V+\Delta V'$ is not applied, but the negative voltage $-\Delta V$ to $-\Delta V-\Delta V'$ is applied to the plate-line (as in the second embodiment).

Figure 51:
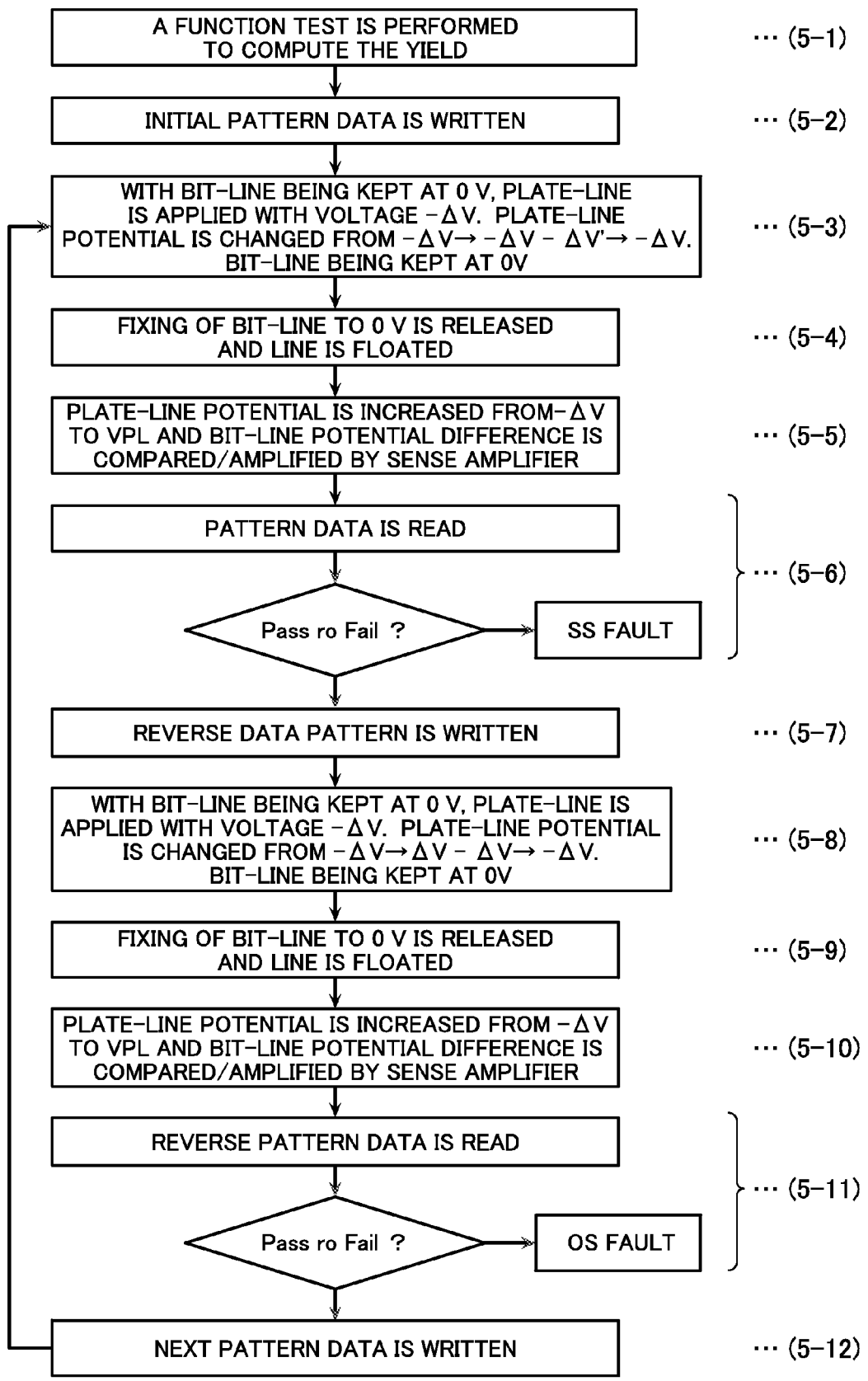
FIG. 51 shows a flowchart of the procedure for the test method according to a fifth embodiment of the present invention.

The test method in the fifth embodiment is performed according to the following procedure as shown in the flowchart in FIG. 51.

(5-1) A function test is performed to compute the yield.

(5-2) According to normal data write operation, a write voltage is applied across the electrodes of the ferroelectric capacitor to write initial pattern data.

(5-3) A certain voltage is applied across the electrodes of the ferroelectric capacitor. Specifically, the plate-line is applied with a voltage of a certain absolute value $-\Delta V$, and set to $-\Delta V-\Delta V'$ ($\Delta V'<\Delta V$) for a short period of time, and returned to $-\Delta V$. During this operation, the bit-line is fixed to 0 V (ground potential).

(5-4) The bit-line is released from being fixed to 0 V and is floated.

(5-5) The plate-line potential is increased from $-\Delta V$ to the plate-line potential VPL used in normal operation. The potential difference between the bit-line pair is then compared/amplified by the sense amplifier.

(5-6) The initial pattern data is read to compute the SS yield (Same State Yield).

(5-7) The initial pattern data is reversed and the reverse data pattern is written, (5-8) A voltage of a certain absolute value is applied across the electrodes of the ferroelectric capacitor. Specifically, the plate-line is applied with a voltage of a certain absolute value $-\Delta V$, and set to $-\Delta V-\Delta V'$ ($\Delta V'<\Delta V$) for a short period of time, and returned to $-\Delta V$. During this operation, the bit-line is kept to 0 V.

(5-9) The bit-line is released from being fixed to 0 V and is floated.

(5-10) The plate-line potential is increased from $-\Delta V$ to VPL used in normal operation. The potential difference between the bit-line pair is then compared/amplified by the sense amplifier.

(5-11) The reverse data pattern is read to compute the OS yield (Opposite State Yield)

(5-12) The next pattern data is written.

Steps (5-3) to (5-5) may provide, in a short time, and without the bake process, the ferroelectric capacitor with polarization that is equal to that when the ferroelectric capacitor is in an imprint state, and also reproduce the depolarization state. Polarization data after imprint may substantially thus be provided. The ferroelectric capacitor may thus be provided with polarization equal to polarization after the imprint and depolarization. The polarization data after imprint and depolarization may thus be tested without the actual imprint or depolarization.

This will be described in more detail referring to FIGS. 52 to 60. As described above, generally the depolarization significantly occurs at a steep slope of the hysteresis characteristic curve. It is therefore assumed here that the depolarization occurs with respect to the "0" cell.

Figure 52:
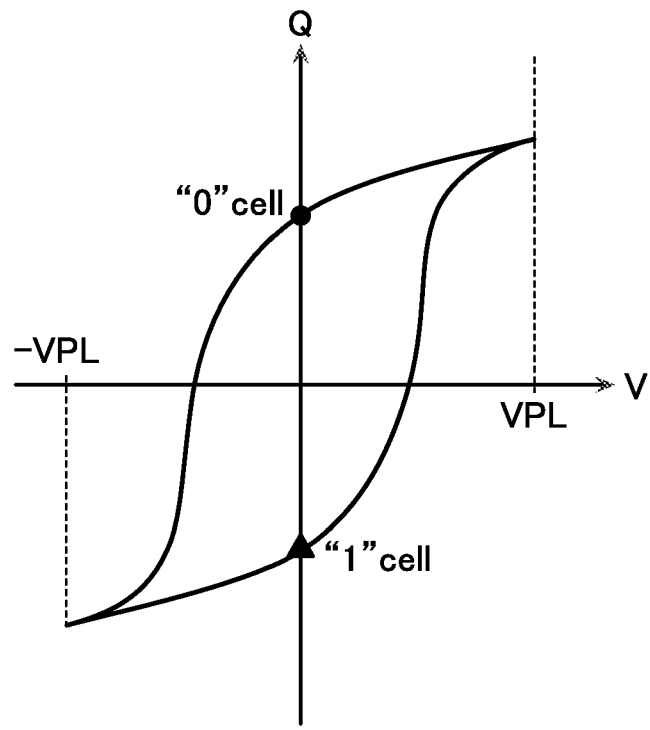
FIGS. 52 to 60 show hysteresis characteristic curves of a ferroelectric capacitor, which illustrate the operation of the test method in the fifth embodiment.

FIG. 52 shows a hysteresis characteristic curve of the ferroelectric capacitor after step (5-2), i.e., immediately after the initial pattern is written in the test procedure in this embodiment in FIG. 51. This curve is similar to that in the first embodiment (FIG. 2).

Figure 53:
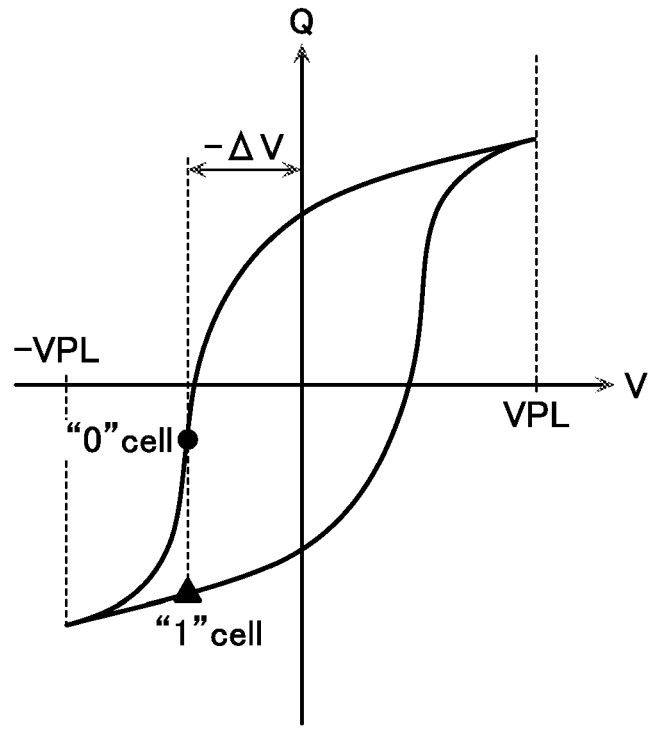
Figure 54:
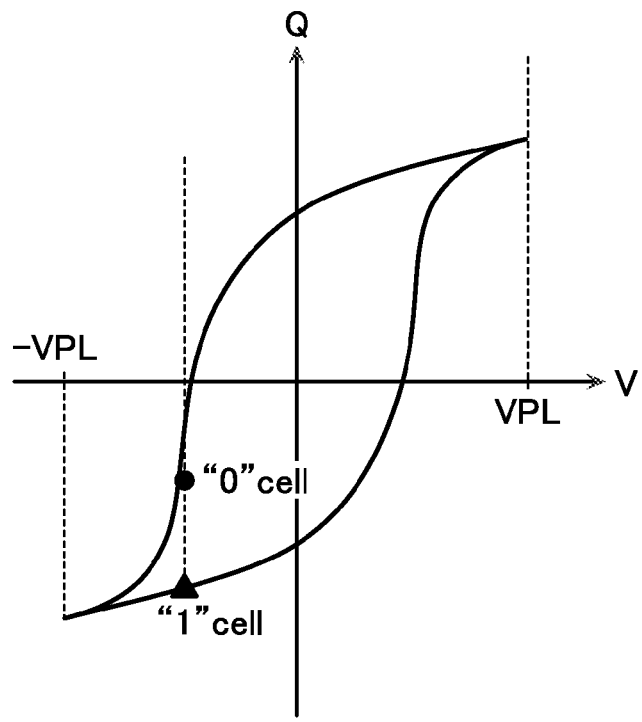
Figure 55:
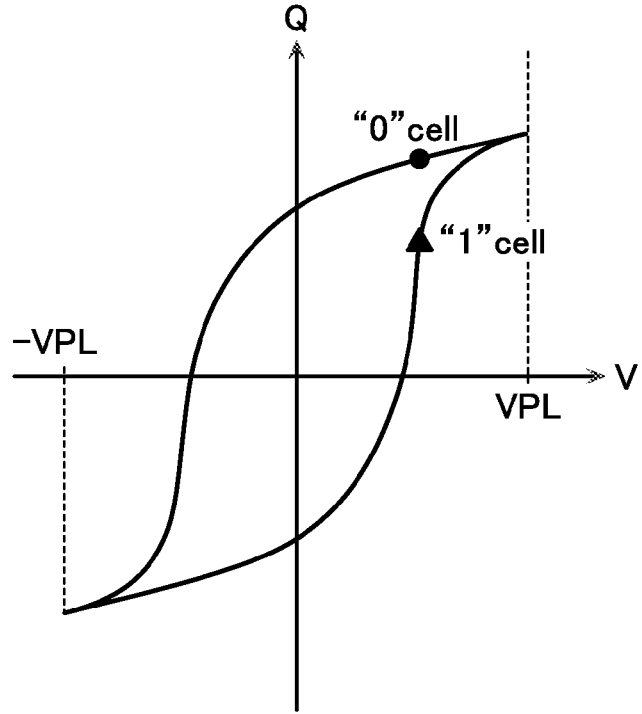
Figure 56:
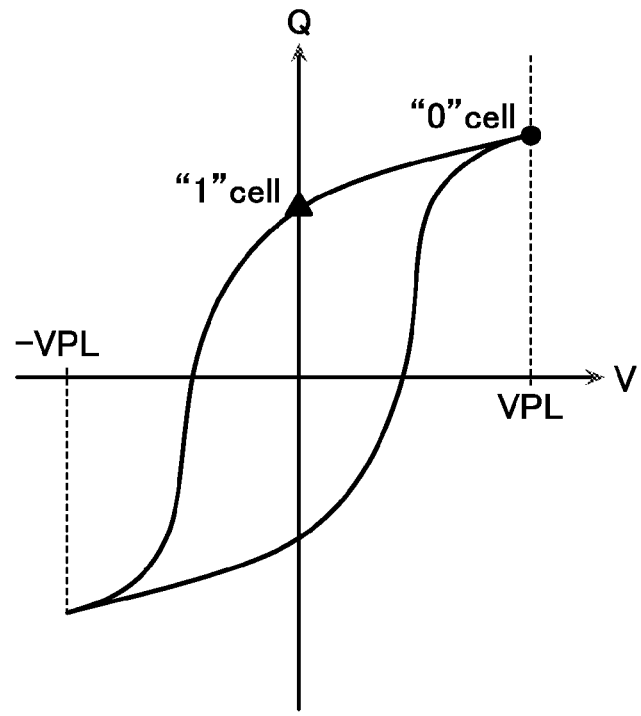

Then, with reference to FIG. 53, step (5-3)(a voltage of a certain absolute value is applied across the electrodes of the ferroelectric capacitor: the plate-line voltage at $-\Delta V$, the bit-line voltage at 0 V) moves the polarization of the "0" cell and the "1" cell to the respective positions on the hysteresis characteristic curve in FIG. 53. A polarization state is thus reproduced that is generally the same as during the actual imprint where the hysteresis characteristic curve moves in the positive direction of the x-axis.

Then, to provide the depolarization effect, the plate-line voltage is changed from $-\Delta V$ to $-\Delta V-\Delta V'$ for a short period of time, and then returned to $-\Delta V$. This moves the polarization of the "1" cell and the "0" cell to the respective positions in FIG. 54. During this operation, the bit-line potential is kept at 0 V.

In step (5-4), the bit-line is released from being fixed to 0 V and is floated. Then in step (5-5) the plate-line potential is increased from $\Delta V$ to VPL, thereby moving the polarization to the respective positions on the hysteresis characteristic curve in FIG. 55. Finally, the comparison/amplification by the sense amplifier moves the polarization to the respective positions on the hysteresis characteristic curve in FIG. 56.

With reference to the hysteresis characteristic curves shown in FIGS. 57 to 60, a description is given of the read operation when the actual imprint shifts the hysteresis characteristic curve in the positive direction of the x-axis and the depolarization reduces the signal. As described above, generally the depolarization significantly occurs at a steep slope of the hysteresis characteristic curve. It is therefore assumed here that the depolarization occurs with respect to the "0" cell.

Figure 57:
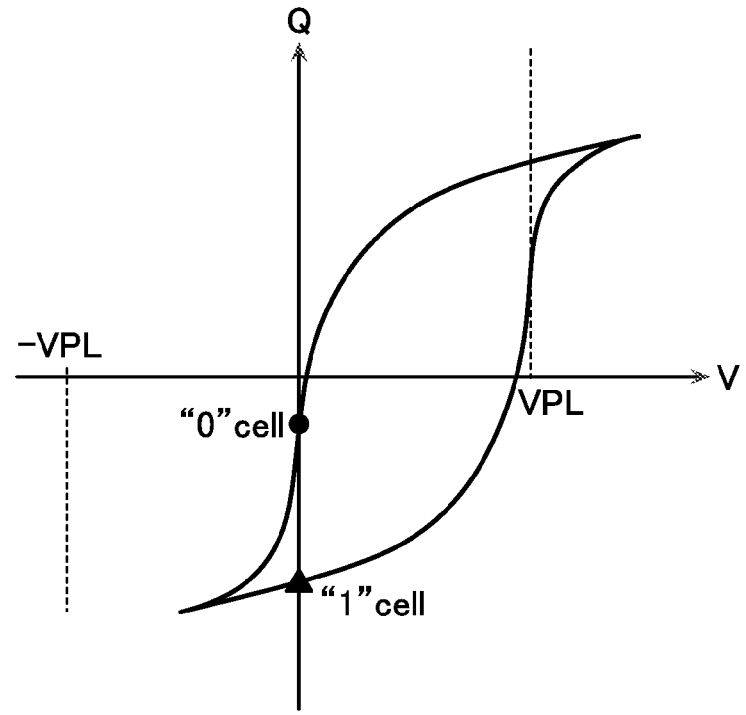
Figure 58:
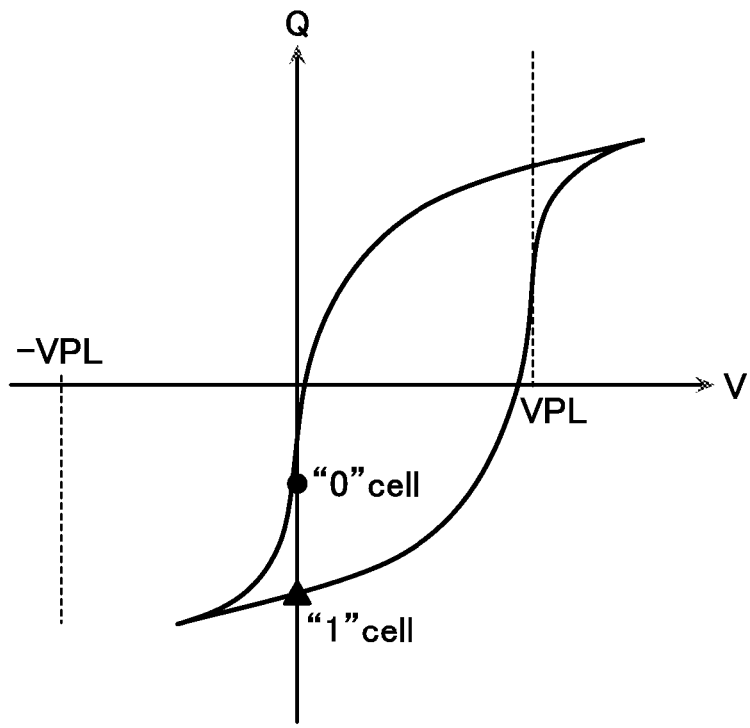

FIG. 57 shows the hysteresis characteristic curve immediately after the initial data pattern is written as in step (5-2) of the test method in FIG. 51. The imprint has occurred as the movement of the hysteresis characteristic curve in the negative direction of the x-axis. The residual polarization has thus decreased without a potential difference applied across the cell electrodes. After waiting for a while after the data write, the depolarization further decreases the polarization as shown in FIG. 58.

Figure 59:
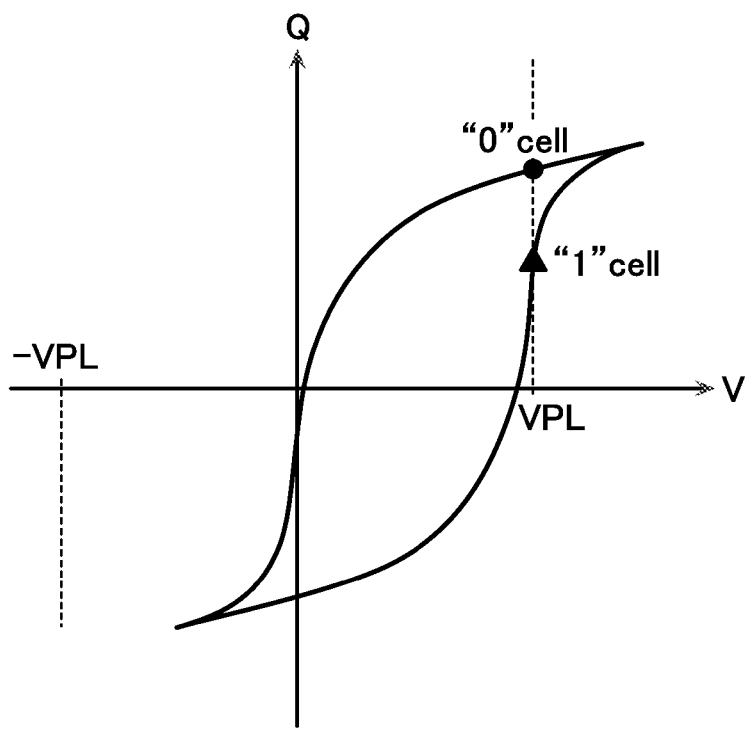
Figure 60:
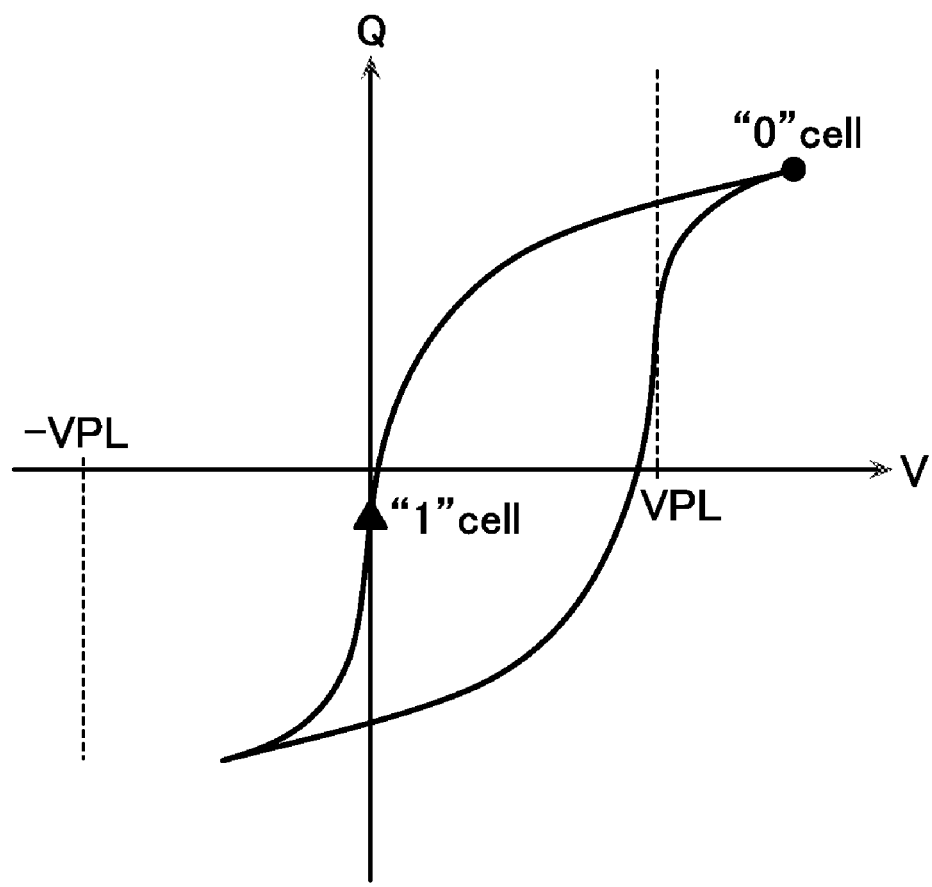

Then, with the bit-line being floated, the plate-line potential is increased to VPL, thereby reading out the signal charge to the bit-line (FIG. 59). Finally, the sensing and amplification by the sense amplifier fix "H" and "L" of the bit-line pair (FIG. 60).

Now, the polarization changes are compared between during the test in this embodiment (FIGS. 52 to 56) and during the actual imprint and depolarization (FIGS. 57 to 60). The results show that the changes are considered to have generally the same trajectory on the hysteresis characteristic curve. The above test method may thus be considered to generally reproduce the actual imprint operation. Note that the effects of steps (5-8) to (5-10) to reverse pattern data (step (5-7)) are similar to those in steps (5-3) to (5-5). A detailed description of steps (5-8) to (5-10) is thus omitted here.

Figure 61:
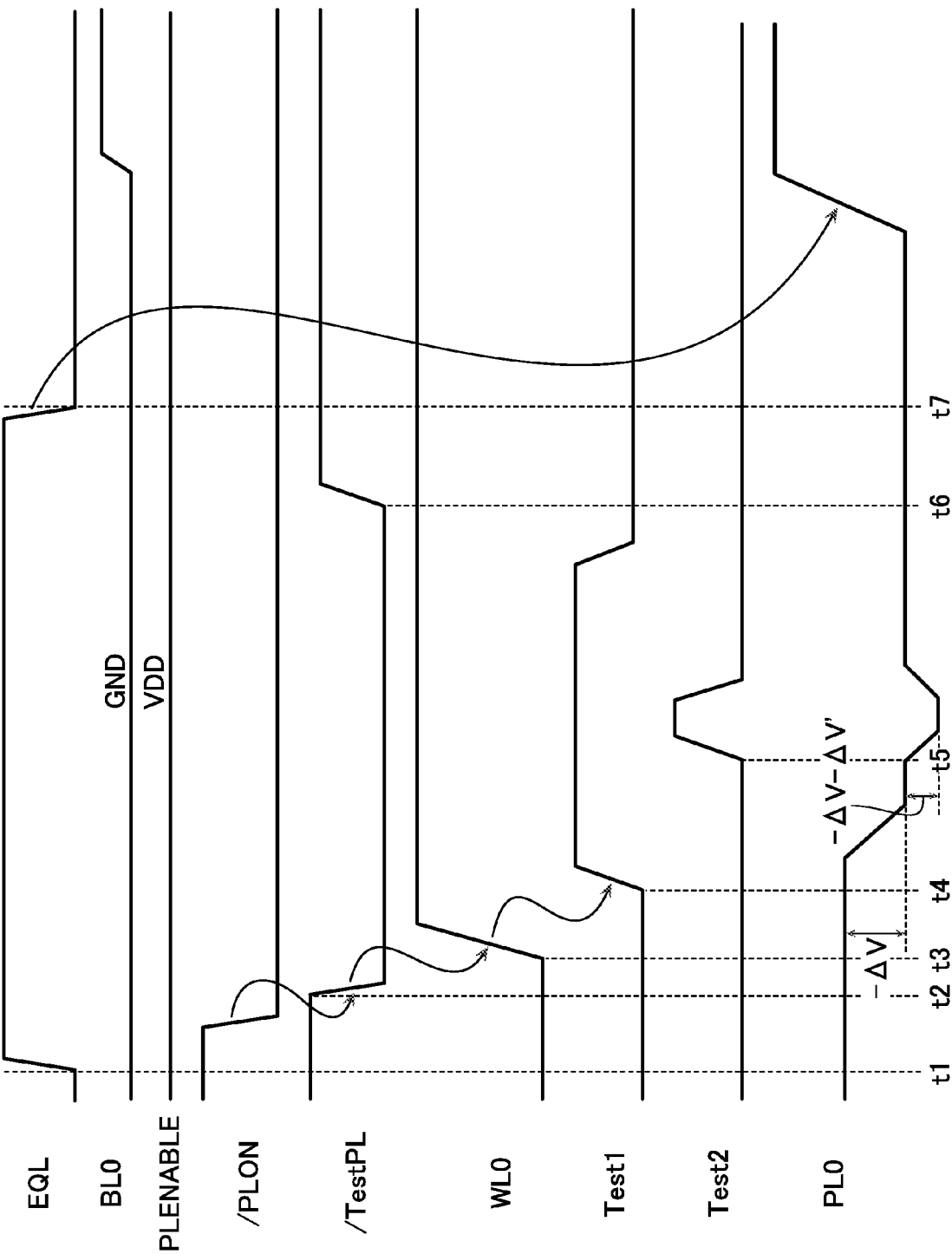
FIG. 61 shows a timing diagram of the operation in the test mode of the ferroelectric memory in the fifth embodiment.

FIG. 61 is a timing diagram of the specific operations in the test mode shown in FIG. 51 in the ferroelectric memory in this embodiment (the memory cell MC0 is assumed to be selected in the memory cell array shown in FIG. 10B). The timing diagram is the same as in the fourth embodiment except that the potential of the plate-line PL0 varies between $-\Delta V$ and $-\Delta V - \Delta V'$. A detailed description of the timing diagram is thus omitted here.

Sixth Embodiment

A ferroelectric memory according to a sixth embodiment of the present invention and a method for testing the same will be described referring to the drawings.

Like the fourth and fifth embodiments, this embodiment relates to a testing method and a memory configuration therefor that reproduce a state similar to that in which the imprint as well as the depolarization occur.

Note, however, that unlike the fourth and fifth embodiments, the plate-line potential is fixed to 0 V, while the bit-line is applied with the voltage $\Delta V$ and $\Delta V + \Delta V'$ (as in the second embodiment).

Figure 62:
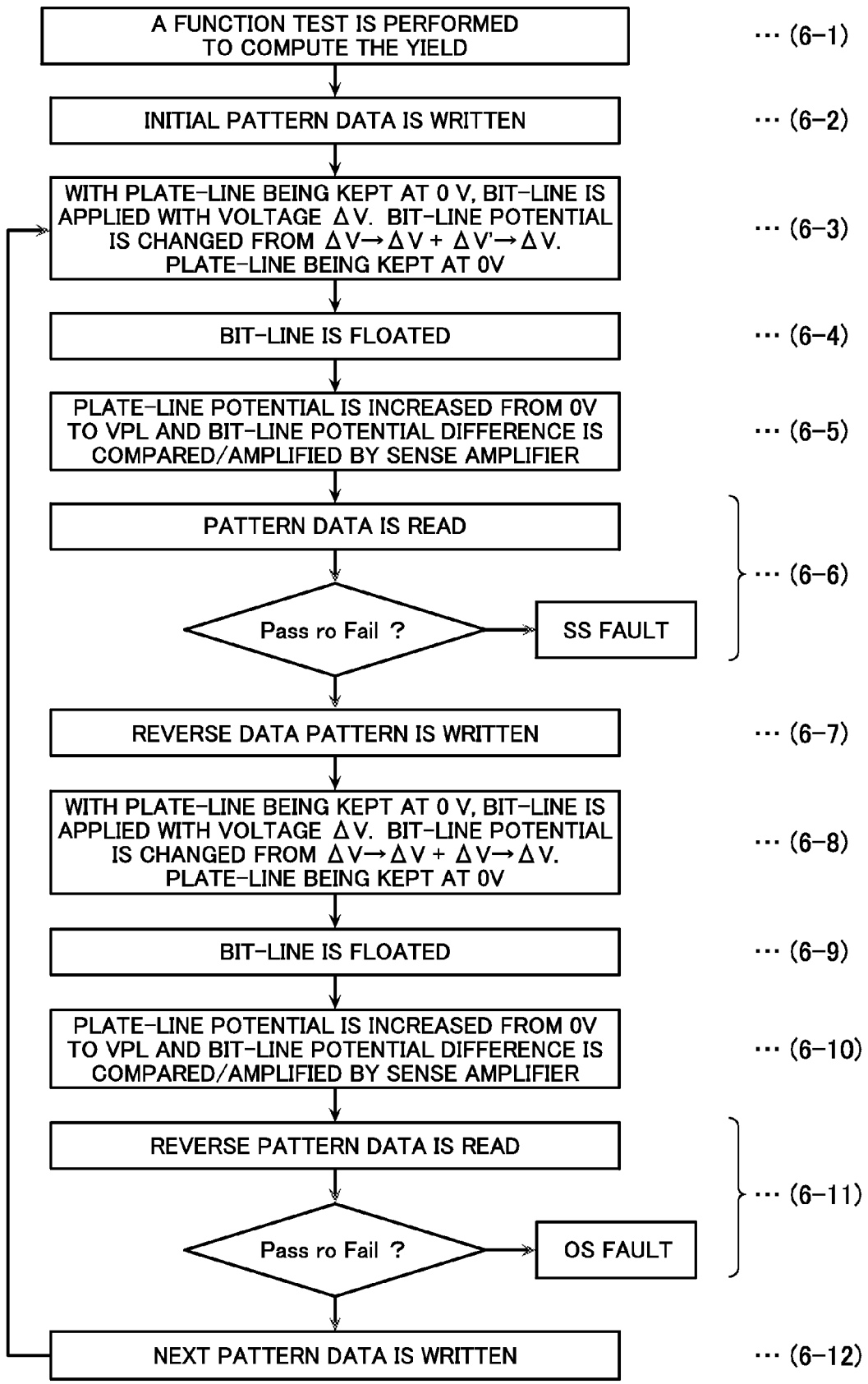
FIG. 62 shows a flowchart of the procedure for the test method according to a sixth embodiment of the present invention.

The test method in this embodiment is performed according to the following procedure as shown in the flowchart in FIG. 62.

(6-1) A function test is performed to compute the yield.

(6-2) According to normal data write operation, a write voltage is applied across the electrodes of the ferroelectric capacitor to write initial pattern data.

(6-3) The bit-line is applied with a certain voltage $\Delta V$, and set to $\Delta V + \Delta V'$ ($\Delta V' < \Delta V$) for a short period of time, and returned to $\Delta V$, while the plate-line is fixed to 0 V (ground potential).

(6-4) The bit-line is floated.

(6-5) The plate-line potential is increased to the plate-line potential VPL used in normal operation. The potential difference between the bit-line pair is then compared/amplified by the sense amplifier.

(6-6) The initial pattern data is read to compute the SS yield (Same State Yield).

(6-7) The initial pattern data is reversed and the reverse data pattern is written.

(6-8) The bit-line is applied with a certain voltage $\Delta V$, and set to $\Delta V + \Delta V'$ ($\Delta V' < \Delta V$) for a short period of time, and returned to $\Delta V$, while the plate-line is fixed to 0 V (ground potential), (6-9) The bit-line is floated.

(6-10) The plate-line potential is increased to VPL used in normal operation. The potential difference between the bit-line pair is then compared/amplified by the sense amplifier.

(6-11) The reverse data pattern is read to compute the OS yield (Opposite State Yield).

(6-12) The next pattern data is written.

Steps (6-3) to (6-5) may reproduce, in a short time, and without the bake process, the state in which the ferroelectric capacitor has the imprint and the depolarization occurs. The ferroelectric capacitor may thus be provided with polarization equal to polarization after the imprint and depolarization. The polarization data after imprint and depolarization may substantially thus be tested without the actual imprint or depolarization.

Like the third embodiment, the bit-line is applied with a certain positive voltage $\Delta V$, $\Delta V + \Delta V'$, and the plate-line is fixed to 0 V, thereby requiring no negative voltage. Less burden may thus be imposed on the circuits.

With reference to FIGS. 63 to 71, this test method will be described in more detail. As described above, generally the depolarization significantly occurs at a steep slope of the hysteresis characteristic curve. It is therefore assumed here that the depolarization occurs with respect to the "0" cell.

Figure 63:
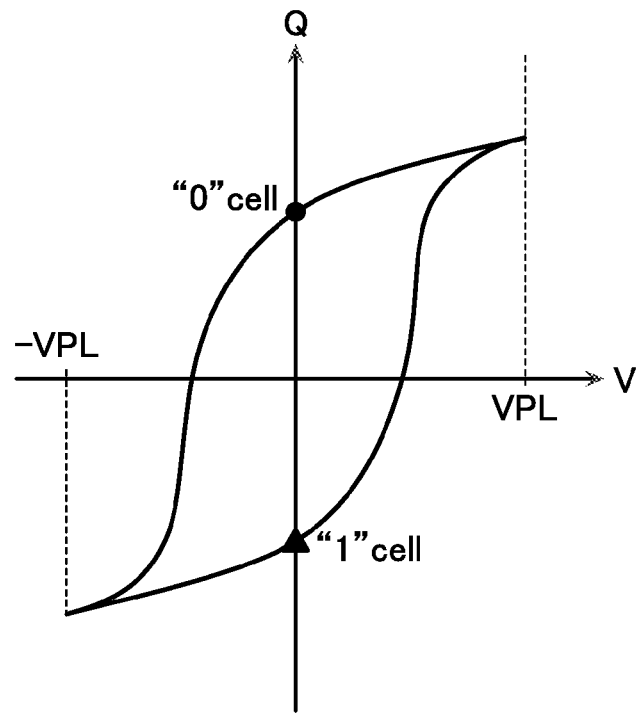
FIGS. 63 to 71 show hysteresis characteristic curves of a ferroelectric capacitor, which illustrate the operation of the test method in the sixth embodiment.

FIG. 63 shows a hysteresis characteristic curve of the ferroelectric capacitor after step (6-2), i.e., immediately after the initial pattern is written in the test procedure in this embodiment in FIG. 62. This curve is similar to that in the first embodiment (FIG. 2).

Figure 64:
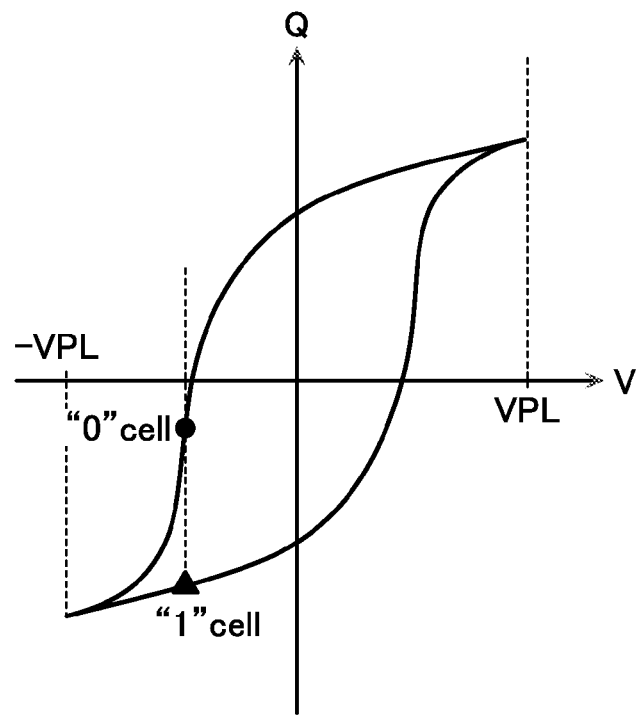
Figure 65:
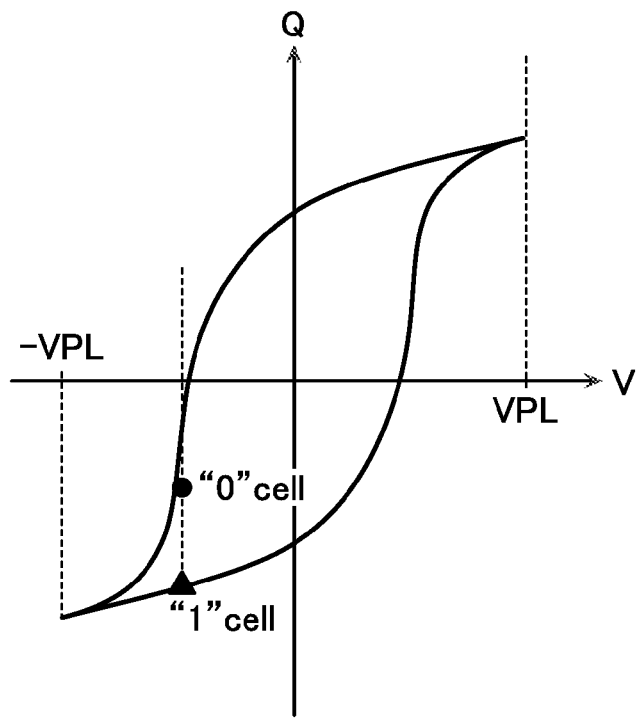
Figure 66:
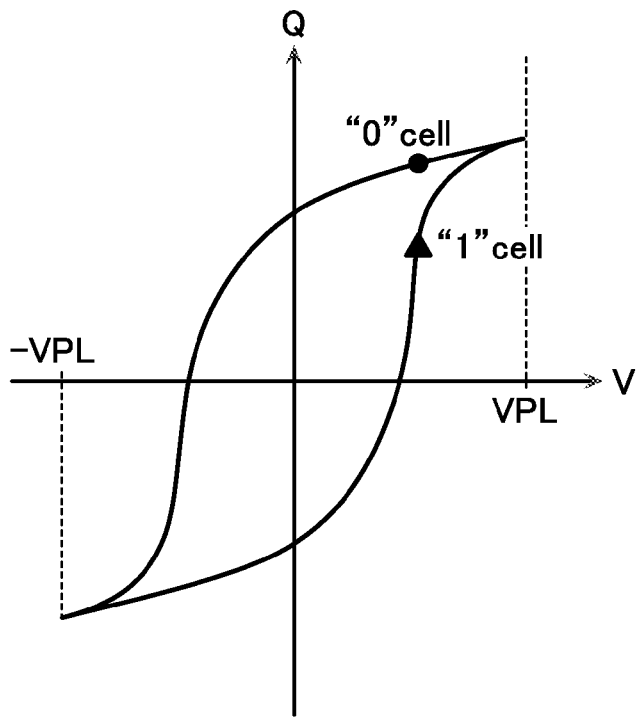
Figure 67:
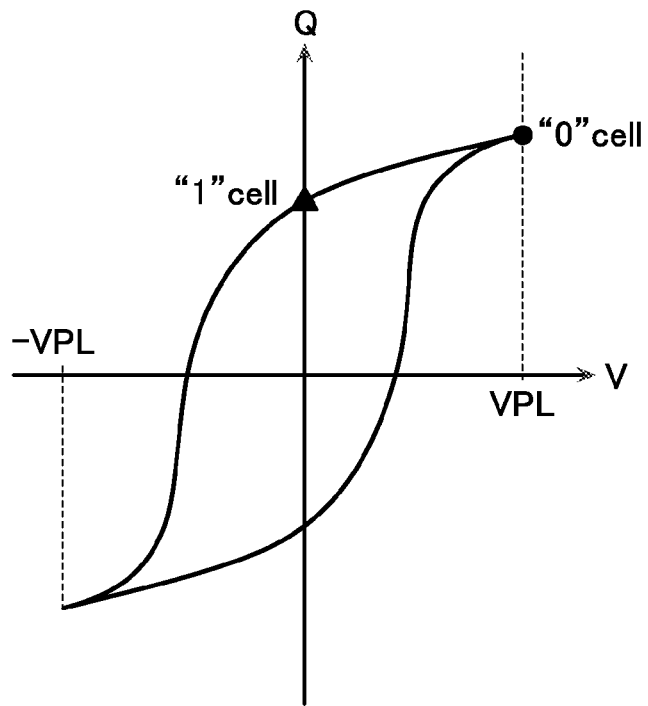

Then, with reference to FIG. 64, step (6-3)(a voltage of a certain absolute value is applied across the electrodes of the ferroelectric capacitor: the bit-line voltage at $\Delta V$, the plate-line voltage at 0 V) moves the polarization of the "0" cell and the "1" cell to the respective positions on the hysteresis characteristic curve in FIG. 64. A polarization state is thus reproduced that is generally the same as during the actual imprint where the hysteresis characteristic curve moves in the positive direction of the x-axis.

Then, to provide the depolarization effect, the bit-line voltage is changed from $\Delta V$ to $\Delta V + \Delta V'$ for a short period of time, and then returned to $\Delta V$. This moves the polarization of the "1" cell and the "0" cell to the respective positions in FIG. 65, During this operation, the bit-line potential is kept at 0 V.

In step (6-4), The bit-line is released from being fixed to 0 V and is floated. Then in step (6-5), the plate-line potential is increased to VPL, thereby moving the polarization the respective positions on the hysteresis characteristic curve in FIG. 66. Finally, the comparison/amplification by the sense amplifier moves the polarization to the respective positions on the hysteresis characteristic curve in FIG. 67.

With reference to the hysteresis characteristic curves shown in FIGS. 68 to 71, a description is given of the read operation when the actual imprint shifts the hysteresis characteristic curve in the positive direction of the x-axis and the depolarization reduces the signal. As described above, generally the depolarization significantly occurs at a steep slope of the hysteresis characteristic curve. It is therefore assumed here that the depolarization occurs with respect to the "0" cell.

Figure 68:
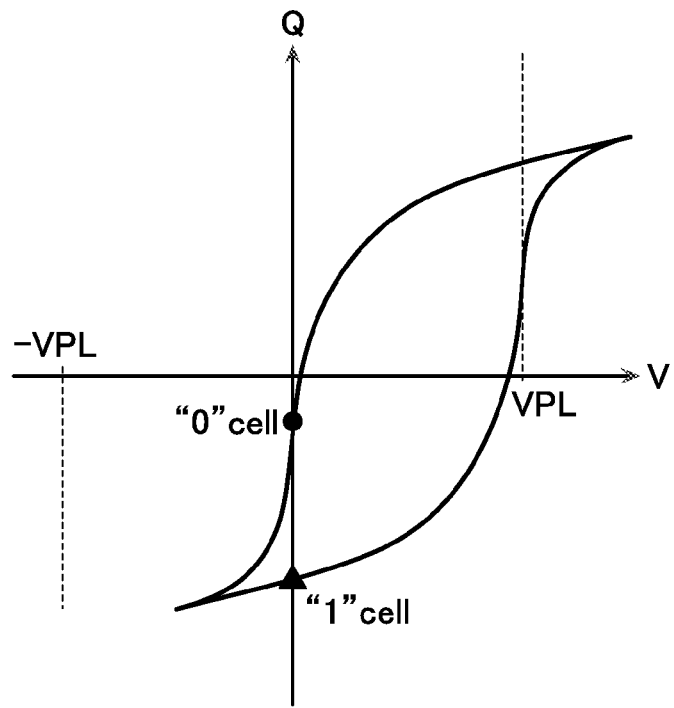
Figure 69:
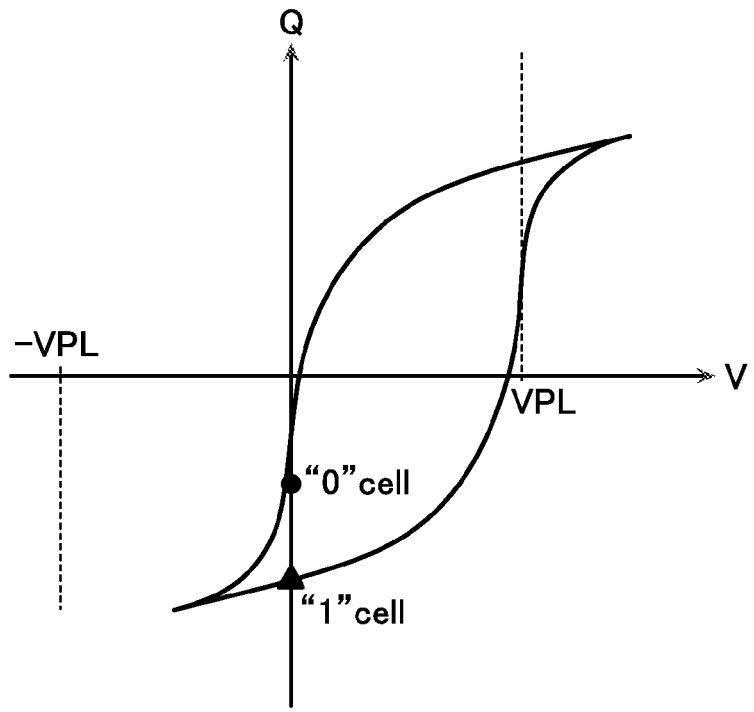

FIG. 68 shows the hysteresis characteristic curve immediately after the initial data pattern is written as in step (6-2) of the test method in FIG. 62. The imprint has occurred as the movement of the hysteresis characteristic curve in the positive direction of the x-axis. The residual polarization difference has thus decreased. After waiting for a while after the data write, the depolarization further decreases the polarization as shown in FIG. 69.

Figure 70:
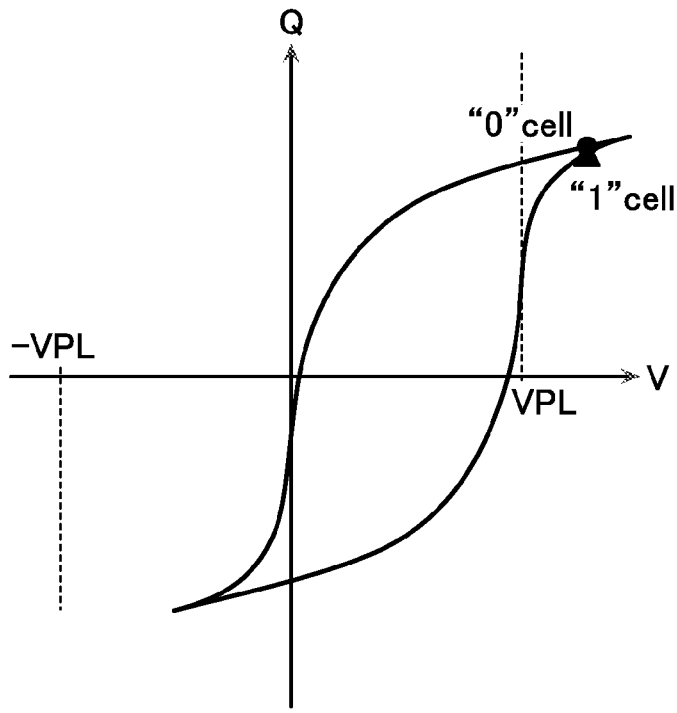
Figure 71:
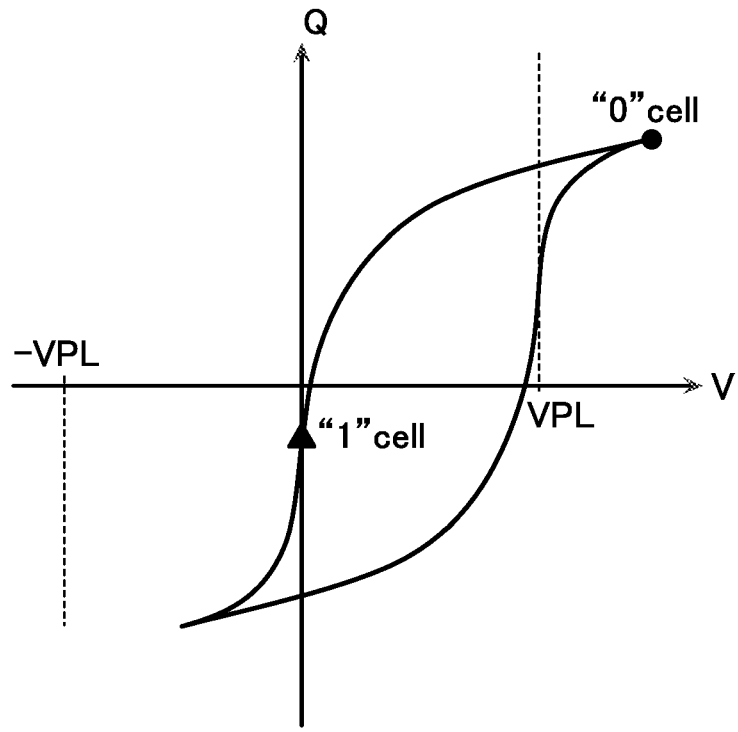

Then, with the bit-line being floated, the plate-line potential is increased to VPL, thereby reading out the signal charge to the bit-line (FIG. 70). Finally, the sensing and amplification by the sense amplifier fix "H" and "L" of the bit-line pair (FIG. 71).

Now, comparison between the test in this embodiment (FIGS. 63 to 67) and the actual imprint and depolarization (FIGS. 68 to 71) shows that the changes are considered to have generally the same trajectory on the hysteresis characteristic curve. The above test method may thus be considered to generally reproduce the actual imprint operation and the depolarization operation. Note that the effects of steps (6-8) to (6-10) to reverse pattern data (step (6-7)) are similar to those in steps (6-3) to (6-6). A detailed description of steps (6-8) to (6-10) is thus omitted here.

Figure 72:
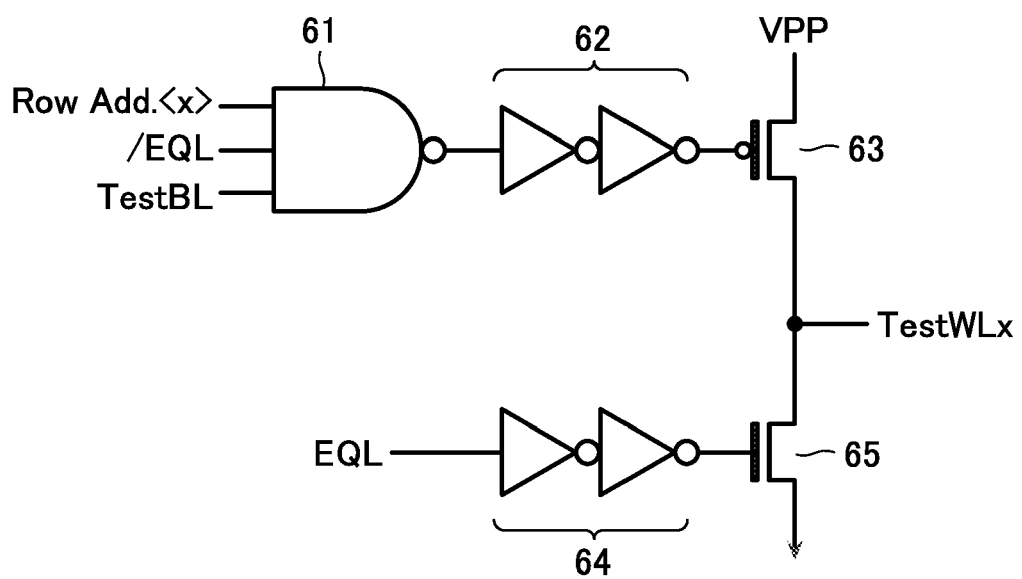
FIGS. 72, 73, and 74 show circuit diagrams of portions of the configuration of a ferroelectric memory capable of performing the test method in the sixth embodiment.
Figure 73:
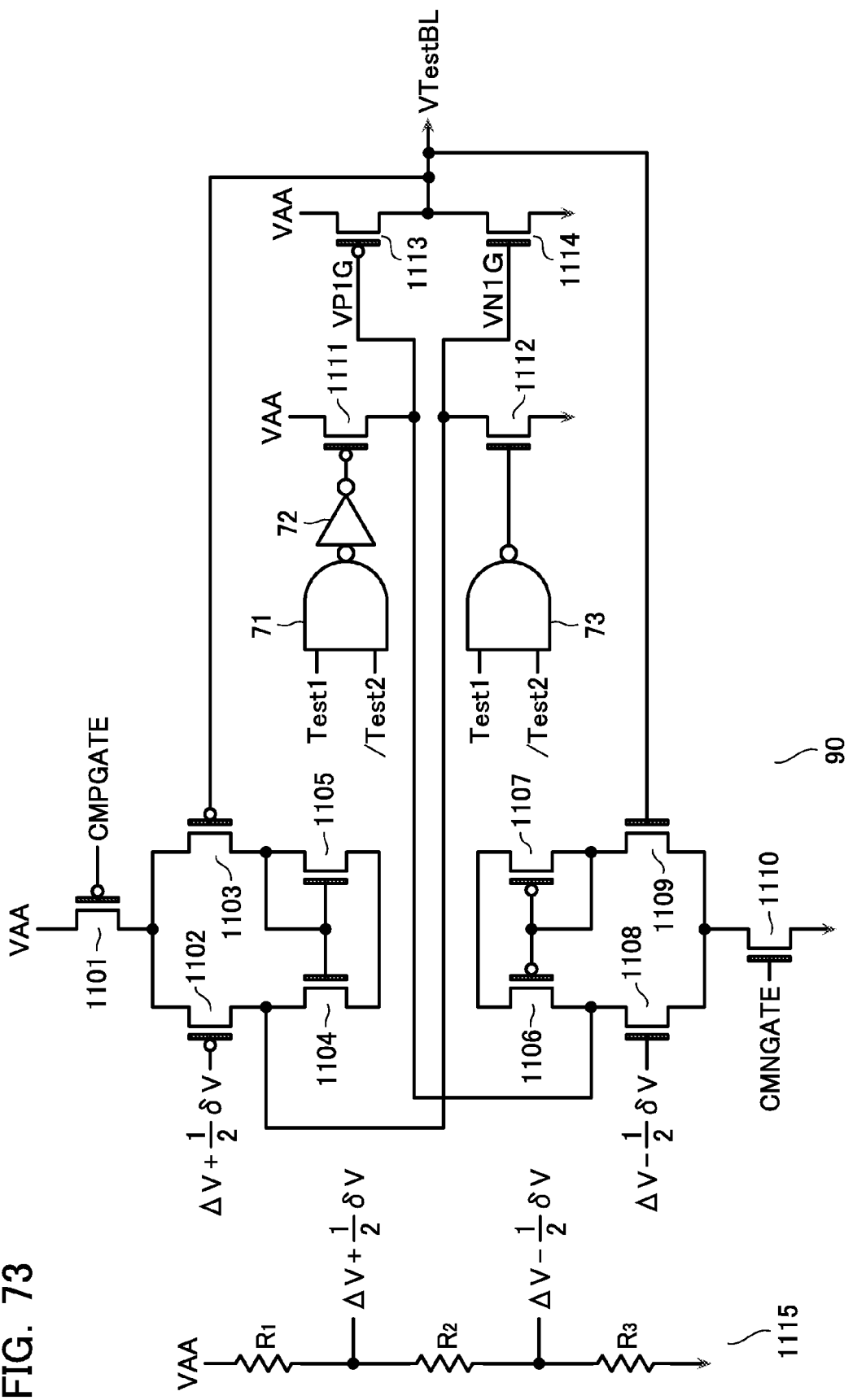
Figure 74:
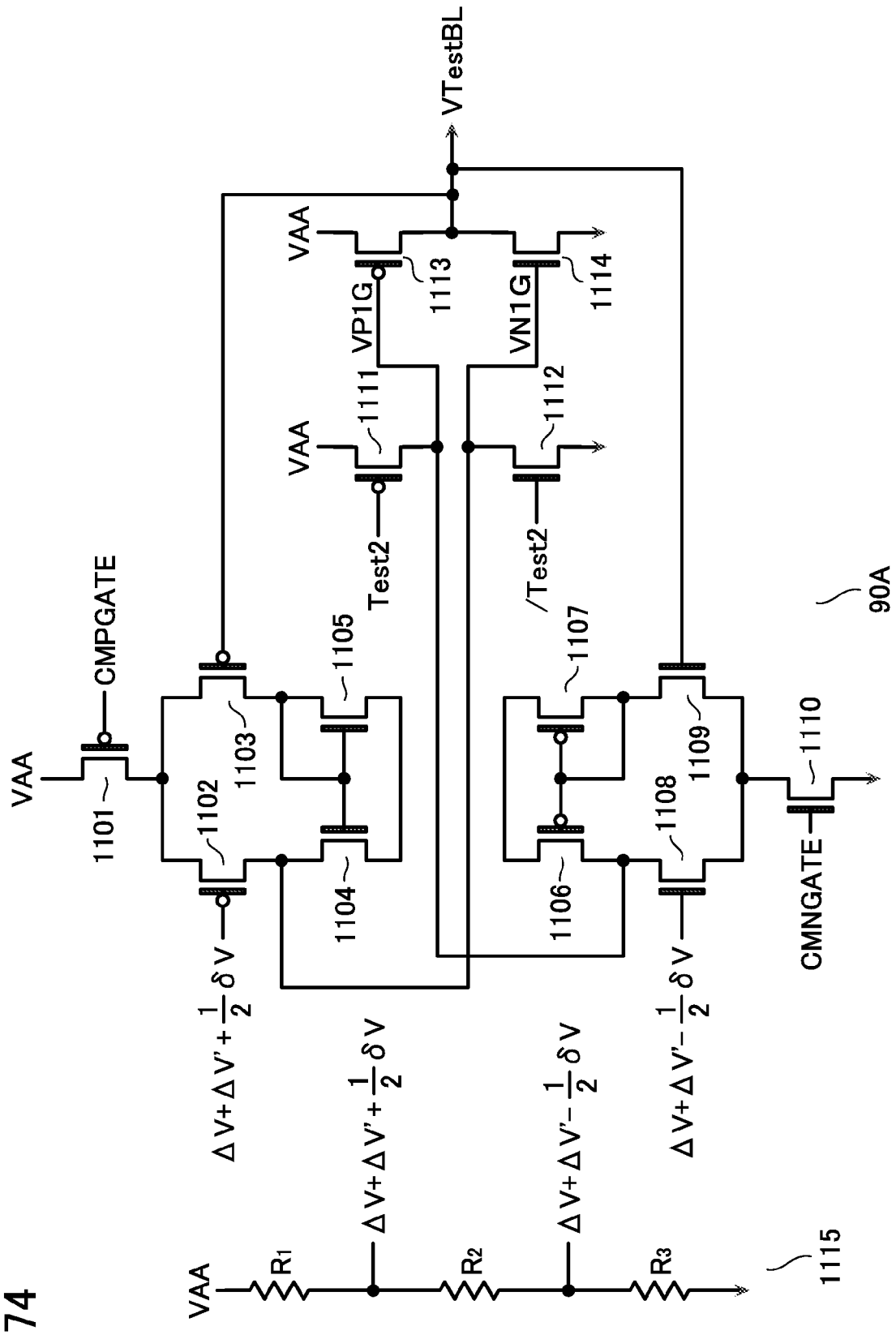

FIGS. 72 to 74 show example circuit configurations for performing the test method in the sixth embodiment.

FIG. 72 is a circuit diagram of an example configuration of a circuit 60a for selecting the test word-line TestWL0 or TestWL1. The configuration is generally the same as that of the voltage output circuit 60 in FIG. 34.

FIGS. 73 and 74 show example configurations of voltage generation circuits 90 and 90A, respectively, for generating the voltage VTestBL. The configurations of the circuits 90 and 90A are the same as those of the voltage generation circuits 70 and 70A in FIGS. 48 and 49, respectively. Note that in FIGS. 73 and 74, the voltage ΔV+δV/2, ΔV−δV, ΔV+ΔV'+δV/2, and ΔV+ΔV'−δV/2 may be generated from the array power supply voltage VAA divided by a divider resistor "1" as shown in the left sides in FIGS. 73 and 74, for example.

Figure 75:
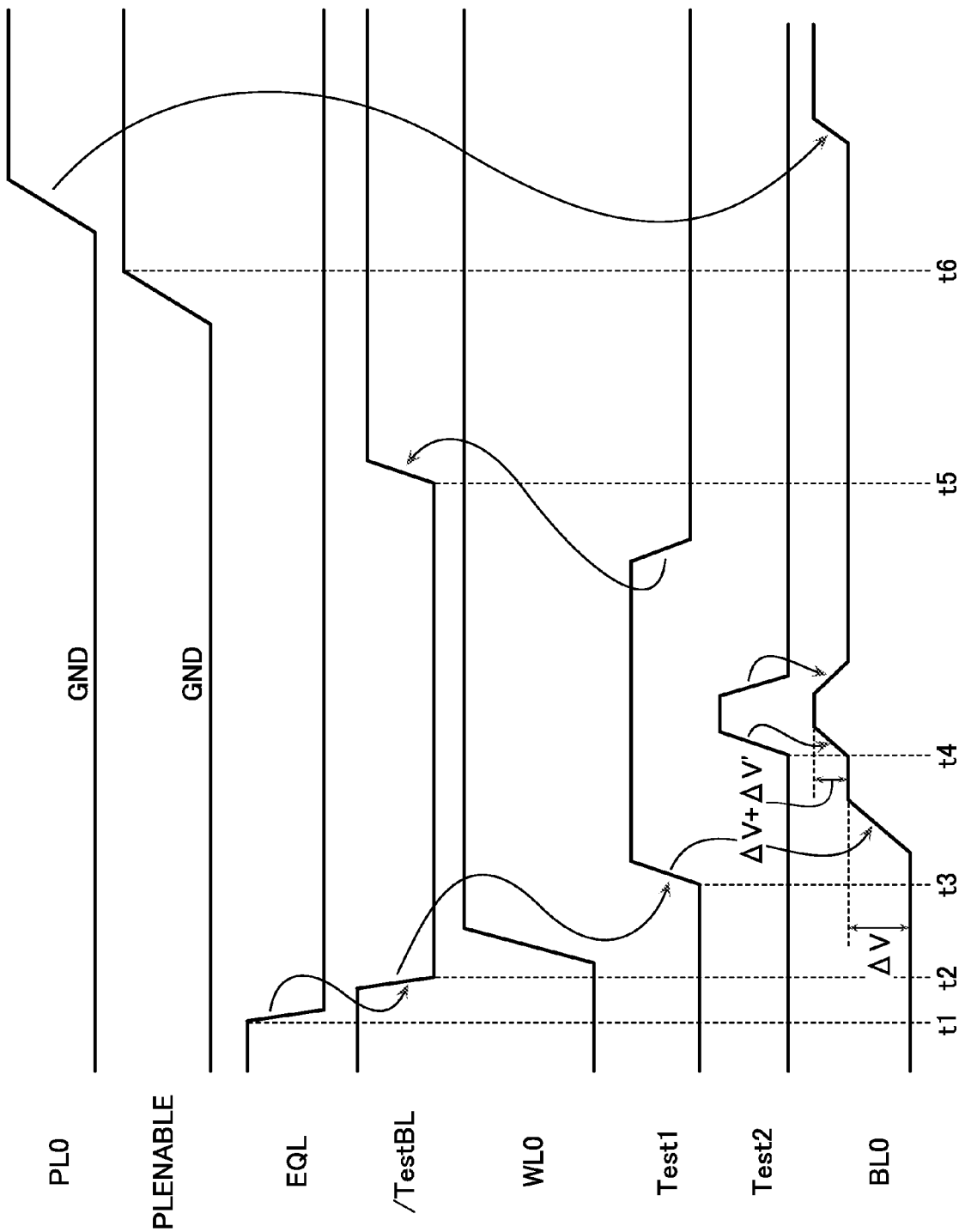
FIG. 75 shows a timing diagram of the operation in the test mode of the ferroelectric memory in the sixth embodiment.

With reference to the timing diagram in FIG. 75, a description is given of the specific operations in the test mode shown in FIG. 62 in the ferroelectric memory in the six embodiment. An example is considered here where in the memory cell array in FIG. 10B, the memory cell MC0 is selected and the test mode in FIG. 62 is performed.

After normal data write operation performs step (6-2) "writing the initial pattern data," the control signal PLENABLE is set to "L" (VSS). The plate-line PL0 is thus fixed to the ground potential (VSS (0 V)).

At time t1, the equalizing operation of the bit-line BL ends and the equalization signal EQL changes to "L." Then, at time t2, the control signal /TestBL decreases to "L" and then the word-line WL0 rises to select a cell in the row direction. Then, at time t3, the test control signal Test1 rises. The n type MOS transistor Q4 (FIG. 11) is thus rendered conductive, thereby supplying the voltage VTestBL (=ΔV) to the bit-line BL0.

Then, at time t4, the test control signal TEST2 rises, thereby changing the bit-line BL0 potential as in step (6-4). Then, at time t5, the control signal /TestBL returns to "H" to stop the supply of the voltage ΔV. The bit-line BL0 potential is still kept at ΔV. Then, at time t6, the control signal PLENABLE changes to "H." The plate-line PL0 is thus increased to "H," thereby reading the bit-line BL0 signal.

Thus, although the invention has been described with respect to particular embodiments thereof, it is not limited to those embodiments. It will be understood that various modifications, additions, substitutions, deletions and the like may be made without departing from the spirit of the present invention.

Although, for example, in the above embodiments, in step (1-3) and other similar steps, a certain voltage ΔV is applied to provide a condition similar to the imprint, any voltage may be applied that may reproduce a condition similar to the imprint, including various voltages such as a voltage higher than the coercive voltage, a voltage lower than the coercive voltage, and a voltage generally the same as the coercive voltage.

What is claimed is:

1. A ferroelectric memory comprising:
   a memory cell array comprising a memory cell, the memory cell comprising a ferroelectric capacitor and a transistor;
   a plate-line configured to transmit a plate-line voltage to the ferroelectric capacitor in order to write and read data;
   a pair of bit-lines configured to transmit a signal charge from the memory cell;
   a sense amplifier circuit configured to sense, to compare, and to amplify a potential difference between the bit-line pair;
   a bit-line driver circuit configured to drive the bit-line pair and a plate-line driver circuit configured to drive the plate-line; and
   a bit-line precharge circuit and a plate-line precharge circuit configured to switch between a state where either a bit-line of the bit-line pair is precharged to a first bit-line precharge potential or the plate-line is precharged to a first plate-line precharge potential and a state where either the bit-line is electrically floating and isolated from the first bit-line precharge potential or the plate-line is electrically floating and isolated from the first plate-line precharge potential,
   the bit-line driver circuit, the plate-line driver circuit, the bit-line precharge circuit, and the plate-line precharge circuit being configured to apply the first bit-line precharge potential to the bit-line of the bit-line pair while applying a second plate-line voltage to the plate-line in a test mode, and then to switch the bit-line from the first bit-line precharge potential to the floating state and to increase the plate-line voltage from the second plate-line voltage to a first plate-line voltage in order to read data from the memory cell,
   the second plate-line voltage is set to a value in a manner that a polarization state becomes similar to the state where the ferroelectric capacitor is imprinted.

2. The ferroelectric memory of claim 1, wherein the second plate-line voltage is applied after initial pattern data is written to the memory cell in the test mode.

3. The ferroelectric memory of claim 1, wherein the test mode is performed for initial pattern data and reverse pattern data which is a reversed data of the initial pattern data.

4. The ferroelectric memory of claim 1, wherein the second plate-line voltage is configured to increase from a first absolute value to a second absolute value larger than the first absolute value for a predetermined period and then to decrease to the first absolute value.

5. A ferroelectric memory comprising:
   a memory cell array comprising a plurality of memory cells, each memory cell comprising a ferroelectric capacitor and a transistor;
   a plate-line configured to transmit a plate-line voltage to the ferroelectric capacitor in order to write and read data;
   a pair of bit-lines configured to transmit a signal charge from the memory cell;
   a sense amplifier circuit configured to sense, to compare, and to amplify a potential difference between the bit-line pair;

a bit-line driver circuit configured to drive the bit-line pair and a plate-line driver circuit configured to drive the plate-line; and a bit-line precharge circuit and a plate-line precharge circuit configured to switch between a state where either a bit-line of the bit-line pair is precharged to a first bit-line precharge potential or the plate-line is precharged to a first plate-line precharge potential and a state where either the bit-line is electrically floating and isolated from the first bit-line precharge potential or the plate-line is electrically floating and isolated from the first plate-line precharge potential, the bit-line driver circuit, the plate-line driver circuit, the bit-line precharge circuit, and the plate-line precharge circuit being configured to apply a first array voltage to the bit-line through the sense amplifier circuit and the first plate-line voltage to the plate-line in a first mode of normal reading and writing operation, not being a test mode, and to apply the first plate-line precharge voltage to the plate-line while charging a second array voltage to the bit-line in a second mode being the test mode, and then to switch the bit-line to the floating state and to increase the plate-line voltage to the first plate-line voltage in order to read cell data from the memory cell, the second array voltage is set to a value in a manner that a polarization state becomes similar to the state where the ferroelectric capacitor is imprinted.

6. The ferroelectric memory of claim 5, wherein the second array voltage is applied after initial pattern data is written to the memory cell in the test mode.

7. The ferroelectric memory of claim 5, wherein the test mode is performed for initial pattern data and reverse pattern data which is a reversed data of the initial pattern data.

8. The ferroelectric memory of claim 5, wherein the second array voltage is configured to increase from a first absolute value to a second absolute value larger than the first absolute value for a predetermined period and then to decrease to the first absolute value.

* * * * *